US012750961B2

(12) United States Patent
Lee

(10) Patent No.: US 12,750,961 B2
(45) Date of Patent: Sep. 29, 2026

(54) DISPLAY DEVICE

(71) Applicant: Samsung Display Co., Ltd., Yongin-si (KR)

(72) Inventor: Jungil Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 270 days.

(21) Appl. No.: 18/449,751

(22) Filed: Aug. 15, 2023

(65) Prior Publication Data

US 2024/0155791 A1 May 9, 2024

(30) Foreign Application Priority Data

Nov. 4, 2022 (KR) ........................ 10-2022-0145656

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
CPC ........ G06F 1/16; G06F 1/1616; G06F 1/1641; G06F 1/1652; G06F 1/1681; H05K 5/0226; F16C 11/04
See application file for complete search history.

(56) References Cited

U.S. PATENT DOCUMENTS 9,115,750 B2 8/2015 Park
9,348,362 B2 5/2016 Ko et al.
9,535,452 B2 1/2017 Ahn
11,237,596 B2 2/2022 Kim et al.
2015/0013107 A1* 1/2015 Shin .......................... E05D 3/06 16/366
2021/0389809 A1* 12/2021 Choi ..................... G06F 1/1681
2021/0397226 A1* 12/2021 Siddiqui ............... G06F 1/1616
2022/0141981 A1* 5/2022 Hsu ...................... H05K 5/0226 16/337
2023/0032983 A1* 2/2023 Feng ..................... H04M 1/022
2023/0403810 A1* 12/2023 Park ..................... H05K 5/0226

FOREIGN PATENT DOCUMENTS

KR 10-2353760 1/2022
KR 10-2022-0019545 2/2022

* cited by examiner

*Primary Examiner* — Abhishek M Rathod
(74) *Attorney, Agent, or Firm* — Lerner David LLP

(57) ABSTRACT

A display device includes a display module, first and second bodies disposed below the display module and arranged in a first direction in an unfolded state, a hinge which is disposed between the first and second bodies and in which first and second rotary axes extending parallel to each other in a second direction intersecting the first direction are defined, and a hinge bar coupled to the hinge and extending in the second direction. The first and second bodies may rotate around the first and second rotary axes, respectively, to be in an in-folded state in which front surfaces of the first and second bodies face each other, or in an out-folded state in which rear surfaces of the first and second bodies face each other. A distance between the first and second rotary axes and the hinge bar in the unfolded is different than in in-folded states.

22 Claims, 51 Drawing Sheets

DISPLAY DEVICE

CROSS-REFERENCE TO RELATED APPLICATIONS

This U.S. non-provisional patent application claims priority to and benefits of Korean Patent Application No. 10-2022-0145656 under 35 U.S.C. § 119, filed in the Korean Intellectual Property Office (KIPO) on Nov. 4, 2022, the entire contents of which are hereby incorporated by reference.

BACKGROUND

The disclosure herein relates to a display device.

Electronic devices such as smartphones, digital cameras, notebook computers, navigation devices and smart televisions, which provide users with images, include display devices for displaying the images. The display devices generate images and provide the users with the images through display screens.

Recently, with the technical development of the display devices, the display devices having various shapes are developed. For example, various flexible display devices, which are deformed in curved shapes or are foldable or rollable, are developed. The flexible display devices having variously changeable shapes are portable and improve user's convenience.

A foldable display device among the flexible display devices includes a display module that is folded with respect to a folding axis extending in a direction, and a folding set that allows the display module to be folded. The folding set is used to operate the display module to be in any one of an in-folded state, in which a display surface is not exposed to the outside, and an out-folded state in which the display surface is exposed to the outside.

SUMMARY

The disclosure provides a display device including a folding set which allows a display module to be in-folded and out-folded and in which a folding region having a dumbbell shape is readily accommodated during the in-folding of the display module.

The technical objectives to be achieved by the disclosure are not limited to those described herein, and other technical objectives that are not mentioned herein would be clearly understood by a person skilled in the art from the description of the disclosure.

The disclosure also provides a display device including a display module, a first body and a second body disposed below the display module and arranged in a first direction in an unfolded state, a hinge which is disposed between the first body and the second body and in which a first rotary axis and a second rotary axis extending parallel to each other in a second direction intersecting the first direction are defined, and a hinge bar which is coupled to the hinge and extending in the second direction. The first and second bodies may rotate around the first and second rotary axes, respectively, to be in an in-folded state, in which front surfaces of the first and second bodies face each other, or in an out-folded state in which rear surfaces of the first and second bodies face each other. A distance between the first and second rotary axes and the hinge bar in the unfolded state may be different than in the in-folded state.

The distance between the first and second rotary axes and the hinge bar in the in-folded state may be greater than in the unfolded state.

The distance between the first and second rotary axes and the hinge bar in the unfolded state may be substantially equal to the distance between the first and second rotary axes and the hinge bar in the out-folded state.

A third rotary axis and a fourth rotary axis which extend parallel to each other in the second direction and are spaced apart from the first and second rotary axes, respectively, may be defined in the hinge bar, a distance between the first rotary axis and the third rotary axis in the unfolded state may be different than in the in-folded state, and a distance between the second rotary axis and the fourth rotary axis in the unfolded state may be different than in the in-folded state.

The distance between the first rotary axis and the third rotary axis in the in-folded state may be greater than in the unfolded state, the distance between the first rotary axis and the third rotary axis in the unfolded state may be substantially equal to the distance between the first rotary axis and the third rotary axis in the out-folded state, the distance between the second rotary axis and the fourth rotary axis in the in-folded state may be greater than in the unfolded state, and the distance between the second rotary axis and the fourth rotary axis in the unfolded state may be substantially equal to the distance between the second rotary axis and the fourth rotary axis in the out-folded state.

The hinge may be coupled to the first and second bodies, and a distance between the first and second bodies and the hinge bar in the unfolded state may be different than in the in-folded state.

The distance between the first and second bodies and the hinge bar in the in-folded state may be greater than in the unfolded state.

The hinge may comprise a first hinge and a second hinge that are spaced apart from each other in the second direction and are symmetrical to each other, and the hinge bar may be disposed between the first hinge and the second hinge and coupled to the first and second hinges.

The first hinge may comprise a first gear configured to rotate around the first rotary axis; a second gear that is arranged with the first gear in the first direction and configured to rotate rotates around the second rotary axis; a link guide coupled to the hinge bar and disposed on inner side surfaces of the first and second gears which face the second hinge; a first link coupled to the first gear and the link guide; and a second link coupled to the second gear and the link guide, and a position of the link guide in the unfolded state may be different than in the in-folded state by virtue of the first and second links.

The first and second links may move the position of the link guide so that the link guide is farther away from the first and second rotary axes in a third direction in the in-folded state than in the unfolded state, and the third direction may be defined as a direction perpendicular to a plane defined by the first and second directions.

The first rotary axis may be defined in a portion of the first gear which is adjacent to one side of the first gear, and the second rotary axis may be defined in a portion of the second gear which is adjacent to one side of the second gear, the one side of the first gear and the one side of the second gear may face each other, and the one side of the first gear and the one side of the second gear may have gear shapes, respectively, and may be engaged with each other to rotate around the first and second rotary axes, respectively.

The link guide may comprise a guide part overlapping the first and second rotary axes; and a hinge bar coupling part coupled to the hinge bar, connected to a lower portion of the guide part, and protruding toward the second hinge, one side of the first link and one side of the second link which face each other, may be coupled to the guide part, a portion of the first link which does not overlap the guide part when viewed in the second direction and is adjacent to another side of the first link, may be coupled to the first gear, and a portion of the second link which does not overlap the guide part when viewed in the second direction and is adjacent to another side of the second link, may be coupled to the second gear.

The display device may further comprise a first protruding link protruding from the one side of the first link toward the guide part; and a second protruding link protruding from the one side of the second link toward the guide part. The guide part may include a first guide hole which overlaps the first link and has a curved trajectory corresponding to an arc of a circle defined to have a central point in the first rotary axis, and in which the first protruding link is disposed; and a second guide hole which overlaps the second link, has a curved trajectory corresponding to an arc of a circle defined to have a central point in the second rotary axis, and is symmetrical to the first guide hole, and in which the second protruding link is disposed, and the first and second protruding links may move along the first and second guide holes, respectively.

The display device may further comprise a gear connecting part disposed on outer side surfaces of the first and second gears which are opposite to the inner side surfaces of the first and second gears; a first rotary axis protrusion and a second rotary axis protrusion that protrude from the gear connecting part toward the first and second gears to define the first and second rotary axes, respectively, and are inserted into first and second rotation holes defined in the first and second gears to overlap the first and second rotary axes, respectively; a first sub-rotary axis protrusion and a second sub-rotary axis protrusion that protrude from an outer side surface of the gear connecting part which is opposite to an inner side surface of the gear connecting part that faces the first and second gears, and are disposed upward from the first and second rotary axis protrusions; a first sub-rotating part extending in the first direction, coupled to the first sub-rotary axis protrusion and the first body, and configured to rotate around the first sub-rotary axis protrusion; and a second sub-rotating part extending in the first direction, coupled to the second sub-rotary axis protrusion and the second body, and configured to rotate around the second sub-rotary axis protrusion.

The display device may further comprise body connecting parts through which the first sub-rotating part is coupled to the first body and the second sub-rotating part is coupled to the second body. A distance between the first gear and the body connecting parts in the in-folded state may be greater than in the out-folded state, and a distance between the second gear and the body connecting parts in the in-folded state may be greater than in the out-folded state.

The display device may further comprise a first body cover disposed between the first body and the second body and coupled to one side of the first body which faces the second body; a second body cover disposed between the first body and the second body and coupled to one side of the second body which faces the first body; a first wing plate disposed between the first body cover and the second body cover and coupled to one side of the first body cover which faces the second body cover, so as to rotate around a first wing rotary axis extending in the second direction; and a second wing plate disposed between the first body cover and the second body cover and coupled to one side of the second body cover which faces the first body cover, so as to rotate around a second wing rotary axis extending in the second direction. The first and second body covers may be coupled so as to slide with respect to the first and second gears in the first direction, and the first and second body covers move so as to be farther away from the hinge bar in the in-folded state than in the out-folded state.

The display device may further comprise a first sliding part disposed on the first body cover and including a first wedge that is inserted into a first groove defined in the inner side surface of the first gear; a second sliding part disposed on the second body cover and including a second wedge that is inserted into a second groove defined in the inner side surface of the second gear; a first magnet part coupled to the first sliding part; a second magnet part coupled to the second sliding part; a third magnet part disposed on the first body cover, arranged with the first magnet part in the second direction, and farther away from the first gear than the first magnet part is; and a fourth magnet part disposed on the second body cover, arranged with the second magnet part in the second direction, and farther away from the second gear than the second magnet part. The first and third magnet parts may be disposed to face a same polarity, and the second and fourth magnet parts may be disposed to face a same polarity.

The first and second wedges may move outside the first and second groove, respectively, in the in-folded state and the out-folded state; the first and second wedges may move so as to be farther away from the hinge bar in the in-folded state than in the unfolded state; and the first and second wedges may move so as to be closer to the hinge bar in the out-folded state than in the unfolded state.

The display device may further comprise a first sliding part disposed on the first body cover and including a first wedge that is inserted into a first groove defined in the inner side surface of the first gear; a second sliding part disposed on the second body cover and including a second wedge that is inserted into a second groove defined in the inner side surface of the second gear; a first elastic part disposed on the first body cover, arranged with the first sliding part in the second direction, and farther away from the first gear than the first sliding part; and a second elastic part disposed on the second body cover, arranged with the second sliding part in the second direction, and farther away from the second gear than the second sliding part.

In an embodiment of the disclosure, a display device includes a display module, a first body and a second body, which are disposed below the display module and arranged in a first direction in an unfolded state, a hinge, which is disposed between the first body and the second body and in which a first rotary axis and a second rotary axis extending parallel to each other in a second direction intersecting the first direction are defined, and a hinge bar which is coupled to the hinge and extend in the second direction and in which a third rotary axis and a fourth rotary axis extending parallel to each other in the second direction are defined. The first and second bodies may rotate around the first and second rotary axes, respectively, to be in an in-folded state, in which front surfaces of the first and second bodies face each other, or in an out-folded state in which rear surfaces of the first and second bodies face each other. A distance between the first rotary axis and the third rotary axis in the in-folded state may be different than in the unfolded state, and a distance between the second rotary axis and the fourth rotary axis in the in-folded state may be different than in the unfolded state.

A position of the hinge bar with respect to the first and second rotary axes may be invariable in the unfolded state and the out-folded state.

In an embodiment of the disclosure, a display device includes a display module, a first body and a second body disposed below the display module and arranged in a first direction in an unfolded state, a hinge, which is disposed between the first body and the second body and in which a first rotary axis and a second rotary axis extending parallel to each other in a second direction crossing the first direction are defined, and a hinge bar which is coupled to the hinge and extending in the second direction. The first and second bodies may rotate around the first and second rotary axes, respectively, to be in an in-folded state in which front surfaces of the first and second bodies face each other. A position of the hinge bar in the unfolded state may be different than in an out-folded state.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
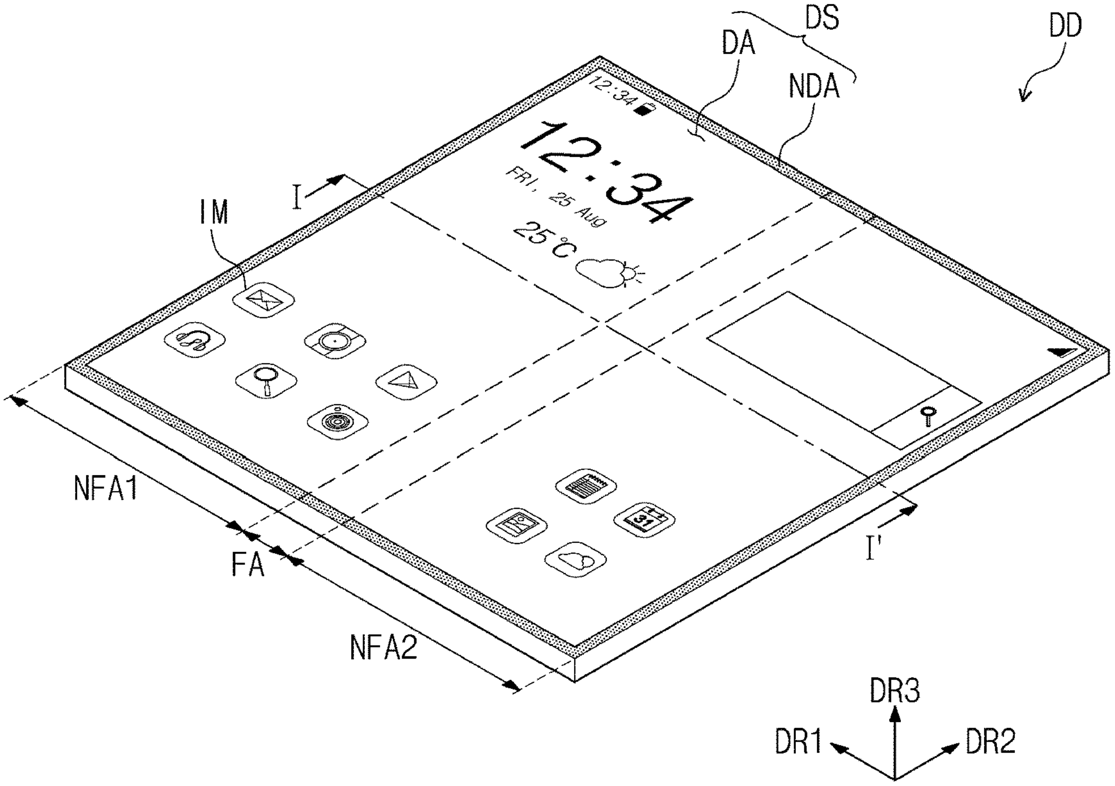
FIG. 1 is a schematic perspective view of a display device according to an embodiment of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Like reference numbers or characters refer to like elements throughout. In addition, in the drawings, the thickness, the ratio, and the dimension of elements may be exaggerated for effective description of the technical contents.

The term "and/or" includes one or more combinations that may be defined by relevant elements.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that, although the terms "first," "second," and the like may be used herein to describe various elements, these elements should not be limited by these terms. These terms are only used to distinguish one element from another element. For example, a first element could be termed a second element without departing from the teachings of the disclosure, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

A description that a component is "configured to" perform a specified operation may be defined as a case where the component is constructed and arranged with structural features that can cause the component to perform the specified operation.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

Unless otherwise defined or implied herein, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms such as "comprises," "includes," "has", and their variations when used herein, specify the presence of stated features, numerals, steps, operations, elements, parts, or the combination thereof, but do not preclude the presence or addition of one or more other features, numerals, steps, operations, elements, parts, or the combination thereof.

Hereinafter, embodiments of the disclosure will be described with reference to the accompanying drawings.

Figure 2:
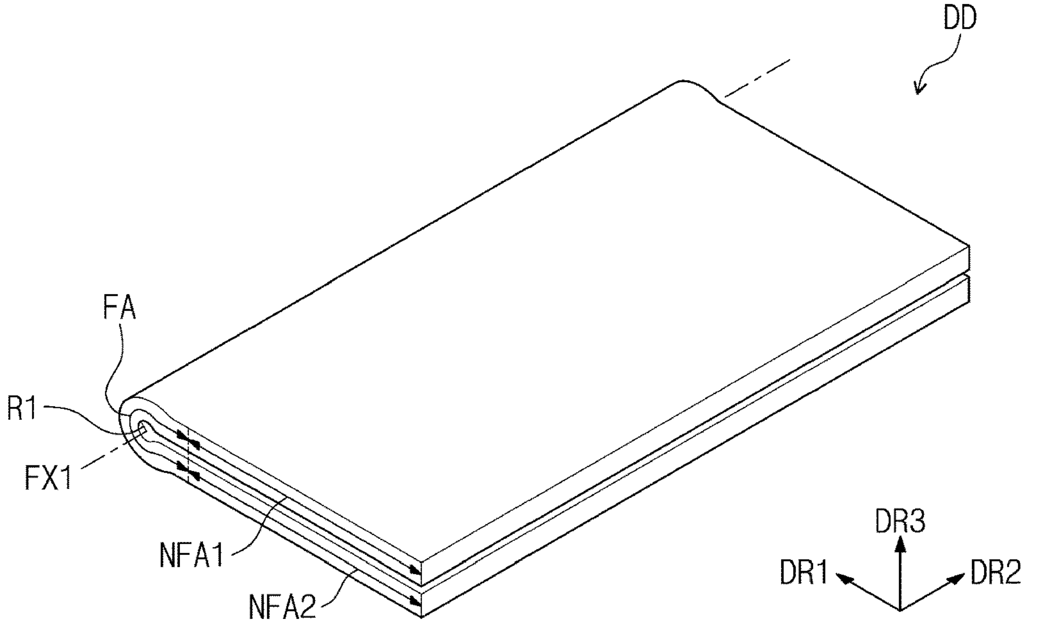
FIG. 2 is a schematic view illustrating an in-folded state of the display device illustrated in FIG. 1.
Figure 3:
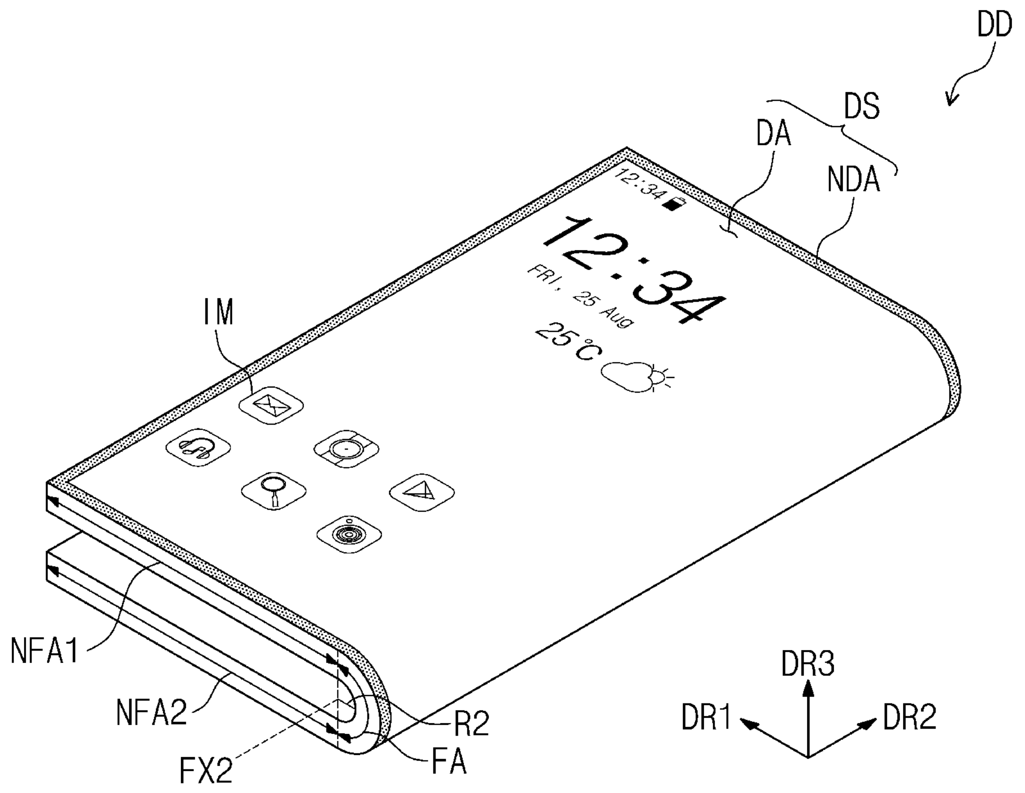
FIG. 3 is a schematic view illustrating an out-folded state of the display device illustrated in FIG. 1.

FIG. 1 is a schematic perspective view of a display device according to an embodiment of the disclosure. FIG. 2 is a schematic view illustrating an in-folded state of the display device illustrated in FIG. 1. FIG. 3 is a schematic view illustrating an out-folded state of the display device illustrated in FIG. 1.

Referring to FIG. 1, a display device DD according to an embodiment of the disclosure may have a rectangular shape with short sides extending in a first direction DR1 and long sides extending in a second direction DR2 crossing (or intersecting) the first direction DR1. However, an embodiment of the disclosure is not limited thereto, and the display device DD may have various shapes such as a circular shape or a polygon shape. The display device DD may be a flexible display device.

Hereinafter, a third direction DR3 is defined as a direction substantially perpendicularly crossing a plane defined by the first direction DR1 and the second direction DR2. The phrase "in a plan view" used herein may be defined as a state as viewed in the third direction DR3.

The display device DD may include a folding region FA and non-folding regions NFA1 and NFA2 adjacent to the folding region FA. The non-folding regions NFA1 and NFA2 may include a first non-folding region NFA1 and a second non-folding region NFA2. The folding region FA may be disposed between the first non-folding region NFA1 and the second non-folding region NFA2. The first non-folding regions NFA1, the folding region FA, and the second non-folding region NFA2 may be arranged in the first direction DR1.

One folding region FA and two non-folding regions NFA1 and NFA2 may be illustrated as an example, but each of the number of the folding region FA and the number of the non-folding regions NFA1 and NFA2 is not limited thereto. For example, the display device DD may include multiple non-folding regions and multiple folding regions disposed between the non-folding regions.

The display device DD may have a top surface that is defined as a display surface DS. The display surface DS may have a plane defined by the first direction DR1 and the second direction DR2. A user may be provided with images IM generated in the display device DD through the display surface DS.

The display surface DS may include a display region DA and a non-display region NDA around the display region DA. The display region DA may display an image, and the non-display region NDA may not display the image. The non-display region NDA may surround the display region DA and define an edge of the display device DD, which is printed in a color (e.g., a predetermined or selectable color).

Although not illustrated, the display device DD may not include at least one sensor and at least one camera. The sensor may be a proximity illuminance sensor, but the type of the sensor is not limited thereto. The camera may capture an external image.

Referring to FIG. 2, the display device DD may be a foldable display device DD to be folded or unfolded. For example, the folding region FA may be bent with respect to a first folding axis FX1 parallel to the second direction DR2, and the display device DD may be folded. The first folding axis FX1 may be defined as a major axis parallel to the long side of the display device DD. The folding region FA may be bent to have a first radius of curvature R1.

In case that the display device DD is folded, the display device DD may be in-folded so that the first non-folding region NFA1 and the second non-folding region NFA2 face each other and the display surface DS is not exposed to the outside. A distance between the first non-folding region NFA1 and the second non-folding region NFA2 may be shorter than two times of the first radius of curvature R1. In case that the display device DD is in-folded, the folding region FA may be folded in a dumbbell shape.

Referring to FIG. 3, the folding region FA may be bent with respect to a second folding axis FX2 parallel to the second direction DR2, and the display device DD may be folded. The second folding axis FX2 may be defined as a major axis parallel to the long side of the display device DD. The folding region FA may be bent to have a second radius of curvature R2. The second radius of curvature R2 may be greater than the first radius of curvature R1.

In case that the display device DD is folded, the display device DD may be out-folded with respect to a folding axis FX2 such that the display surface DS is exposed to the outside. In case that the display device DD is out-folded, the folding region FA may be folded in a "U" shape.

Figure 4:
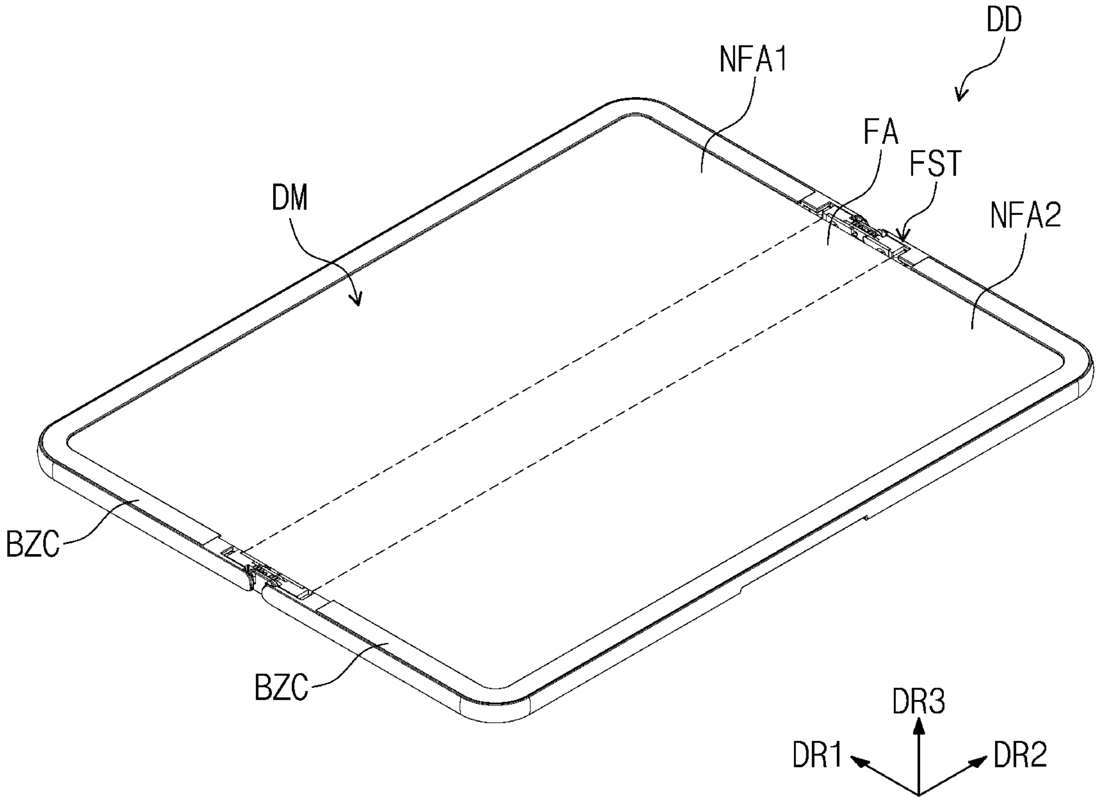
FIG. 4 is a more detailed schematic perspective view of the display device illustrated in FIG. 1.
Figure 5:
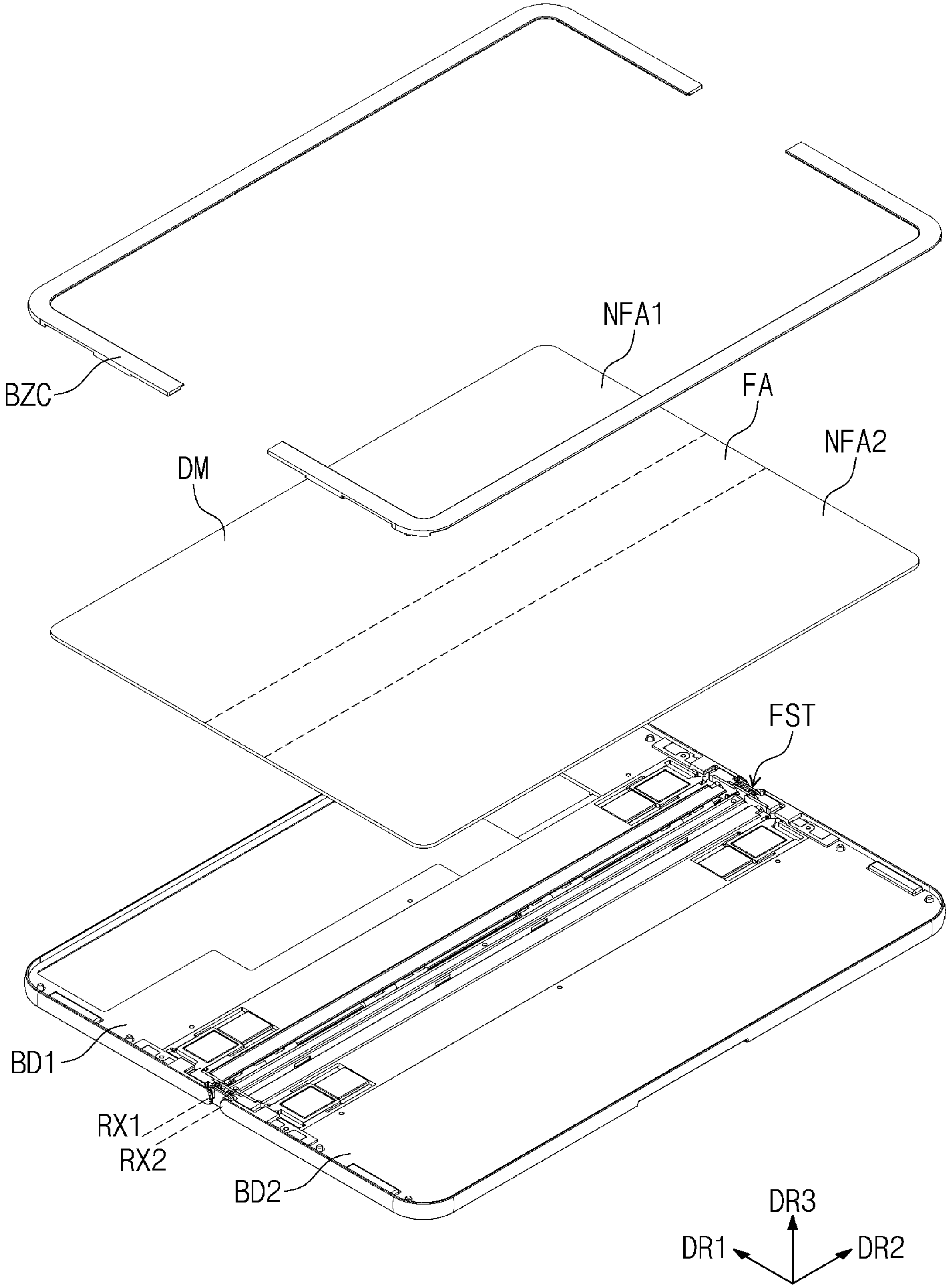
FIG. 5 is a schematic exploded perspective view of the display device illustrated in FIG. 4.

FIG. 4 is a more detailed schematic perspective view of the display device illustrated in FIG. 1. FIG. 5 is a schematic exploded perspective view of the display device illustrated in FIG. 4.

Referring to FIG. 4, the display device DD may include a display module DM and a folding set FST that may accommodate the display module DM. The folding set FST may allow the display module DM to be in-folded and out-folded, and the detailed configuration of the folding set FST may be described in detail below.

Referring to FIGS. 4 and 5, the folding set FST may include bezel covers BZC, and first and second bodies BD1 and BD2. The bezel covers BZC may be disposed on the display module DM, and the first and second bodies BD1 and BD2 may be disposed below the display module DM.

The bezel covers BZC may be spaced apart from each other and symmetrical to each other in the first direction DR1. The bezel covers BZC may overlap the first non-folding region NFA1 and the second non-folding region NFA2, respectively, in a plan view. The bezel covers BZC may cover an edge of the first non-folding region NFA1 and an edge of the second non-folding region NFA2, respectively.

The first and second bodies BD1 and BD2 under the display module DM may support the display module DM. The display module DM may be attached to the first and second bodies BD1 and BD2. For example, an adhesive layer may be disposed between the first and second bodies BD1 and BD2 and the display module DM, and the display module DM may be attached to the first and second bodies BD1 and BD2 through the adhesive layer. For example, the adhesive layer may include a pressure sensitive adhesive (PSA).

The first body BD1 and the second body BD2 may be arranged in the first direction DR1. The first body BD1 may be disposed below the first non-folding region NFA1, and the second body BD2 may be disposed below the second non-folding region NFA2. The first body BD1 may overlap the first non-folding region NFA1, and the second body BD2 may overlap the second non-folding region NFA2, in a plan view. The first body BD1 may support the first non-folding region NFA1, and the second body BD2 may support the second non-folding region NFA2.

A first rotary axis RX1 and a second rotary axis RX2, which are spaced apart from each other in the first direction DR1 and extend parallel to each other in the second direction DR2, may be defined in the folding set FST. The first and second rotary axes RX1 and RX2 may overlap the folding region FA in a plan view. Components of the folding set FST, which define the first rotary axis RX1 and the second rotary axis RX2, will be described in detail below.

Figure 6:
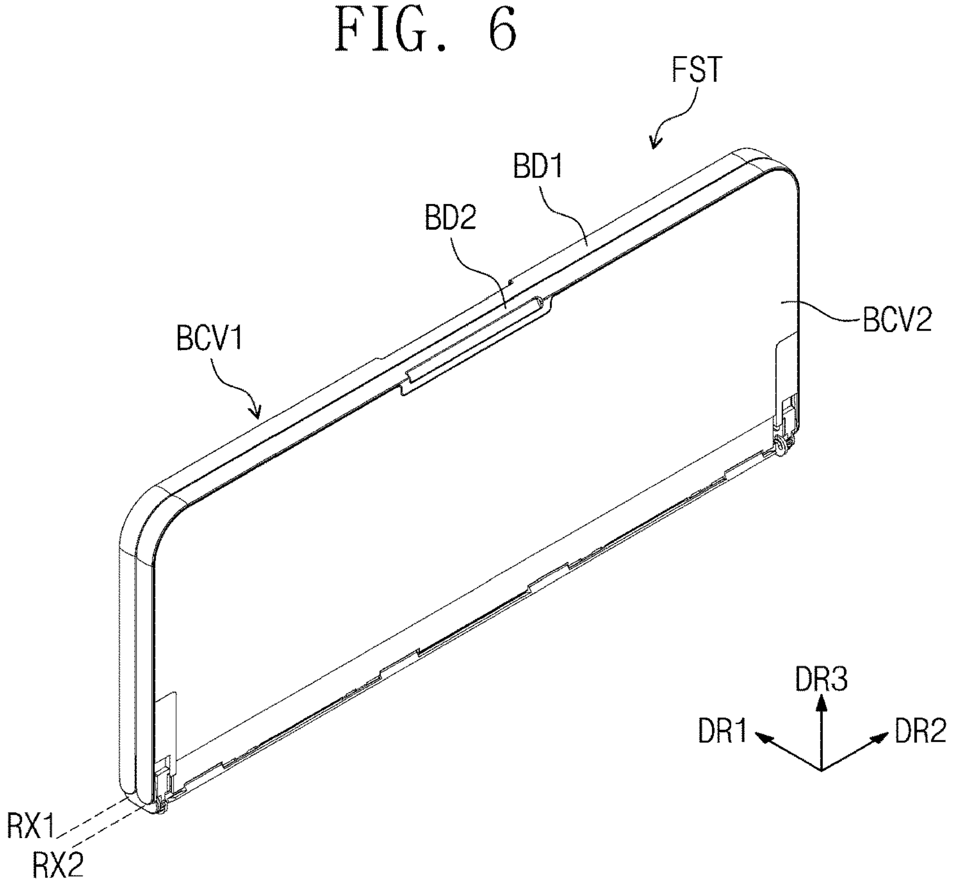
FIG. 6 is a schematic view illustrating an in-folded state of the folding set illustrated in FIG. 5.
Figure 7:
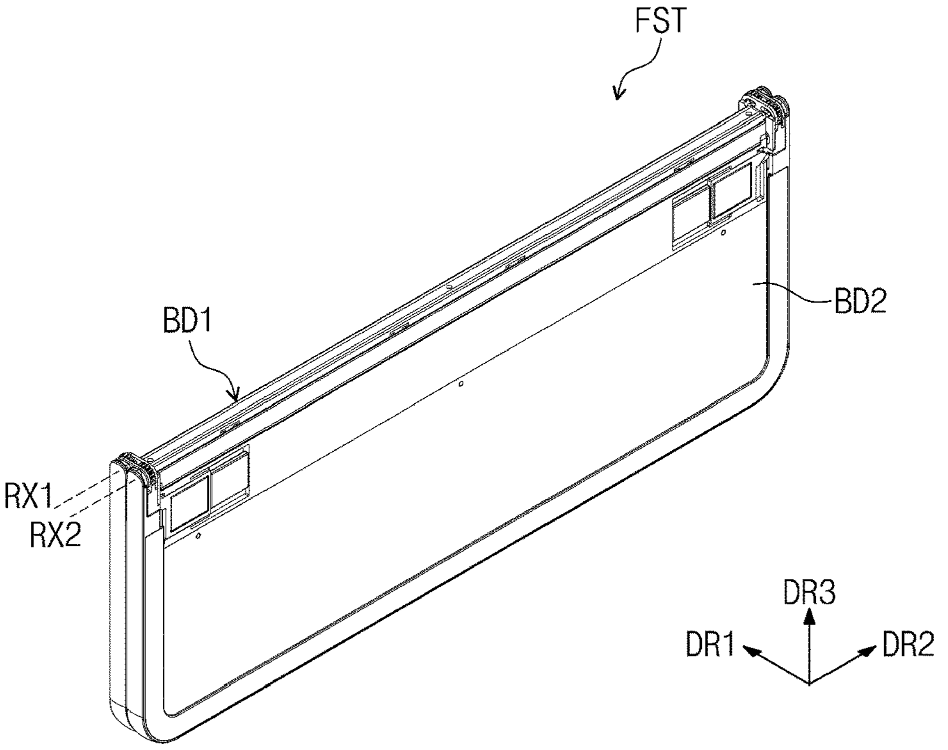
FIG. 7 is a schematic view illustrating an out-folded state of the folding set illustrated in FIG. 5.

FIG. 6 is a schematic view illustrating an in-folded state of the folding set illustrated in FIG. 5. FIG. 7 is a schematic view illustrating an out-folded state of the folding set illustrated in FIG. 5.

Referring to FIGS. 5 and 6, the folding set FST may rotate around the first rotary axis RX1 and the second rotary axis RX2 and be in-folded. As the folding set FST is in-folded, the display module DM may be in-folded. In case that the folding set FST is in-folded, the first body BD1 and the second body BD2 may face each other. Thus, the display module DM disposed on the first body BD1 and the second body BD2 may not be exposed to the outside.

In case that the folding set FST is in-folded, a front surface of the first body BD1 and a front surface of the second body BD2 may be disposed to face each other, and may not be exposed to the outside. The front surface of the first body BD1 and the front surface of the second body BD2 may be defined as surfaces facing the display module DM.

The folding set FST may include a first rear surface cover BCV1 disposed below the first body BD1, and a second rear surface cover BCV2 disposed below the second body BD2. In case that the folding set FST is in-folded, the first rear surface cover BCV1 and the second rear surface cover BCV2 may be exposed to the outside.

Referring to FIGS. 5, 6, and 7, the folding set FST may rotate around the first and second rotary axes RX1 and RX2 and be out-folded. As the folding set FST is out-folded, the display module DM and be out-folded.

In case that the folding set FST is out-folded, the front surface of the first body BD1 and the front surface of the second body BD2 may be exposed to the outside. Thus, the display module DM disposed on the first body BD1 and the second body BD2 may be exposed to the outside.

In case that the folding set FST is out-folded, the first rear surface cover BCV1 and the second rear surface cover BCV2 may be disposed to face each other. Thus, in case that the folding set FST is out-folded, the first rear surface cover BCV1 and the second rear surface cover BCV2 may not be exposed to the outside.

Figure 8:
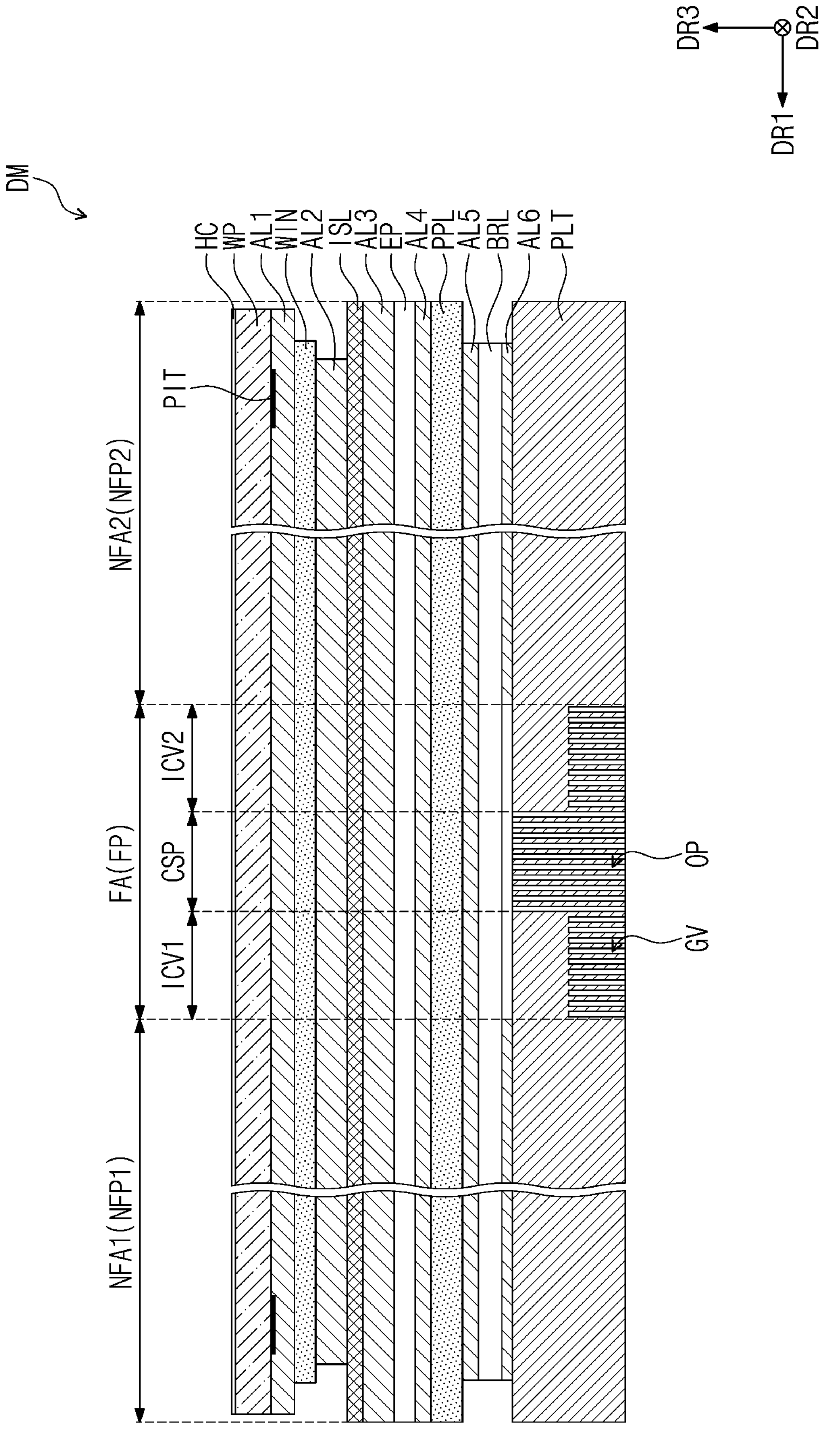
FIG. 8 is a schematic cross-sectional view illustrating the display module illustrated in FIG. 5.

FIG. 8 is a schematic cross-sectional view illustrating the display module illustrated in FIG. 5.

FIG. 8 illustrates the schematic cross-sectional view of the display module DM when viewed in the second direction DR2.

Referring to FIG. 8, the display module DM may be a flexible display module. Similar to the display device DD, the display module DM may include a first non-folding region NFA1, a folding region FA, and a second non-folding region NFA2.

The display module DM may include an electronic panel EP, an impact absorption layer ISL, a window WIN, a window protective layer WP, a hard coating layer HC, a panel protective layer PPL, a barrier layer BRL, a support plate PLT, and first to sixth adhesive layers AL1 to AL6.

The electronic panel EP may display an image, sense an external input, and reduce the reflectance of external light. The configuration of such an electronic panel EP will be described in detail below with reference to FIG. 9.

The impact absorption layer ISL may be disposed on the electronic panel EP. The impact absorption layer ISL may absorb an external impact applied from above the display device DD toward the electronic panel EP and protect the electronic panel EP. The impact absorption layer ISL may be manufactured in the form of a stretched film.

The impact absorption layer ISL may include a flexible plastic material. The flexible plastic material may be defined as a synthetic resin film. For example, the impact absorption layer ISL may include a flexible plastic material such as polyimide (PI) or polyethylene terephthalate (PET).

The window WIN may be disposed on the impact absorption layer ISL. The window WIN may protect the electronic panel EP from external scratches. The window WIN may have an optically transparent property. The window WIN may include glass. However, an embodiment of the disclosure is not limited thereto, and the window WIN may include a synthetic resin film.

The window WIN may have a multilayer structure or a single-layer structure. For example, the window WIN may include synthetic resin films bonded to each other through an adhesive or include a glass substrate and a synthetic resin film bonded to each other through an adhesive.

The window protective layer WP may be disposed on the window WIN. The window protective layer WP may include a flexible plastic material such as polyimide or polyethylene terephthalate. The hard coating layer HC may be disposed on the window protective layer WP.

A print layer PIT may be disposed on a bottom surface of the window protective layer WP. The print layer PIT may have a black color, but the color of the print layer PIT is not limited thereto. The print layer PIT may be adjacent to an edge of the window protective layer WP.

The panel protective layer PPL may be disposed below the electronic panel EP. The panel protective layer PPL may protect a lower portion of the electronic panel EP. The panel protective layer PPL may include a flexible plastic material. For example, the panel protective layer PPL may include polyethylene terephthalate (PET).

The barrier layer BRL may be disposed below the panel protective layer PPL. The barrier layer BRL may increase resistance to a compressive force caused by external pressure. Thus, the barrier layer BRL may serve to prevent deformation of the electronic panel EP. The barrier layer BRL may include a flexible plastic material such as polyimide or polyethylene terephthalate.

The barrier layer BRL may have a color that absorbs light. For example, the barrier layer BRL may have a black color. Components disposed below the barrier layer BRL may be invisible in case that the display module DM is viewed from above the display module DM.

The first adhesive layer AL1 may be disposed between the window protective layer WP and the window WIN. The window protective layer WP and the window WIN may be bonded to each other through the first adhesive layer AL1. The first adhesive layer AL1 may cover the print layer PIT.

The second adhesive layer AL2 may be disposed between the window WIN and the impact absorption layer ISL. The window WIN and the impact absorption layer ISL may be bonded to each other through the second adhesive layer AL2.

The third adhesive layer AL3 may be disposed between the impact absorption layer ISL and the electronic panel EP. The impact absorption layer ISL and the electronic panel EP may be bonded to each other through the third adhesive layer AL3.

The fourth adhesive layer AL4 may be disposed between the electronic panel EP and the panel protective layer PPL. The electronic panel EP and the panel protective layer PPL may be bonded to each other through the fourth adhesive layer AL4.

The fourth adhesive layer AL5 may be disposed between the panel protective layer PPL and the barrier layer BRL. The panel protective layer PPL and the barrier layer BRL may be bonded to each other through the fifth adhesive layer AL5.

The sixth adhesive layer AL6 may be disposed between the barrier layer BRL and the support plate PLT. The barrier layer BRL and the support plate PLT may be bonded to each other through the sixth adhesive layer AL6.

The sixth adhesive layer AL6 may overlap the first and second non-folding regions NFA1 and NFA2 and may not overlap the folding region FA. For example, the sixth adhesive layer AL6 may not be disposed in the folding region FA.

The first to sixth adhesive layers AL1 to AL6 may include a transparent adhesive such as a pressure sensitive adhesive (PSA) (or pressure sensitive adhesive film) or an optically clear adhesive (OCA) (or optically clear adhesive film). However, the type of the adhesive is not limited thereto.

The support plate PLT may be disposed below the barrier layer BRL. The support plate PLT may support the electronic panel EP. The support plate PLT may have rigidity relative to the electronic panel EP. The support plate PLT may include a nonmetal material.

The support plate PLT may include a fiber-reinforced composite material. The fiber-reinforced composite material may be a carbon fiber reinforced plastic (CFRP) or a glass fiber reinforced plastic (GFRP). However, an embodiment of the disclosure is not limited thereto, and the support plate PLT may include a metal material such as stainless steel.

Opening portions OP and grooves GV may be defined in portions of the support plate PLT, which overlap the folding region FA. The opening portions OP may be formed to pass through the portions of the support plate PLT in the third direction DR3. The grooves GV may be defined in a bottom surface of the support plate PLT.

The support plate PLT may include a first non-folding part NFP1, a folding part FP, and a second non-folding part NFP2. The folding part FP may be disposed between the first non-folding part NFP1 and the second non-folding part NFP2. The first non-folding part NFP1, the folding part FP, and the second non-folding part NFP2 may be arranged in the first direction DR1.

The first non-folding part NFP1 may overlap the first non-folding region NFA1, the folding part FP may overlap the folding region FA, and the second non-folding part NFP2 may overlap the second non-folding region NFA2, in a plan view. The folding part FP may include a curved surface portion CSP, a first inverse curvature portion ICV1, and a second inverse curvature portion ICV2. The first inverse curvature portion ICV1 may be disposed between the curved surface portion CSP and the first non-folding part NFP1. The second inverse curvature portion ICV2 may be disposed between the curved surface portion CSP and the second non-folding part NFP2.

The opening portions OP may be defined in the curved surface portion CSP. The grooves GV may be defined in the first and second inverse curvature portions ICV1 and ICV2. The grooves GV may be defined to be evenly distributed over the first and second inverse curvature portions ICV1 and ICV2.

Figure 14:
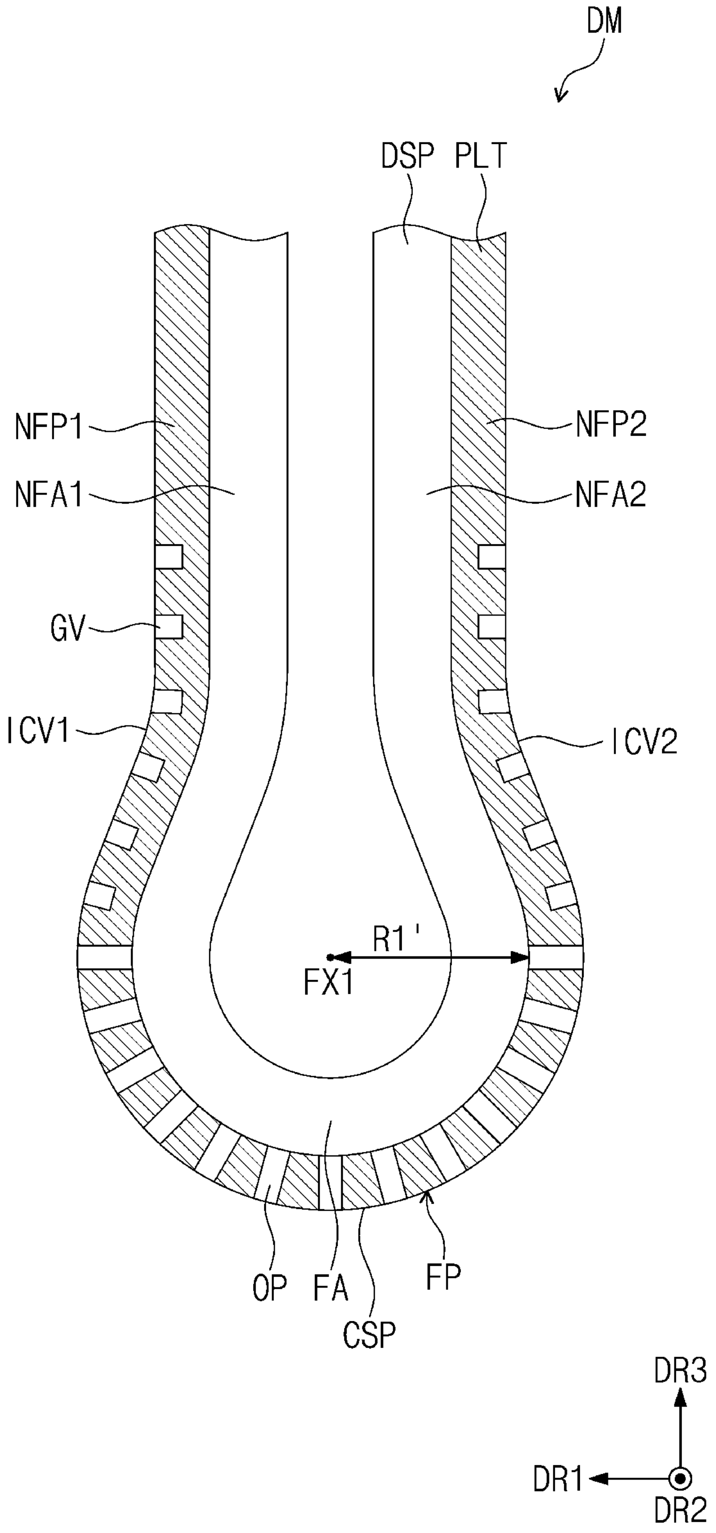
FIG. 14 is a schematic view illustrating an in-folded state of the display module illustrated in FIG. 8.

In case that the display module DM is in-folded, the curved surface portion CSP may be bent to have a curvature (e.g., a predetermined or selectable curvature), and the first and second inverse curvature portions ICV1 and ICV2 may be bent inversely to the curved surface portion CSP and be symmetrical to each other. FIG. 14 illustrates the shape of such a folding part FP.

As the opening portions OP are defined in the curved surface portion CSP and the grooves GV are defined in the first and second inverse curvature portions ICV1 and ICV2, the flexibility of the folding part FP may increase. As the folding part FP with the increased flexibility is readily bent, the support plate PLT may be easily folded with respect to the folding part FP.

Figure 9:
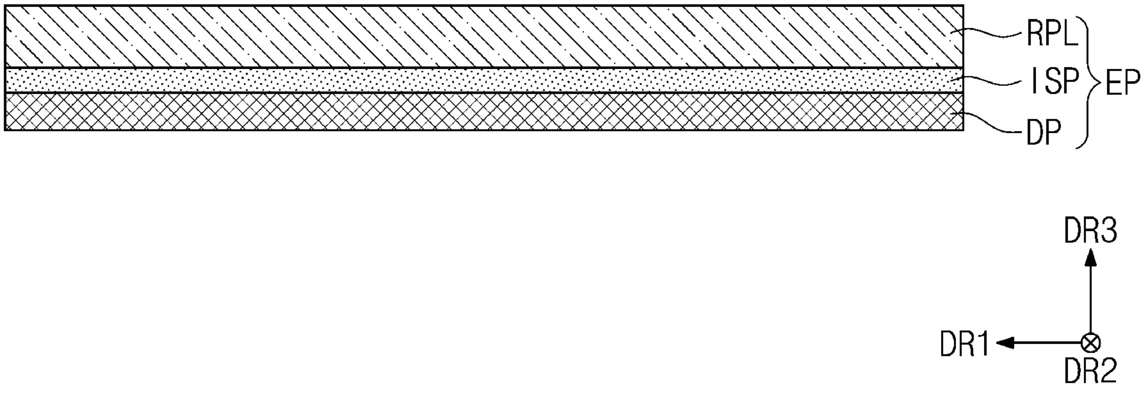
FIG. 9 is a schematic cross-sectional view of the electronic panel illustrated in FIG. 8.

FIG. 9 is a schematic cross-sectional view of the electronic panel illustrated in FIG. 8.

FIG. 9 illustrates the cross-sectional view of the electronic panel EP when viewed in the second direction DR2.

Referring to FIG. 9, the electronic panel EP may include a display panel DP, an input sensing part ISP disposed on the display panel DP, and an anti-reflective layer RPL disposed on the input sensing part ISP. The display panel DP may be a flexible display panel. For example, the display panel DP may include a flexible substrate and elements disposed on the flexible substrate.

The display panel DP according to an embodiment of the disclosure may be a light emitting display panel, and is not particularly limited. For example, the display panel DP may be an organic light emitting display panel or an inorganic light emitting display panel. A light emitting layer of the organic light emitting display panel may include an organic luminescent material. A light emitting layer of the inorganic light emitting display panel may include a quantum dot, a quantum rod, and so on. Hereinafter, the display panel DP is described as the organic light emitting display panel.

The input sensing part ISP may include sensors (not illustrated) for detecting an external input by using a capacitance method. The input sensing part ISP may be formed directly on the display panel DP during manufacture of the display module DM.

The anti-reflective layer RPL may be disposed on the input sensing part ISP. The anti-reflective layer RPL may be formed directly on the input sensing part ISP during the manufacture of the display module DM. The anti-reflective layer RPL may be defined as a film that prevents the reflection of external light. The anti-reflective layer RPL may reduce the reflectance of external light incident from above the display device DD toward the display panel DP.

In an example, the input sensing part ISP may be formed directly on the display panel DP, and the anti-reflective layer RPL may be formed directly on the input sensing part ISP. However, an embodiment of the disclosure is not limited thereto. For example, the input sensing part ISP may be manufactured separately and attached to the display panel DP through an adhesive layer, and the anti-reflective layer RPL may be manufactured separately and attached to the input sensing part ISP through an adhesive layer.

The panel protective layer PPL may be disposed below the display panel DP. The panel protective layer PPL may protect a lower portion of the display panel DP. The panel protective layer PPL may include a flexible plastic material. For example, the panel protective layer PPL may include polyethylene terephthalate (PET).

Figure 10:
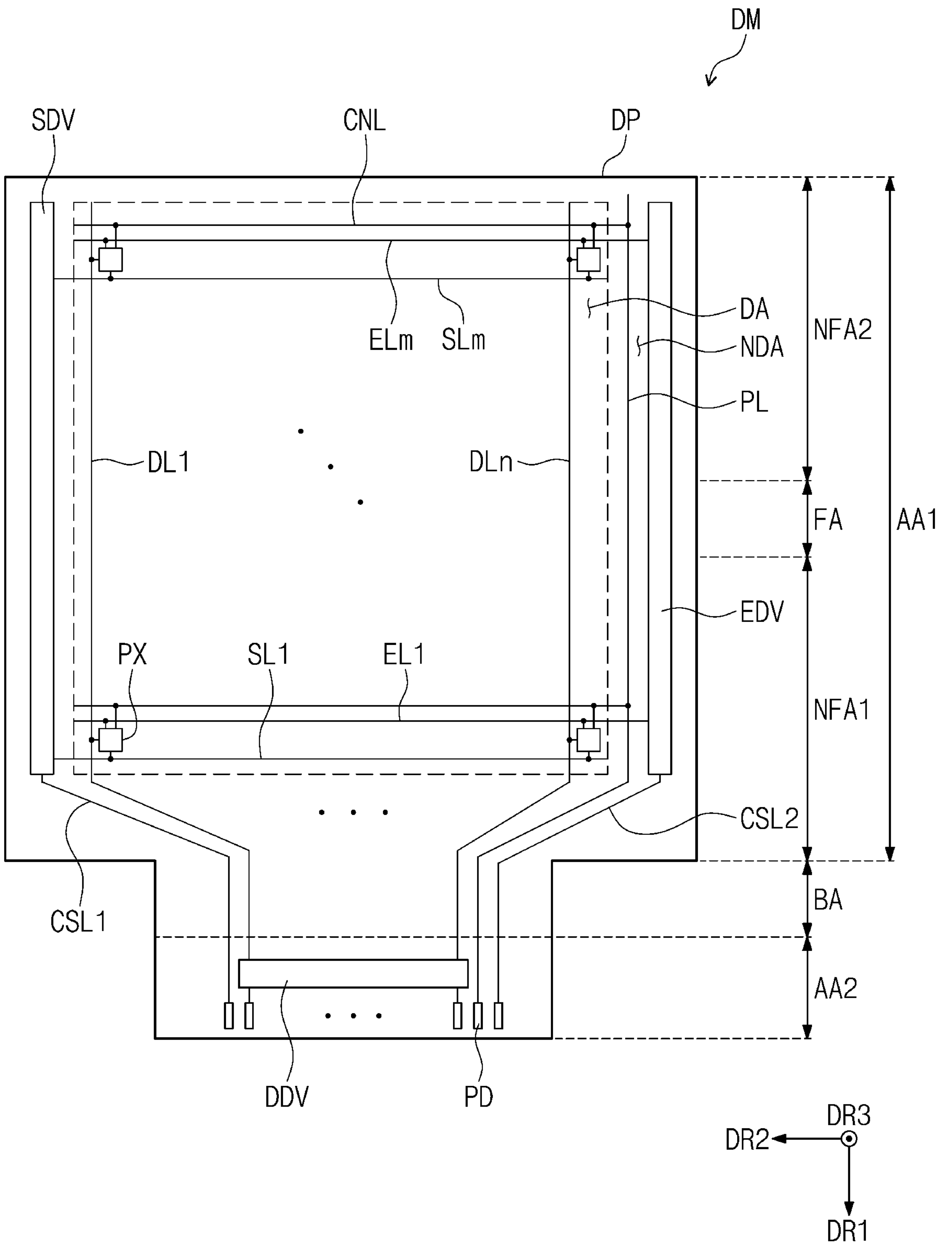
FIG. 10 is a schematic plan view of the display panel illustrated in FIG. 9.

FIG. 10 is a schematic plan view of the display panel illustrated in FIG. 9.

Referring to FIG. 10, the display module DM may include a display panel DP, a scan driver SDV, a data driver DDV, and an emission driver EDV.

The display panel DP may include a first region AA1, a second region AA2, and a bending region BA between the first region AA1 and the second region AA2. The bending region BA may extend in the second direction DR2, and the first region AA1, the bending region BA, and the second region AA2 may be arranged in the first direction DR1.

The first region AA1 may include a display region DA and a non-display region NDA around the display region DA. The non-display region NDA may surround the display region DA. The display region DA may be a region in which an image is displayed, and the non-display region NDA may be a region in which an image is not displayed. The second region AA2 and the bending region BA may each be a region in which an image is not displayed.

The first region AA1 may include a first non-folding region NFA1, a second non-folding region NFA2, and a folding region FA between the first non-folding region NFA1 and the second non-folding region NFA2 when viewed in the second direction DR2.

The display panel DP may include pixels PX, scan lines SL1 to SLm, data lines DL1 to DLn, emission lines EL1 to ELm, first and second control lines CSL1 and CSL2, a power line PL, connection lines CNL, and pads PD. Here, m and n are natural numbers. The pixels PX may be disposed in the display region DA and connected to the scan lines SL1 to SLm, the data lines DL1 to DLn, and the emission lines EL1 to Elm.

The scan driver SDV and the emission driver EDV may be disposed in the non-display region NDA. The scan driver SDV and the emission driver EDV may be disposed in the non-display region NDA adjacent to each of sides of the first region AA1, and may be opposite to each other in the second direction DR2. The data driver DDV may be disposed in the second region AA2. The data driver DDV may be manufactured in the form of an integrated circuit chip and mounted on the second region AA2.

Although not illustrated, the bending region BA may be bent, and the second region AA2 may be disposed below the first region AA1. Thus, the data driver DDV mounted on the second region AA2 may be disposed below the first region AA1. FIG. 8 illustrates that the bending region BA and the second region AA2 are omitted.

The scan lines SL1 to SLm may extend in the second direction DR2 and be connected to the scan driver SDV. The data lines DL1 to DLn may extend in the first direction DR1 and be connected to the scan driver SDV via the bending region BA. The emission lines EL1 to ELm may extend in the second direction DR2 and be connected to the emission driver EDV.

The power line PL may extend in the first direction DR1 and be disposed in the non-display region NDA. The power line PL may be disposed between the display region DA and the emission driver EDV. However, an embodiment of the disclosure is not limited thereto, and the power line PL may be disposed between the display region DA and the scan driver SDV.

The power line PL may extend to the second region AA2 via the bending region BA. The power line PL may extend toward a lower end of the second region AA2 in a plan view. The power line PL may receive a driving voltage.

The connection lines CNL may extend in the second direction DR2 and be arranged in the first direction DR1. The connection lines CNL may be connected to the power line PL and the pixels PX. The driving voltage may be applied to the pixels PX through the power line PL and the connection lines CNL, which are connected to each other.

A first control line CSL1 may be connected to the scan driver SDV and extend toward the lower end of the second region AA2 via the bending region BA. A second control line CSL2 may be connected to the emission driver EDV and extend toward the lower end of the second region AA2 via the bending region BA. The data driver DDV may be disposed between the first control line CSL1 and the second control line CSL2.

The pads PD may be disposed adjacent to the lower end of the second region AA2 in a plan view. The data driver DDV, the power line PL, the first control line CSL1, and the second control line CSL2 may be connected to the pads PD.

The data lines DL1 to DLn may be connected to corresponding pads PD, respectively, through the data driver DDV. For example, the data lines DL1 to DLn may be connected to the data driver DDV, and the data driver DDV may be connected to the pads PD corresponding to the data lines DL1 to DLn, respectively.

Although not illustrated, a printed circuit board may be connected to the pads PD, and a timing controller and a voltage generator may be disposed on the printed circuit board. The timing controller may be manufactured as an integrated circuit chip and mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and an emission control signal in response to control signals received from the outside. The voltage generator may generate the driving voltage.

The scan control signal may be provided for the scan driver SDV through the first control line CSL1. The emission control signal may be provided for the emission driver EDV through the second control line CSL2. The data control signal may be provided for the data driver DDV. The timing controller may receive image signals from the outside, and convert a data format of the image signals to match an interface specification of the data driver DDV and provide the image signals for the data driver DDV.

The scan driver SDV may generate scan signals in response to the scan control signal. The scan signals may be applied to the pixels PX through the scan lines SL1 to SLm. The scan signals may be sequentially applied to the pixels PX.

The data driver DDV may generate data voltages corresponding to the image signals in response to the data control signal. The data voltages may be applied to the pixels PX through the data lines DL1 to DLn. The emission driver EDV may generate emission signals in response to the emission control signal. The emission signals may be applied to the pixels PX through the emission lines EL1 to ELm.

The pixels PX may be provided with the data voltages in response to the scan signals. The pixels PX may display an image by emitting light with brightness corresponding to the data voltages in response to emission signals. An emission time of the pixels PX may be controlled by the emission signals.

Figure 11:
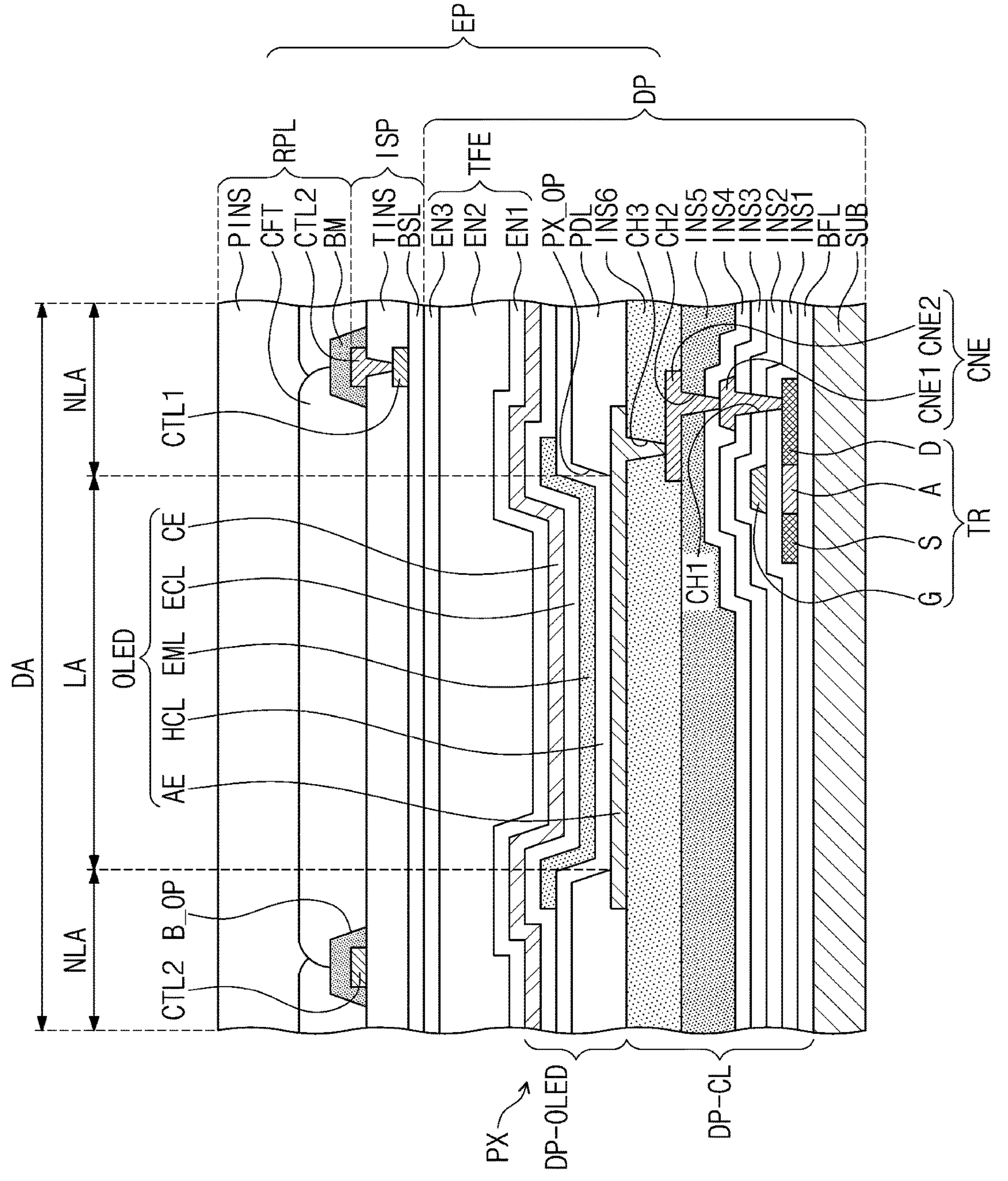
FIG. 11 is a schematic cross-sectional view illustrating as an example an electronic panel corresponding to any one pixel illustrated in FIG. 10.

FIG. 11 is a schematic cross-sectional view illustrating an electronic panel corresponding to any one pixel illustrated in FIG. 10.

Referring to FIG. 11, a pixel PX may include a transistor TR and a light emitting element OLED. The light emitting element OLED may include a first electrode AE (or anode), a second electrode CE (or cathode), a hole control layer HCL, an electron control layer ECL, and a light emitting layer EML.

The transistor TR and the light emitting element OLED may be disposed on a substrate SUB. FIG. 11 illustrates one transistor TR as an example, but the pixel PX may substantially include multiple transistors for driving the light emitting element OLED and at least one capacitor.

The display region DA may include an emission region LA corresponding to each of the pixels PX, and a non-emission region NLA around the emission region LA. The light emitting element OLED may be disposed in the emission region LA.

A buffer layer BFL may be disposed on the substrate SUB, and the buffer layer BFL may be an inorganic layer. A semiconductor pattern may be disposed on the buffer layer BFL. The semiconductor pattern may include polysilicon, amorphous silicon, or a metal oxide.

The semiconductor pattern may be doped with an n-type dopant or a p-type dopant. The semiconductor pattern may include a heavily doped region and a lightly doped region. The heavily doped region may have higher conductivity than the lightly doped region, and substantially serve as a source electrode and a drain electrode of the transistor TR. The lightly doped region may substantially correspond to an active (or channel) of the transistor.

A source S, an active A, and a drain D of the transistor TR may be formed from the semiconductor pattern. A first insulation layer INS1 may be disposed on the semiconductor pattern. A gate G of the transistor TR may be disposed on the first insulation layer INS1. A second insulation layer INS2 may be disposed on the gate G. A third insulation layer INS3 may be disposed on the second insulation layer INS2.

A connection electrode CNE may include a first connection electrode CNE1 and a second connection electrode CNE2 in order to connect the transistor TR and the light emitting element OLED to each other. The first connection electrode CNE1 may be disposed on the third insulation layer INS3, and connected to the drain D through a first contact hole CH1 defined in the first to third insulation layers INS1 to INS3.

A fourth insulation layer INS4 may be disposed on the first connection electrode CNE1. A fifth insulation layer INS5 may be disposed on the fourth insulation layer INS4. The second connection electrode CNE2 may be disposed on the fifth insulation layer INS5. The second connection electrode CNE2 may be connected to the first connection electrode CNE1 through a second contact hole CH2 defined in the fourth and fifth insulation layers INS4 and INS5.

A sixth insulation layer INS6 may be disposed on the second connection electrode CNE2. The layers from the buffer layer BFL to the sixth insulation layer INS6 may be defined as a circuit element layer DP-CL. The first insulation layer INS1 to the sixth insulation layer INS6 may be each an inorganic layer or an organic layer.

The first electrode AE may be disposed on the sixth insulation layer INS6. The first electrode AE may be connected to the second connection electrode CNE2 through a third contact hole CH3 defined in the sixth insulation layer INS6. A pixel defining film PDL in which an opening portion PX_OP for exposing a portion of the first electrode AE is defined may be disposed on the first electrode AE and the sixth insulation layer INS6.

The hole control layer HCL may be disposed on the first electrode AE and the pixel defining film PDL. The hole control layer HCL may include a hole transport layer and a hole injection layer.

The light emitting layer EML may be disposed on the hole control layer HCL. The light emitting layer EML may be disposed in a region corresponding to the opening portion PX_OP. The light emitting layer EML may include an organic matter and/or an inorganic matter. The light emitting layer EML may generate any one of red, green, and blue light.

The electron control layer ECL may be disposed on the light emitting layer EML and the hole control layer HCL. The electron control layer ECL may include an electron transport layer and an electron injection layer. The hole control layer HCL and the electron control layer ECL may be disposed, in common, in the emission region LA and the non-emission region NLA.

The second electrode CE may be disposed on the electron control layer ECL. The second electrode CE may be disposed, in common, in the pixels PX. The layer on which the light emitting layer EML is disposed may be defined as a display element layer DP-OLED.

A thin film encapsulation layer TFE may be disposed on the second electrode CE and cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 to EN3 may each include an inorganic insulation layer and protect the pixel PX from moisture or oxygen. The second encapsulation layer EN2 may include an organic insulation layer and protect the pixel PX from foreign matters such as dust particles.

A first voltage may be applied to the first electrode AE through the transistor TR, and a second voltage having a lower level than the first voltage may be applied to the second electrode CE. The hole and the electron injected into the light emitting layer EML may be combined with each other to generate an exciton, and the light emitting element OLED may emit light while the exciton transitions into a ground state.

An input sensing part ISP may be disposed on the thin film encapsulation layer TFE. The input sensing part ISP may be manufactured directly on a top surface of the thin film encapsulation layer TFE.

A base layer BSL may be disposed on the thin film encapsulation layer TFE. The base layer BSL may include an inorganic insulation layer. At least one inorganic insulation layer may be provided as the base layer BSL on the thin film encapsulation layer TFE.

The input sensing part ISP may include a first conductive pattern CTL1 and a second conductive pattern CTL2 disposed on the first conductive pattern CTL1. The first conductive pattern CTL1 may be disposed on the base layer BSL. An insulation layer TINS may be disposed on the base layer BSL so as to cover the first conductive pattern CTL1. The insulation layer TINS may include an inorganic insulation layer or an organic insulation layer. The second conductive pattern CTL2 may be disposed on the insulation layer TINS.

The first and second conductive patterns CTL1 and CTL2 may each overlap the non-emission region NLA. Although not illustrated, the first and second conductive patterns CTL1 and CTL2 may be disposed on the non-emission region NLA between the emission regions LA and have a mesh shape.

The first and second conductive patterns CTL1 and CTL2 may form sensors of the input sensing part ISP described above. For example, the first and second conductive patterns CTL1 and CTL2 in the form of a mesh may be separated from each other in a region and form the sensors. The second conductive pattern CTL2 may have a portion connected to the first conductive pattern CTL1.

An anti-reflective layer RPL may be disposed on the second conductive pattern CTL2. The anti-reflective layer RPL may include a black matrix BM and color filters CFT.

The black matrix BM may overlap the non-emission region NLA, and the color filters CFT may overlap the emission regions LA, respectively.

The black matrix BM may be disposed on the insulation layer TINS so as to cover the second conductive pattern CTL2. An opening portion B_OP, which overlaps the emission region LA and the opening portion PX_OP, may be defined in the black matrix BM. The black matrix BM may absorb and block the light. The opening portion B_OP may have a width greater than a width of the opening portion PX_OP.

The color filters CFT may be disposed on the first insulation layer TINS and the black matrix BM. Each of the color filters CFT may be disposed in the opening portion B_OP. A planarized insulation layer PINS may be disposed on the color filters CFT. The planarized insulation layer PINS may provide a flat top surface.

In case that external light traveling toward the display panel DP is reflected by the display panel DP and provided for an external user again, the external light may be visible to the user as in a mirror. To prevent such a phenomenon, the anti-reflective layer RPL may include, for example, color filters CFT that emit the same colors as the pixels of the display panel DP, respectively. The color filters CFT may filter the external light to have the same colors as those of the pixels, respectively. In this case, the external light may be invisible to the user.

However, an embodiment of the disclosure is not limited thereto, and the anti-reflective layer RPL may include a polarizing film so as to reduce the reflectance of the external light. The polarizing film may be separately manufactured and attached to the input sensing part ISP through an adhesive layer. The polarizing film may include a retarder and/or a polarizer.

Figure 12:
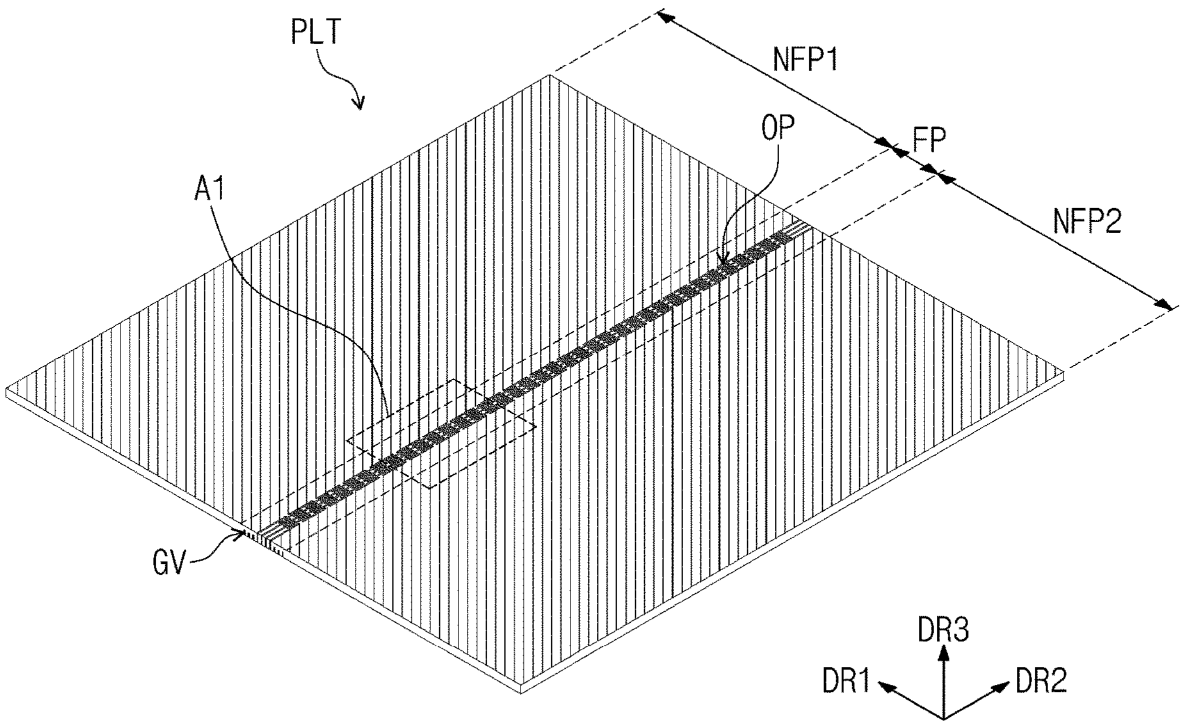
FIG. 12 is a schematic perspective view of the support plate illustrated in FIG. 8.
Figure 13:
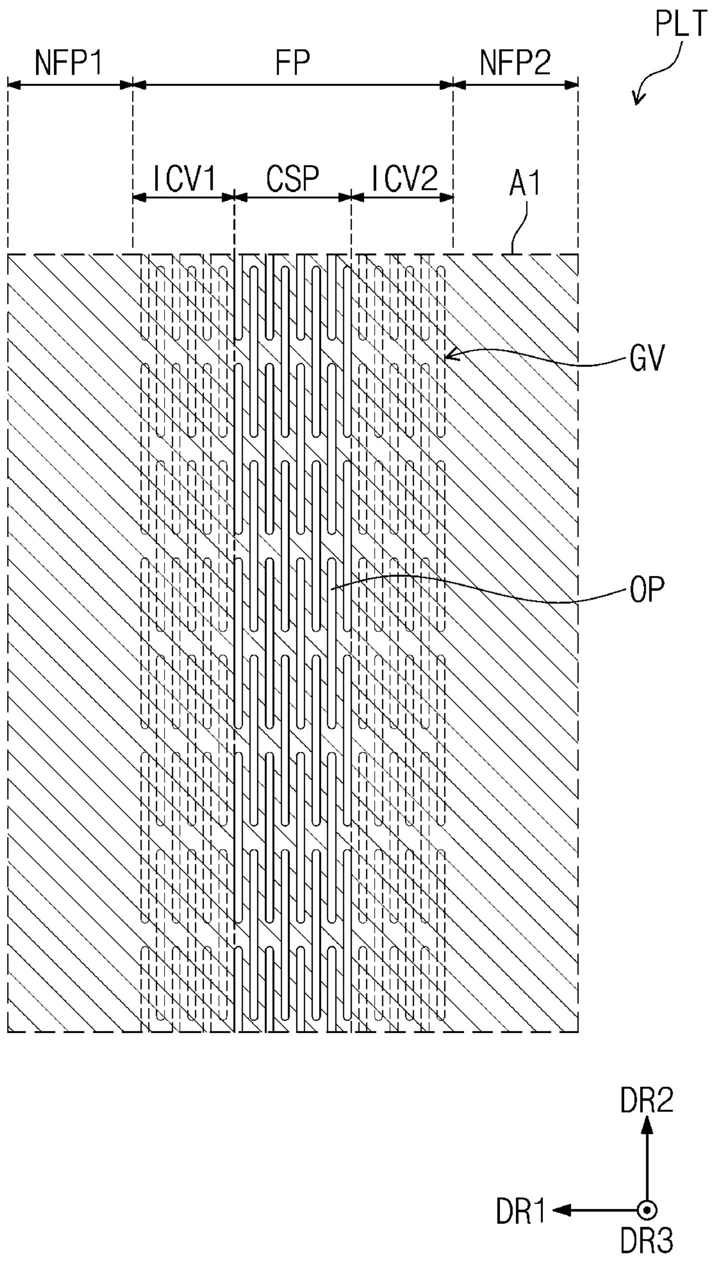
FIG. 13 is a schematic enlarged view of first region A1 illustrated in FIG. 12.

FIG. 12 is a schematic perspective view of the support plate illustrated in FIG. 8. FIG. 13 is a schematic enlarged view of first region A1 illustrated in FIG. 12.

FIG. 13 illustrates the grooves GV, which are defined in the rear surface of the support plate PLT, in dotted lines.

Referring to FIGS. 12 and 13, a grid pattern may be defined in a folding part FP. For example, opening portions OP and grooves GV may be defined in the folding part FP. As described above, the opening portions OP may be defined in the curved surface portion CSP, and the grooves GV may be defined in the bottom surfaces of the first and second inverse curvature portions ICV1 and ICV2, respectively. The opening portions OP and the grooves GV may be arranged in a pattern (e.g., a predetermined or selectable pattern). The opening portions OP and the grooves GV may be arranged in a grid shape, and the grid pattern may be defined in the folding part FP.

As the opening portions OP and the grooves GV are defined in the folding part FP, the area of the folding part FP may decrease to reduce the rigidity of the folding part FP. In case that the opening portions OP and the grooves GV are defined in the folding part FP, the flexibility of the folding part FP may increase compared to a case where the opening portions OP and the grooves GV are not defined in the folding part FP. Thus, the folding part FP may be readily bent.

Referring to FIG. 13, the opening portions OP and the grooves GV may be arranged in the first direction DR1 and the second direction DR2. The opening portions OP and the grooves GV may further extend in the second direction DR2 than in the first direction DR1. For example, the opening portions OP arranged in an h-th column and the opening portions OP arranged in an (h+1)th column may be misaligned with each other. The grooves GV arranged in an h-th column and the grooves GV arranged in an (h+1)th column may be misaligned with each other. Here, h is a natural number, and the column may correspond to the second direction DR2.

Figure 15:
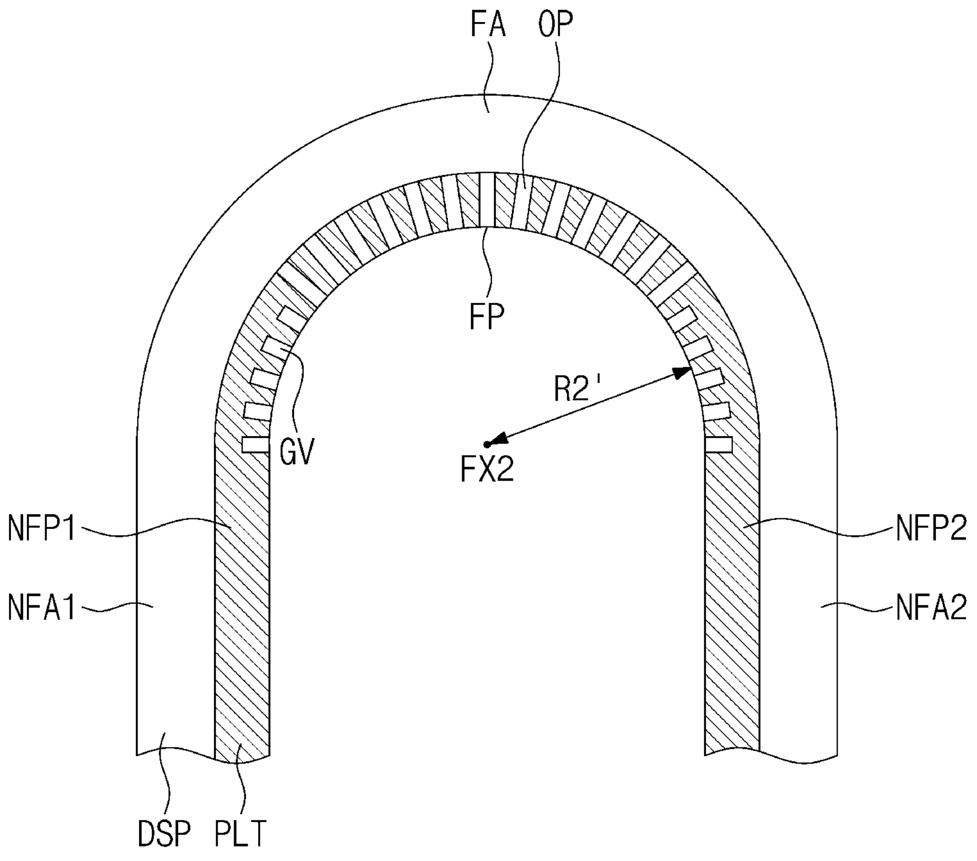
FIG. 15 is a schematic view illustrating an out-folded state of the display module illustrated in FIG. 8.

FIG. 14 is a schematic view illustrating an in-folded state of the display module illustrated in FIG. 8. FIG. 15 is a schematic view illustrating an out-folded state of the display module illustrated in FIG. 8.

FIGS. 14 and 15 illustrate components that are disposed on the support plate PLT, as a display part DSP having a single layer.

Referring to FIG. 14, the display module DM may be folded or unfolded. In FIG. 8, the display module DM may be in an unfolded state in which the display module DM is unfolded in the first direction DR1. In FIG. 14, the display module DM may be in an in-folded state in which the display module DM is bent with respect to the first folding axis FX1.

As the support plate PLT is folded, the display module DM may be folded by the support plate PLT. The display module DM may be in-folded so that a front surface of the first non-folding region NFA1 and a front surface of the second non-folding region NFA2 face each other. The display module DM may change from a first state, which is the flat state illustrated in FIG. 8, to a second state that is the in-folded state illustrated in FIG. 14, or may change from the second state to the first state.

As the opening portions OP and the grooves GV are defined in the support plate PLT, the folding part FP may be readily bent due to the opening portions OP and the grooves GV. As the opening portions OP are defined in the curved surface portion CSP, the curved surface portion CSP may be readily bent. As the grooves GV are defined in the first and second inverse curvature portions ICV1 and ICV2, the first and second inverse curvature portions ICV1 and ICV2 may be readily bent.

In case that the folding part FP is folded, the curved surface portion CSP may be bent to have a first radius of curvature R1'. The first inverse curvature portion ICV1 may be bent inversely to the curved surface portion CSP. The second inverse curvature portion ICV2 may be bent inversely to the curved surface portion CSP. The second inverse curvature portion ICV2 may be symmetrical to the first inverse curvature portion ICV1.

In case that the folding part FP is folded, a distance between the first non-folding part NFP1 and the second non-folding part NFP2 in the first direction DR1 may be smaller than two times of the first radius of curvature R1' (for example, diameter). The support plate PLT may be folded in a dumbbell shape according to such a folded state. As the support plate PLT is folded in the dumbbell shape, the display module DM may be folded in a dumbbell shape.

Referring to FIG. 15, the support plate PLT may be folded, and the display module DM may be out-folded so that the front surface of the first non-folding region NFA1 and the front surface of the second non-folding region NFA2 are opposite to each other. In case that the display module DM is out-folded, the first non-folding part NFP1 and the second non-folding part NFP2 may face each other.

In FIG. 15, the display module DM may be in an out-folded state in which the display module DM is bent with respect to the second folding axis FX2. The display module DM may change from the first state, which is the flat state illustrated in FIG. 8, to a third state that is the out-folded state illustrated in FIG. 15, or may change from the third state to the first state. In case that the folding part FP is folded, the folding part FP may be bent to have a second radius of curvature R2'. The folding part FP may be folded in a "U" shape.

Figure 16:
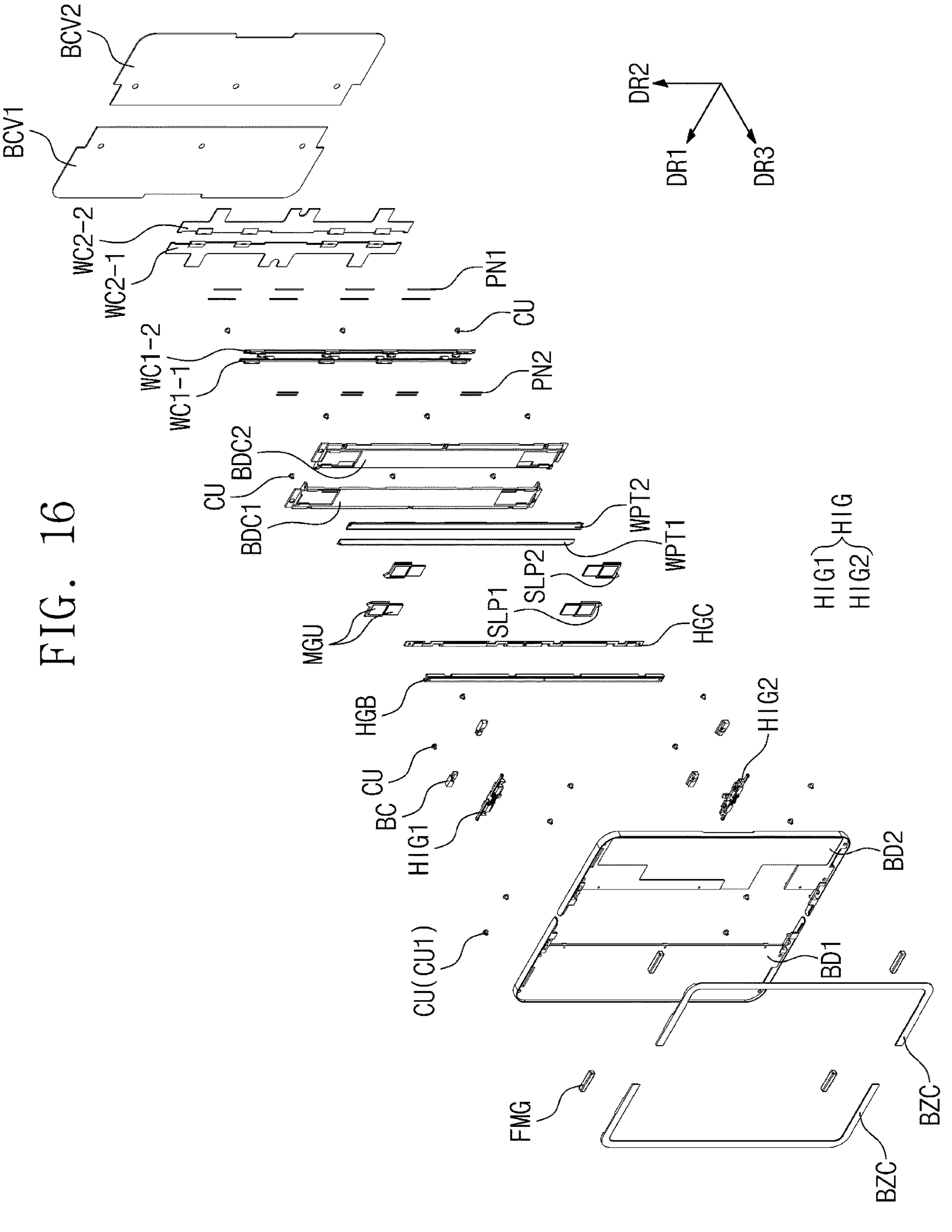
FIG. 16 is a schematic exploded perspective view of the folding set illustrated in FIG. 4.

FIG. 16 is a schematic exploded perspective view of the folding set illustrated in FIG. 4.

Referring to FIG. 16, a folding set FST according to an embodiment of the disclosure may include a pair of bezel covers BZC, first and second bodies BD1 and BD2, fixing magnets FMG, a hinge HIG including first and second hinges HIG1 and HIG2, body connecting parts BC, first and second body covers BDC1 and BDC2, first and second wing plates WPT1 and WPT2, magnet parts MGU, a hinge bar HGB, a hinge cover HGC, first and second sliding parts SLP1 and SLP2, first-1 and first-2 wing covers WC1-1 and WC1-2, second-1 and second-2 wing covers WC2-1 and WC2-2, first and second rear surface covers BCV1 and BCV2, first connecting pins PN1, second connecting pins PN2, and coupling parts CU.

The fixing magnets FMG, the hinge HIG, the body connecting parts BC, the first and second body covers BDC1 and BDC2, the first and second wing plates WPT1 and WPT2, the magnet parts MGU, the hinge bar HGB, the hinge cover HGC, the first and second sliding parts SLP1 and SLP2, the first-1 and first-2 wing covers WC1-1 and WC1-2, the second-1 and second-2 wing covers WC2-1 and WC2-2, the first connecting pins PN1, the second connecting pins PN2, and the coupling parts CU may be disposed between the first and second bodies BD1 and BD2 and the first and second rear surface covers BCV1 and BCV2.

Hereinafter, arrangement and connection structures of the details of the folding set FST will be described in detail with reference to FIGS. 16 and 17 to 37.

Figure 17:
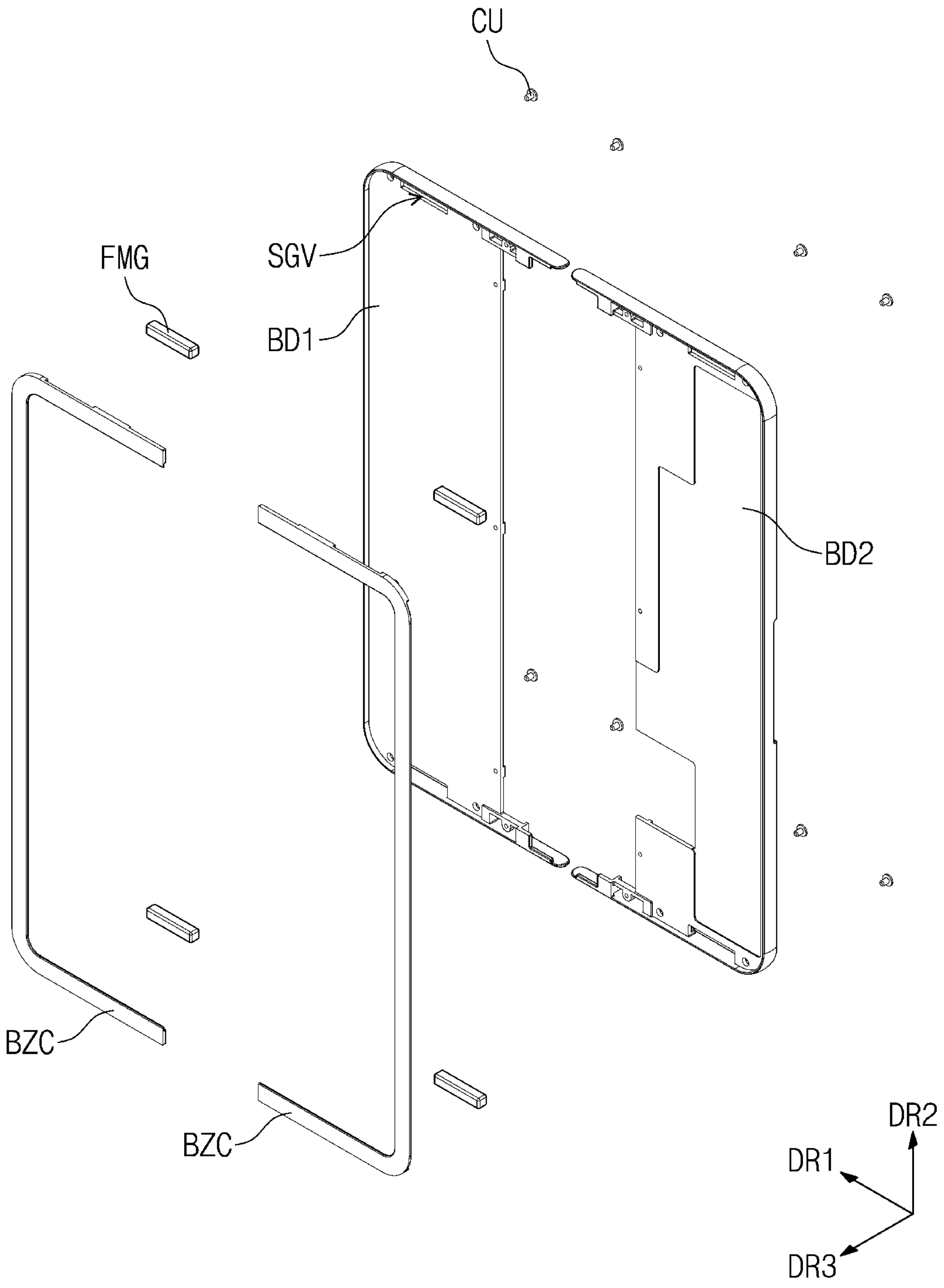
FIG. 17 is a schematic enlarged view of the bezel covers, the first and second bodies, the fixing magnets, and some coupling units illustrated in FIG. 16.
Figure 18:
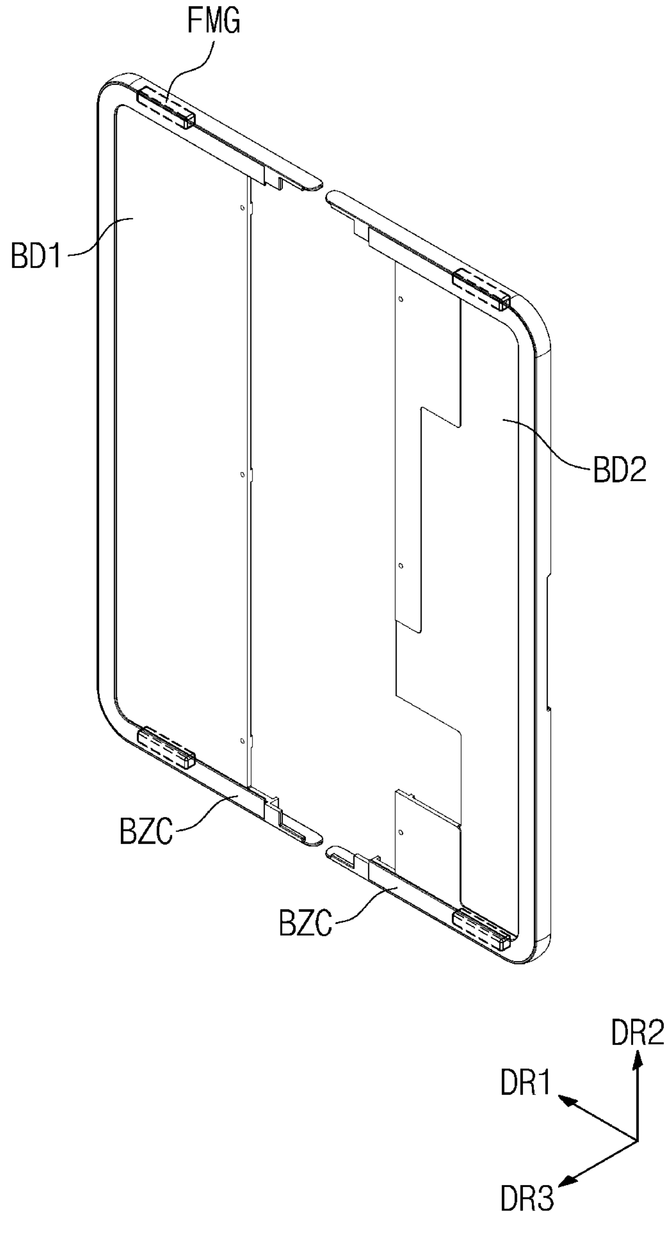
FIG. 18 is a schematic view illustrating a coupled state of the bezel covers, the first and second bodies, the fixing magnets, and some coupling units illustrated in FIG. 17.

FIG. 17 is a schematic enlarged view of the bezel covers, the first and second bodies, the fixing magnets, and some coupling parts illustrated in FIG. 16. FIG. 18 is a schematic view illustrating a coupled state of the bezel covers, the first and second bodies, the fixing magnets, and some coupling parts illustrated in FIG. 17.

Referring to FIGS. 16, 17, and 18, the bezel covers BZC and the fixing magnets FMG may be disposed on the first and second bodies BD1 and BD2. The coupling parts CU may include first coupling parts CU1. The first coupling parts CU1 may be disposed below the first and second bodies BD1 and BD2.

The fixing magnets FMG may be disposed between the bezel covers BZC and the first and second bodies BD1 and BD2. The fixing magnets FMG may be disposed adjacent to sides of the first body BD1, which are opposite to each other in the second direction DR2, and sides of the second body BD2, which are opposite to each other in the second direction DR2, respectively.

The fixing magnets FMG may be coupled (or connected) to the first and second bodies BD1 and BD2. For example, seating grooves SGV may be defined in a top surface of the first body BD1, which is adjacent to the sides of the first body BD1, and a top surface of the second body BD2, which is adjacent to the sides of the second body BD2, respectively. The fixing magnets FMG may be disposed in the seating grooves SGV and coupled to the first and second bodies BD1 and BD2, respectively.

The bezel covers BZC may be adjacent to an edge of the first body BD1 and an edge of the second body BD2 other than a side of the first body BD1 and a side of the second body BD2, which face each other, respectively. The bezel covers BZC may be coupled to the first and second bodies BD1 and BD2, respectively, and may cover the fixing magnets FMG. The fixing magnets FMG may not be exposed to the outside due to the bezel covers BZC. FIG. 18 illustrates the fixing magnets FMG, which are not exposed to the outside, in dotted lines.

The bezel covers BZC may be adjacent to the edge of the first body BD1 and the edge of the second body BD2 and coupled to the first and second bodies BD1 and BD2. For example, the first coupling parts CU1 may couple the first and second bodies BD1 and BD2 to the bezel covers BZC. The first coupling parts CU1 may be coupled to the bezel covers BZC through holes (a reference symbol not shown) defined in the first and second bodies BD1 and BD2 in the rears of the first and second bodies BD1 and BD2.

Figure 19:
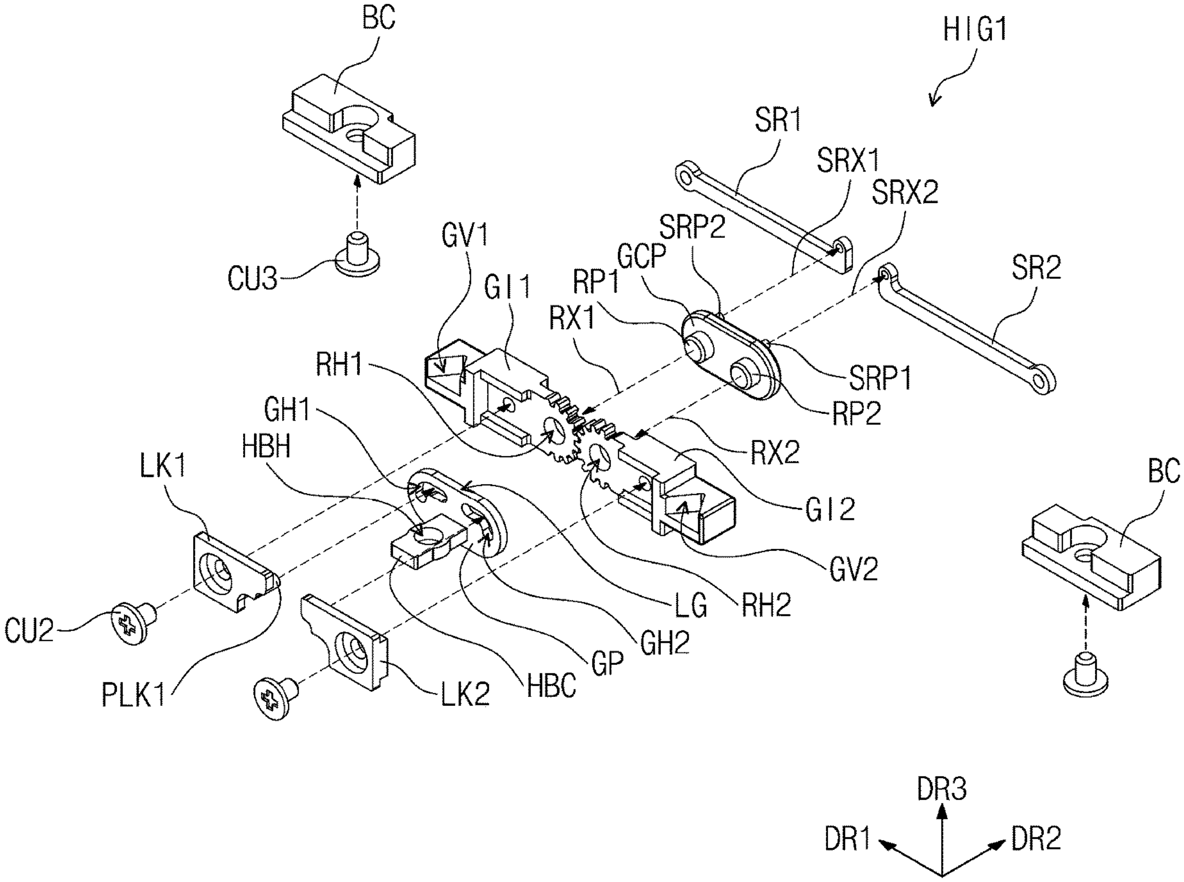
FIG. 19 is a schematic exploded perspective view of the first hinge illustrated in FIG. 16 when viewed from a front side.
Figure 20:
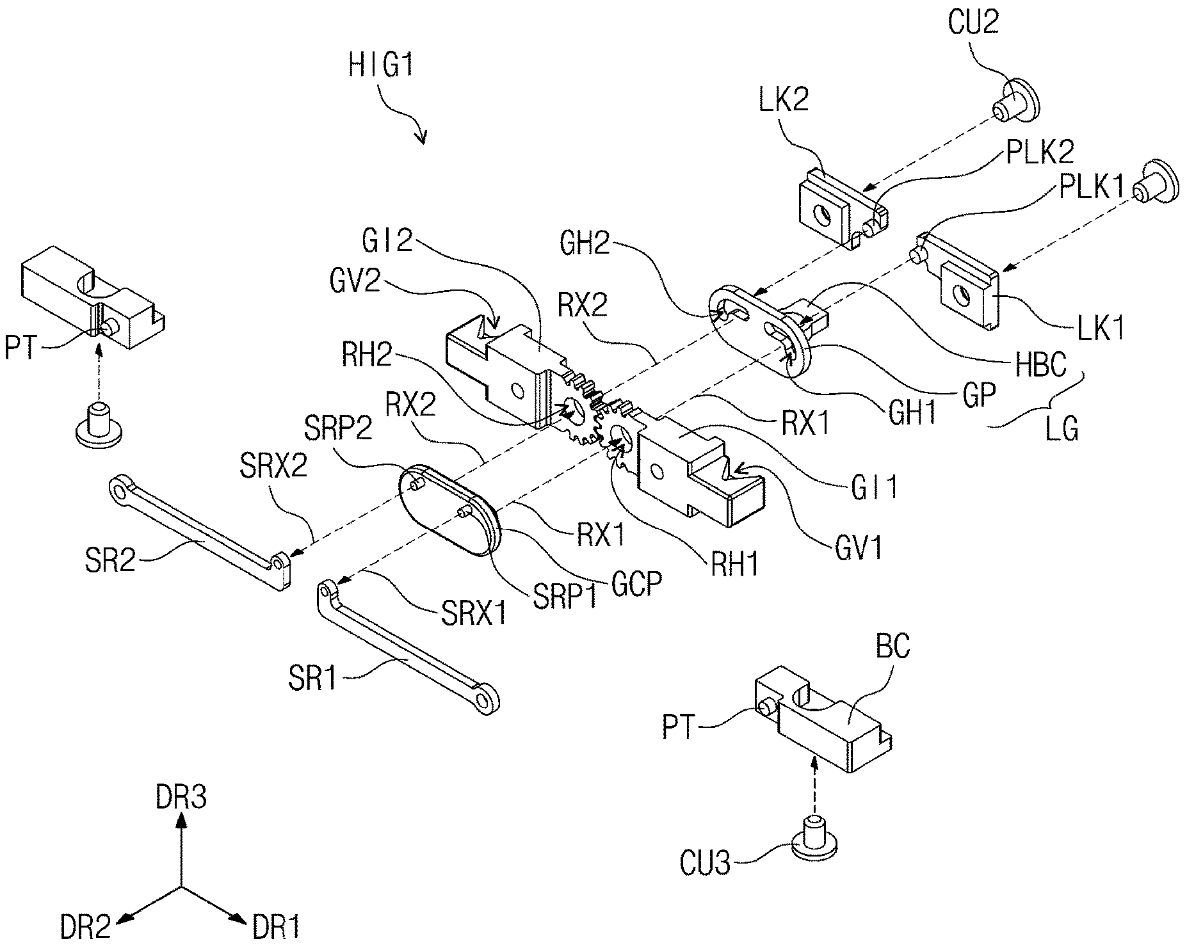
FIG. 20 is a schematic exploded perspective view of the first hinge illustrated in FIG. 16 when viewed from a rear side.
Figure 21:
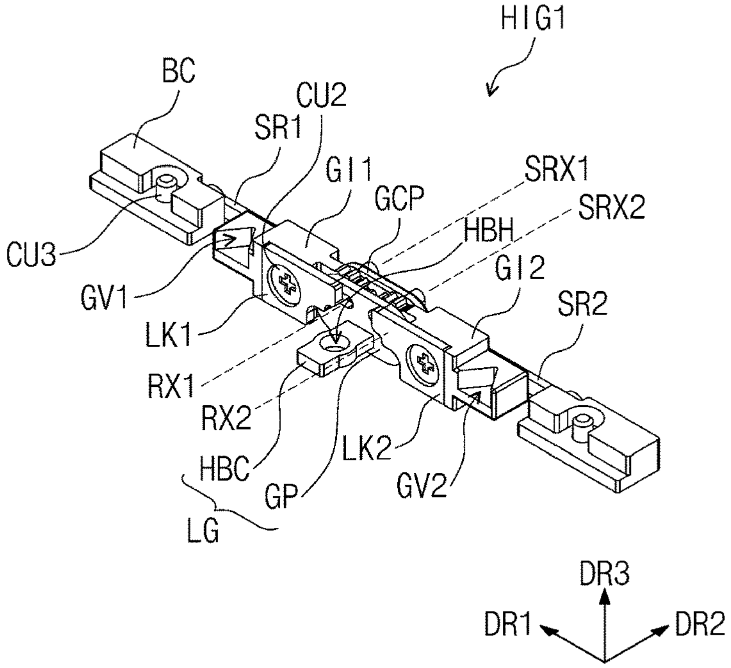
FIG. 21 is a schematic front perspective view of a first hinge to which components illustrated in FIG. 19 are coupled.
Figure 22:
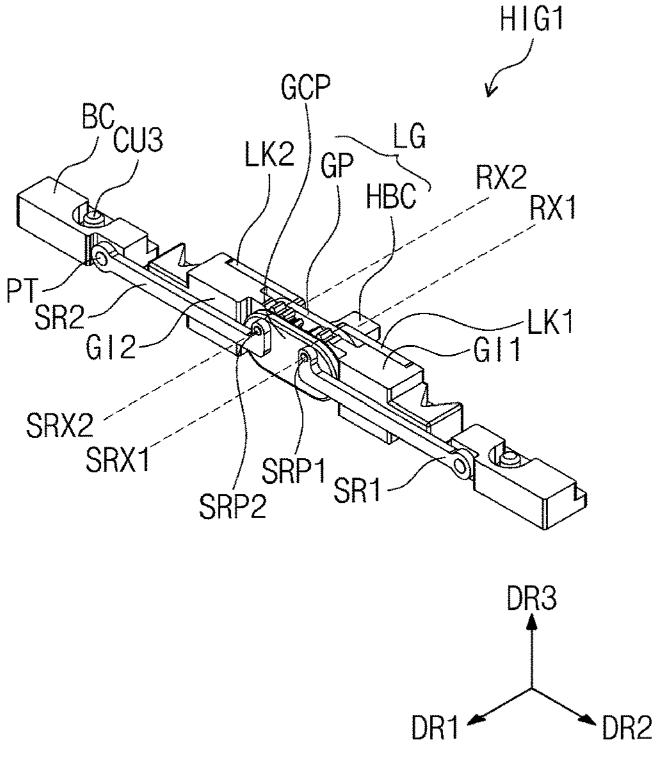
FIG. 22 is a schematic rear perspective view of a first hinge to which components illustrated in FIG. 20 are coupled.

FIG. 19 is a schematic exploded perspective view of the first hinge illustrated in FIG. 16 when viewed from a front side. FIG. 20 is a schematic exploded perspective view of the first hinge illustrated in FIG. 16 when viewed from a rear side. FIG. 21 is a schematic front perspective view of a first hinge to which components illustrated in FIG. 19 are coupled. FIG. 22 is a schematic rear perspective view of a first hinge to which components illustrated in FIG. 20 are coupled.

Referring to FIGS. 16 and 19 to 22, the hinge HIG may include the first hinge HIG1 and the second hinge HIG2 that are spaced apart from each other in the second direction DR2 and symmetrical to each other. As the first hinge HIG1 and the second hinge HIG2 have substantially a same configuration, the configuration of the first hinge HIG1 will be described with reference to FIGS. 19 to 22, and the description of the second hinge HIG2 will be omitted.

A front surface of the first hinge HIG1 may be defined as a side surface of the first hinge HIG1, which faces the second hinge HIG2. A rear surface of the first hinge HIG1 may be defined as a side surface of the first hinge HIG1, which is opposite to the front surface of the first hinge HIG1.

Two body connecting parts BC may be disposed to be adjacent to each of the first hinge HIG1 and the second hinge HIG2. Hereinafter, in the connecting parts BC, the configuration of the two body connecting parts BC adjacent to the first hinge HIG1 will be described.

The first hinge HIG1 may include first and second gears GI1 and GI2, a link guide LG including a guide part GP and a hinge bar coupling part HBC, first and second links LK1 and LK2, first and second protruding links PLK1 and PLK2, a gear connecting part GCP, first and second rotary axis protrusions RP1 and RP2, first and second sub-rotary axis protrusions SRP1 and SRP2, and first and second sub-rotating parts SR1 and SR2.

The coupling parts CU may include second coupling parts CU2 and third coupling parts CU3 illustrated in FIGS. 19 and 20.

The first gear GI1 and the second gear GI2 may extend in the first direction DR1 and be arranged in the first direction DR1. One side of the first gear GI1 and one side of the second gear GI2 may face each other in the first direction DR1. Each of the one side of the first gear GI1 and the one side of the second gear GI2 may include gear protrusions to have a gear shape. The gear protrusions, which are formed at the one side of the first gear GI1, and the gear protrusions, which are formed at the one side of the second gear G12, may be disposed to be engaged with each other.

A first rotary axis RX1 may be defined in a portion of the first gear GI1, which is adjacent to the one side of the first gear GI1. A second rotary axis RX2 may be defined in a portion of the second gear GI2, which is adjacent to the one side of the second gear G12. The first gear GI1 may rotate around the first rotary axis RX1. The second gear GI2 may rotate around the second rotary axis RX2.

In case that the first gear GI1 and the second gear GI2 rotate around the first and second rotary axes RX1 and RX2, respectively, the one side of the first gear GI1 and the one side of the second gear GI2 may be engaged with each other and rotate together around the first and second rotary axes RX1 and RX2, respectively.

Among two side surfaces of each of the first and second gears GI1 and G12, which are opposite to each other in the second direction DR2, one surface facing the second hinge HIG2 may be defined as an inner side surface of each of the first and second gears GI1 and GI2. Among the two side surfaces of each of the first and second gears GI1 and GI2, a surface opposite to the inner side surface of each of the first and second gears GI1 and GI2 may be defined as an outer side surface of each of the first and second gears GI1 and G12.

The other side (or another side) of the first gear GI1 may be opposite to the one side of the first gear GI1 in the first direction DR1. The other side (or another side) of the second gear GI2 may be opposite to the one side of the second gear GI2 in the first direction DR1. A first groove GV1 may be defined in the inner side surface of the first gear GI1, which is adjacent to the other side of the first gear GI1. A second groove GV2 may be defined in the inner side surface of the second gear GI2, which is adjacent to the other side of the second gear GI2.

The link guide LG may be disposed on the inner side surfaces of the first and second gears GI1 and GI2. The link guide LG may overlap the first and second rotary axes RX1 and RX2. The guide part GP may be disposed on the inner side surfaces of the first and second gears GI1 and GI2 and overlap the first and second rotary axes RX1 and RX2. The guide part GP may have a plane defined by the first and third directions DR1 and DR3.

The hinge bar coupling part HBC may be connected or coupled to a lower portion of the guide part GP and protrude toward the second hinge HIG2. The hinge bar coupling part HBC may have a plane defined by the first and second directions DR1 and DR2. The hinge bar coupling part HBC may be coupled to the hinge bar HGB illustrated in FIG. 16, and such a configuration will be described in detail below. A hinge bar coupling hole HBH may be defined in the hinge bar coupling part HBC. The hinge bar coupling hole HBH may pass through the hinge bar coupling part HBC in the third direction DR3.

The first link LK1 and the second link LK2 may be arranged in the first direction DR1. The first link LK1 and the second link LK2 may be symmetrical to each other in the first direction DR1. The hinge bar coupling part HBC may be disposed between the first link LK1 and the second link LK2.

The first link LK1 and the second link LK2 may be coupled to the link guide LG. For example, one side of the first link LK1 and one side of the second link LK2 may be coupled to the guide part GP in the second direction DR2. The one side of the first link LK1 and the one side of the second link LK2 may face each other in the first direction DR1.

The first protruding link PLK1 may protrude from the one side of the first link LK1 toward the guide part GP. The second protruding link PLK2 may protrude from the one side of the second link LK2 toward the guide part GP. The first and second protruding links PLK1 and PLK2 may be coupled to the guide part GP, and the first and second links LK1 and LK2 may be coupled to the guide part GP.

A first guide hole GH1 and a second guide hole GH2 may be defined in the guide part GP. The first guide hole GH1 may be defined to overlap the first link LK1 and the first gear GI1 when viewed in the second direction DR2. The first guide hole GH1 may have a curved trajectory corresponding to an arc of a circle defined to have a central point that is the first rotary axis RX1.

For example, the first guide hole GH1 may have the curved trajectory corresponding to about ¼ of the circle. The first guide hole GH1 may have the curved trajectory in a direction from, e.g., 12 o'clock to 9 o'clock when viewed in the second direction DR2. The first protruding link PLK1 may be disposed in the first guide hole GH1 and move along the first guide hole GH1.

The second guide hole GH2 may be defined to overlap the second link LK2 and the second gear GI2 when viewed in the second direction DR2. The second guide hole GH2 may have a curved trajectory corresponding to an arc of a circle defined to have a central point that is the second rotary axis RX2. The second guide hole GH2 may have a shape symmetrical to the first guide hole GH1 in the first direction DR1.

For example, the second guide hole GH2 may have the curved trajectory corresponding to about ¼ of the circle. The second guide hole GH2 may have the curved trajectory in a direction from, e.g., 12 o'clock to 3 o'clock when viewed in the second direction DR2. The second protruding link PLK2 may be disposed in the second guide hole GH2 and move along the second guide hole GH2.

The first link LK1 may overlap the first gear GI1, and the second link LK2 may overlap the second gear GI2 when viewed in the second direction DR2. The first link LK1 may not overlap the first groove GV1, and the second link LK2 may not overlap the second groove GV2 when viewed in the second direction DR2. A portion of the first link LK1 and a portion of the second link LK2 may each overlap the guide part GP when viewed in the second direction DR2.

The other side (or another side) of the first link LK1 may be opposite to the one side of the first link LK1 in the first direction DR1. The other side of the second link LK2 may be opposite to the one side of the second link LK2 in the first direction DR1.

The first link LK1 may be coupled to the first gear GI1. A portion of the first link LK1, which does not overlap the guide part GP and is adjacent to another side of the first link LK1, may be coupled to the first gear GI1 when viewed in the second direction DR2. For example, the first link LK1 may be coupled to the first gear GI1 through a second coupling part CU2 of the second coupling parts CU2.

The second link LK2 may be coupled to the second gear GI2. A portion of the second link LK2, which does not overlap the guide part GP and is adjacent to another side of the second link LK2, may be coupled to the second gear GI2 when viewed in the second direction DR2. For example, the second link LK2 may be coupled to the second gear GI2 through a second coupling part CU2 of the second coupling parts CU2.

The gear connecting part GCP may be disposed on the outer side surfaces of the first and second gears GI1 and GI2. The first rotary axis protrusion RP1 and the second rotary axis protrusion RP2 may protrude from the gear connecting part GCP toward the first and second gears GI1 and GI2, respectively. The first rotary axis protrusion RP1 and the second rotary axis protrusion RP2 may be arranged in the first direction DR1. The first rotary axis protrusion RP1 and the second rotary axis protrusion RP2 may have a cylindrical shape extending in the second direction DR2.

The first rotary axis protrusion RP1 may overlap the first rotary axis RX1, and the second rotary axis protrusion RP2 may overlap the second rotary axis RX2 when viewed in the second direction DR2. The first rotary axis protrusion RP1 may define the first rotary axis RX1, and the second rotary axis protrusion RP2 may define the second rotary axis RX2. The first rotary axis RX1 may be defined in a central portion of the first rotary axis protrusion RP1, and the second rotary axis protrusion RP2 may be defined in a central portion of the second rotary axis protrusion RP2 when viewed in the second direction DR2.

The first and second rotary axis protrusions RP1 and RP2 may be coupled to the first and second gears GI1 and GI2, respectively, and the gear connecting part GCP may be coupled to the first and second gears GI1 and GI2. A first rotation hole RH1 may be defined in a portion of the first gear GI1, which is adjacent to the side of the first gear GI1, and the first rotation hole RH1 may overlap the first rotary axis RX1. A second rotation hole RH2 may be defined in a portion of the second gear GI2, which is adjacent to the side of the second gear GI2, and the second rotation hole RH2 may overlap the second rotary axis RX2.

The first and second rotation holes RH1 and RH2 may pass through the first and second gears GI1 and GI2, respectively, in the second direction DR2. The first rotary axis protrusion RP1 may be inserted into the first rotation hole RH1, and the second rotary axis protrusion RP2 may be inserted into the second rotation hole RH2. The first and second rotary axis protrusions RP1 and RP2 may be inserted into the first and second rotation holes RH1 and RH2, respectively, and the gear connecting part GCP may be coupled to the first and second gears GI1 and GI2.

A side surface of the gear connecting part GCP, which faces the first and second gears GI1 and GI2, may be defined as an inner side surface, and an outer side surface of the gear connecting part GCP may be opposite to the inner side surface of the gear connecting part GCP. The first sub-rotary axis protrusion SRP1 and the second sub-rotary axis protrusion SRP2 may protrude from the outer side surface of the gear connecting part GCP. The first sub-rotary axis protrusion SRP1 and the second sub-rotary axis protrusion SRP2 may be arranged in the first direction DR1.

The first and second sub-rotary axis protrusions SRP1 and SRP2 may be disposed upward from the first and second rotary axis protrusions RP1 and RP2 (in the third direction DR3). The sub-rotary axis protrusion SRP1 may be adjacent to the first rotary axis protrusion RP1, and the second sub-rotary axis protrusion SRP2 may be adjacent to the second rotary axis protrusion RP2.

The first sub-rotating part SR1 and the second sub-rotating part SR2 may extend in the first direction DR1 and be arranged in the first direction DR1. The first sub-rotating part SR1 and the second sub-rotating part SR2 may be symmetrical to each other in the first direction DR1. One side of the first sub-rotating part SR1 and one side of the second sub-rotating part SR2 may face each other. The one side of the first sub-rotating part SR1 and the one side of the second sub-rotating part SR2 may protrude upward. For example, the first and second sub-rotating parts SR1 and SR2 may each have an “L” shape.

The one side of the first sub-rotating part SR1 may be rotatably coupled to the first sub-rotary axis protrusion SRP1. The first sub-rotating part SR1 may rotate around the first sub-rotary axis protrusion SRP1. For example, a first sub-rotary axis SRX1 extending in the second direction DR2 may be defined by the first sub-rotary axis protrusion SRP1, and the first sub-rotating part SR1 may rotate around the first sub-rotary axis SRX1.

The one side of the second sub-rotating part SR2 may be rotatably coupled to the second sub-rotary axis protrusion SRP2. The second sub-rotating part SR2 may rotate around the second sub-rotary axis protrusion SRP2. For example, a second sub-rotary axis SRX2 extending in the second direction DR2 may be defined by the second sub-rotary axis protrusion SRP2, and the second sub-rotating part SR2 may rotate around the second sub-rotary axis SRX2.

The first sub-rotating part SR1 and the second sub-rotating part SR2 may be coupled to the body connecting parts BC, respectively. The body connecting parts BC may extend outward from the first and second sub-rotating parts SR1 and SR2, respectively.

The other side (or another side) of first sub-rotating part SR1 and the other side of the second sub-rotating part SR2 may be rotatably coupled to protrusions PT, which protrude from the body connecting parts BC in the second direction DR2, respectively. The other side of the first sub-rotating part SR1 may be opposite to the one side of the first sub-rotating part SR1, and the other side of the second sub-rotating part SR2 may opposite to the one side of the second sub-rotating part SR2. Rotary axes (a reference symbol not shown) extending in the second direction DR2 may be defined by the protrusions PT, respectively.

The body connecting parts BC may be coupled to the first body BD1 and the second body BD2, respectively, which are described above. Such a configuration will be described in detail below. The body connecting parts BC may be used to couple the first sub-rotating part SR1 to the first body BD1 and couple the second sub-rotating part SR2 to the second body BD2.

The third coupling parts CU3 may be disposed below the body connecting parts BC, respectively. The third coupling parts CU3 may be inserted into the body connecting parts BC through holes (a reference symbol not shown) defined in the body connecting parts BC, respectively. The third coupling parts CU3 may be used to couple the body connecting parts BC to the first and second bodies BD1 and BD2, respectively, and such a configuration will be described in detail below.

Figure 23:
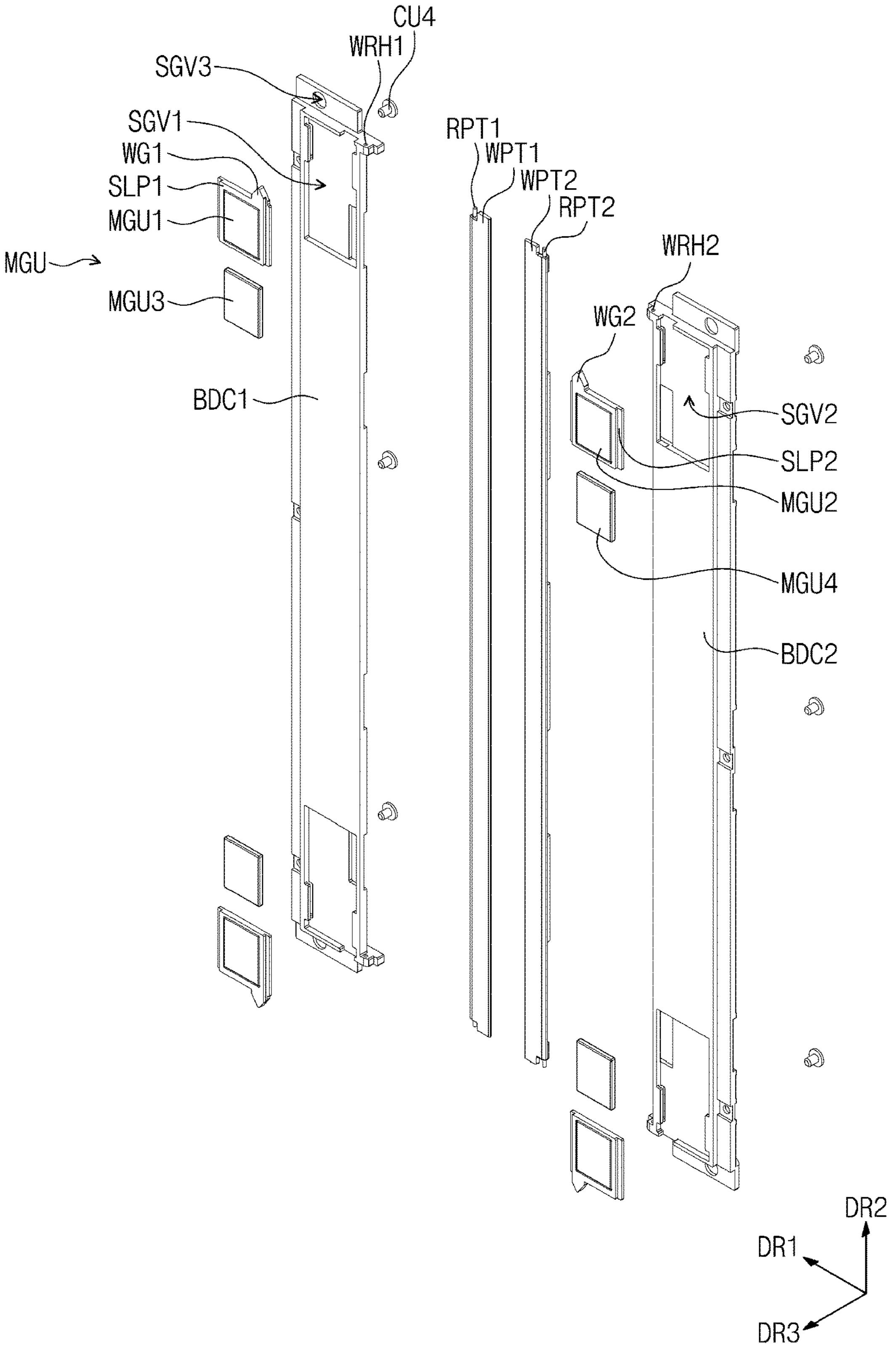
FIG. 23 is a schematic enlarged view illustrating the first and second body covers, the first and second wing plates, and the magnet units illustrated in FIG. 16.
Figure 24:
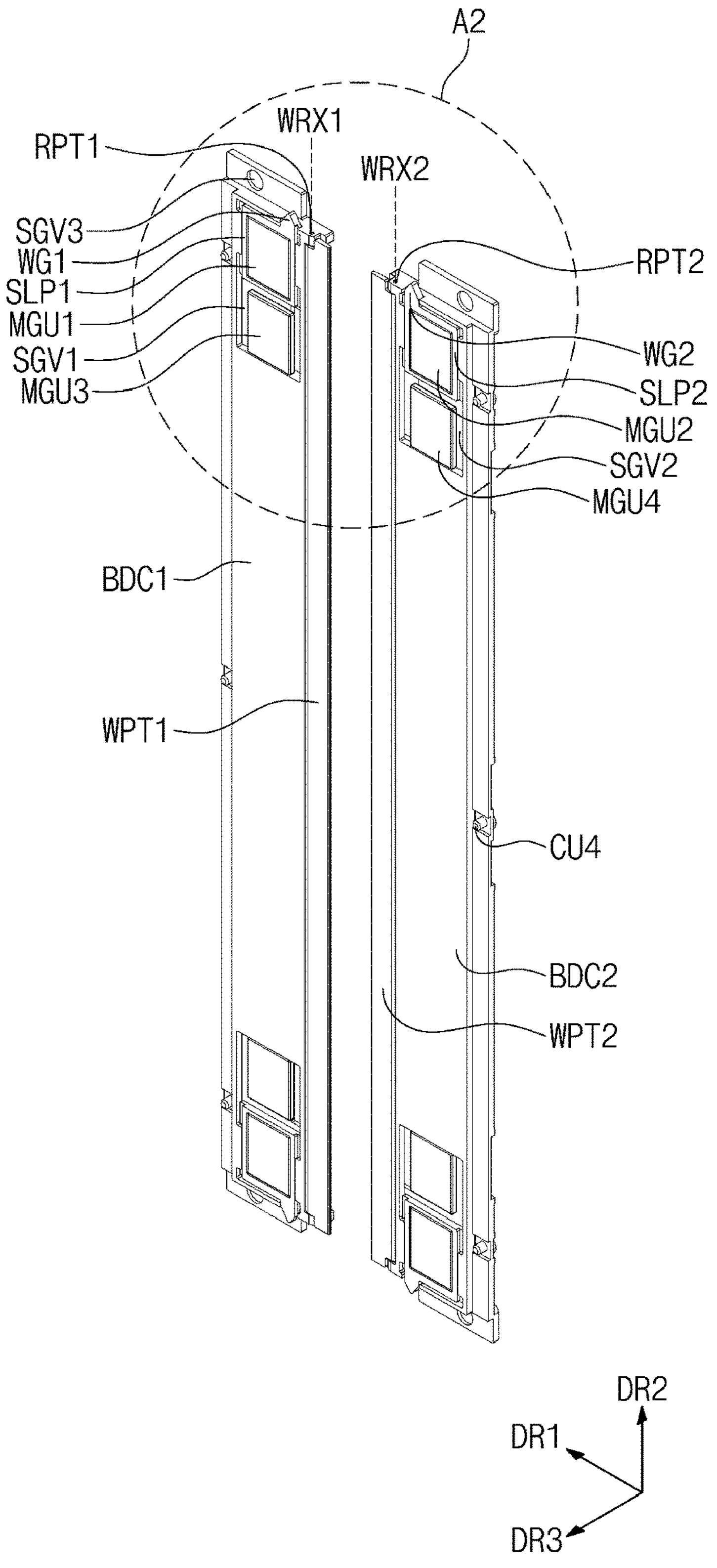
FIG. 24 is a schematic view illustrating a coupled state of the first and second body covers, the first and second wing plates, and the magnet units illustrated in FIG. 23.

FIG. 23 is a schematic enlarged view illustrating the first and second body covers, the first and second wing plates, and the magnet parts illustrated in FIG. 16. FIG. 24 is a schematic view illustrating a coupled state of the first and second body covers, the first and second wing plates, and the magnet parts illustrated in FIG. 23.

Referring to FIGS. 16, 23, and 24, the first body cover BDC1 and the second body cover BDC2 may be arranged in the first direction DR1 and extend in the second direction DR2. The first wing plate WPT1 and the second wing plate WPT2 may be arranged in the first direction DR1 and extend in the second direction DR2.

The first wing plate WPT1 and the second wing plate WPT2 may be disposed between the first body cover BDC1 and the second body cover BDC2. The first wing plate WPT1 and the second wing plate WPT2 may be coupled to the first body cover BDC1 and the second body cover BDC2, respectively.

The first wing plate WPT1 may be coupled to one side of the first body cover BDC1, which faces the second body cover BDC2. For example, first rotation protrusions RPT1 protruding in the second direction DR2 may be disposed at an upper end and a lower end, respectively, of one side of the first wing plate WPT1, which faces the first body cover BDC1. The first rotation protrusions RPT1 may be inserted into first wing rotation holes WRH1 defined at an upper end and a lower end, respectively, of the one side of in the first body cover BDC1. The first wing rotation holes WRH1 may extend in the second direction DR2.

The first wing plate WPT1 may rotate around a first wing rotary axis WRX1 overlapping the first rotation protrusions RPT1 and the first wing rotation holes WRH1 and extending in the second direction DR2. For example, the first wing plate WPT1 may be rotatably coupled to the one side of the first body cover BDC1.

The second wing plate WPT2 may be coupled to one side of the second body cover BDC2, which faces the first body cover BDC1. For example, second rotation protrusions RPT2 protruding in the second direction DR2 may be disposed at an upper end and a lower end, respectively, of one side of the second wing plate WPT2, which faces the second body cover BDC2. The second rotation protrusions RPT2 may be inserted into second wing rotation holes WRH2 defined at an upper end and a lower end, respectively, of the one side of in the second body cover BDC2. The second wing rotation holes WRH2 may extend in the second direction DR2.

The second wing plate WPT2 may rotate around a second wing rotary axis WRX2 overlapping the second rotation protrusions RPT2 and the second wing rotation holes WRH2 and extending in the second direction DR2. For example, the second wing plate WPT2 may be rotatably coupled to the one side of the second body cover BDC2.

First seating grooves SGV1 may be defined in a front surface of the first body cover BDC1, and second seating grooves SGV2 may be defined in a front surface of the second body cover BDC2. The first seating grooves SGV1 may be adjacent to both sides, respectively, of the first body cover BDC1, which are opposite to each other in the second direction DR2. The second seating grooves SGV2 may be adjacent to both sides, respectively, of the second body cover BDC2, which are opposite to each other in the second direction DR2.

The magnet parts MGU may include a pair of first magnet parts MGU1 spaced apart from each other in the second direction DR2, a pair of second magnet parts MGU2 spaced apart from each other in the second direction DR2, a pair of third magnet parts MGU3 spaced apart from each other in the second direction DR2, and a pair of fourth magnet parts MGU4 spaced apart from each other in the second direction DR2. The first, second, third, and fourth magnet parts MGU1, MGU2, MGU3, and MGU4 may be adjacent to both sides of the first body cover BDC1 or the second body cover BDC2, which are opposite to each other in the second direction DR2.

A pair of first sliding parts SLP1 may be spaced apart from each other in the second direction DR2, and a pair of second sliding parts SLP2 may be spaced apart from each other in the second direction DR2. The first sliding parts SLP1 and the second sliding parts SLP2 may be adjacent to the both sides of the first body cover BDC1 or the second body cover BDC2, which are opposite to each other in the second direction DR2.

The first, second, third, and fourth magnet parts MGU1, MGU2, MGU3, and MGU4 and the first and second sliding parts SLP1 and SLP2, which are adjacent to the one side of the first body cover BDC1 or the second body cover BDC2, and the first, second, third, and fourth magnet parts MGU1, MGU2, MGU3, and MGU4 and the first and second sliding parts SLP1 and SLP2, which are adjacent to the other side (or another side) of the first body cover BDC1 or the second body cover BDC2, may be symmetrical to each other and have a same configuration.

Thus, the following descriptions will be focused on the configurations of the first, second, third, and fourth magnet parts MGU1, MGU2, MGU3, and MGU4, the first and second sliding parts SLP1 and SLP2, and the first and second seating grooves SGV1 and SGV2, which are adjacent to the one side of the first body cover BDC1 or the second body cover BDC2.

The first sliding part SLP1 may be disposed on the first body cover BDC1. The first sliding part SLP1 may include a first wedge WG1 protruding in the second direction DR2. The first wedge WG1 may protrude toward one side of the first body cover BDC1 in the second direction DR2. The first magnet part MGU1 may be disposed on the first sliding part SLP1 and coupled to the first sliding part SLP1.

The second sliding part SLP2 may be disposed on the second body cover BDC2. The second sliding part SLP2 may include a second wedge WG2 protruding in the second direction DR2. The second wedge WG2 may protrude toward a side of the second body cover BDC2 in the second direction DR2. The second magnet part MGU2 may be disposed on the second sliding part SLP2 and coupled to the second sliding part SLP2.

The third magnet part MGU3 may be disposed on the first body cover BDC1 and be arranged with the first magnet part MGU1 in the second direction DR2. The third magnet part MGU3 may be arranged with the first sliding part SLP1 in the second direction DR2. The third magnet part MGU3 may be farther away from the one side of the first body cover BDC1 than the first magnet part MGU1 is in the second direction DR2.

The fourth magnet part MGU4 may be disposed on the second body cover BDC2 and arranged with the second magnet part MGU2 in the second direction DR2. The fourth magnet part MGU4 may be arranged with the second sliding part SLP2 in the second direction DR2. The fourth magnet part MGU4 may be farther away from the one side of the second body cover BDC2 than the second magnet part MGU2 is in the second direction DR2.

The first sliding part SLP1 and the first and third magnet parts MGU1 and MGU3 may be disposed in the first seating groove SGV1. The second sliding part SLP2 and the second and fourth magnet parts MGU2 and MGU4 may be disposed in the second seating groove SGV2.

Third seating grooves SGV3 may be defined in front surfaces of the first and second body covers BDC1 and BDC2, respectively. The third seating grooves SGV3 may be adjacent to the both sides, respectively, of the first body cover BDC1 or the second body cover BDC2, which are opposite to each other in the second direction DR2. The third seating grooves SGV3 may be disposed outward from the first and second seating grooves SGV1 and SGV2. The third coupling parts CU3 illustrated in FIG. 19 may be disposed third seating grooves SGV3, respectively.

The coupling parts CU may include fourth coupling parts CU4. The fourth coupling parts CU4 may be coupled to the other side of the first body cover BDC1, which is opposite to the one side of the first body cover BDC1 in the first direction DR1, and the other side of the second body cover BDC2, which is opposite to the one side of the second body cover BDC2 in the first direction DR1, respectively. For example, the fourth coupling parts CU4 may be inserted into holes (a reference symbol not shown) defined in the other side of the first body cover BDC1 and the other side of the second body cover BDC2, respectively.

Figure 25:
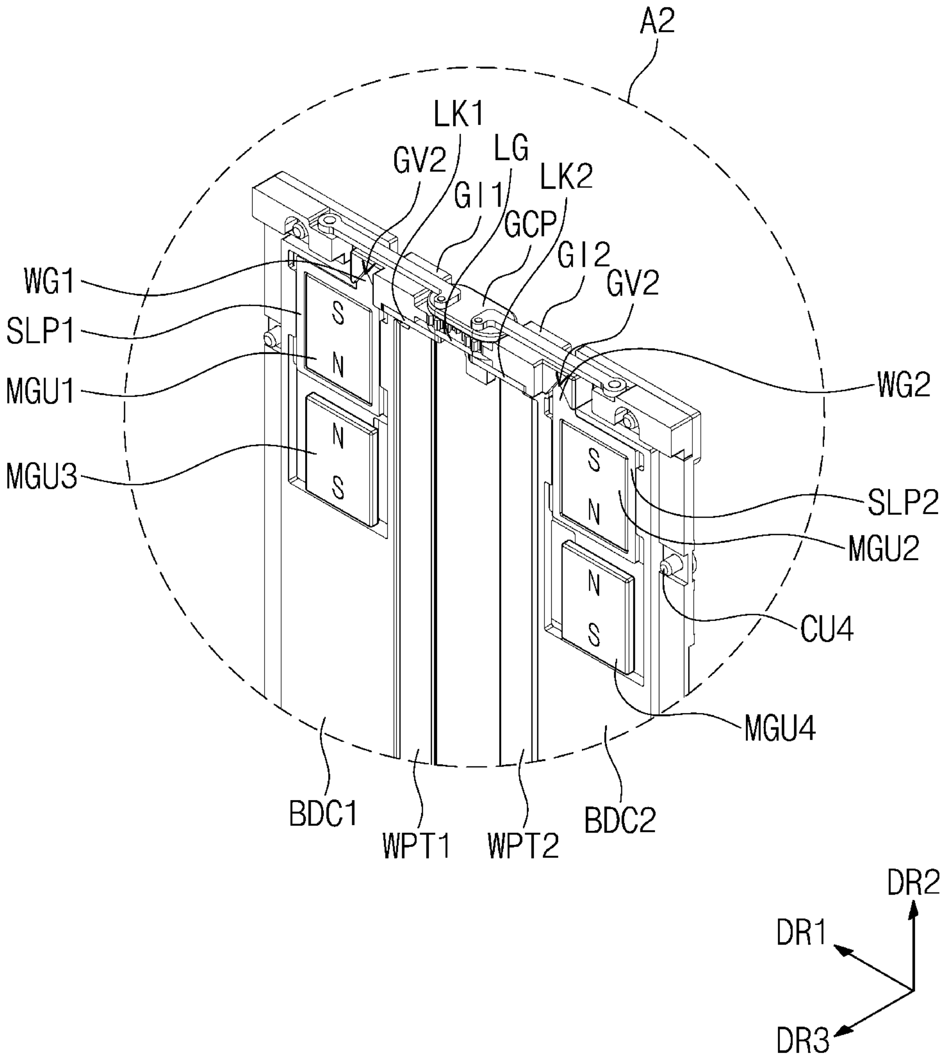
FIG. 25 is a schematic enlarged view illustrating second region A2 illustrated in FIG. 24, in a state in which the first hinge illustrated in FIG. 21 is disposed on first and second body covers.

FIG. 25 is a schematic enlarged view illustrating second region A2 illustrated in FIG. 24, in a state in which the first hinge illustrated in FIG. 21 is disposed on first and second body covers.

Referring to FIGS. 16, 21, 24, and 25, the third coupling parts CU3 may be disposed in the third seating grooves SGV3, respectively. Thus, the body connecting parts BC may be disposed on a portion of the first body cover BDC1, which is adjacent to the one side of the first body cover BDC1, and a portion of the second body cover BDC2, which is adjacent to the one side of the second body cover BDC2, respectively. The third coupling parts CU3 may have upper portions exposed from the body connecting parts BC, respectively, to the outside.

The first hinge HIG1 may be disposed between the first body cover BDC1 and the second body cover BDC2. The first wedge WG1 may be inserted into and disposed in the first groove GV1, and the second wedge WG2 may be inserted into and disposed in the second groove GV2.

The first magnet part MGU1 may be adjacent to the first gear GI1, and the third magnet part MGU3 may be farther away from the first gear GI1 than the first magnet part MGU1 is. The second magnet part MGU2 may be adjacent to the second gear G12, and the fourth magnet part MGU4 may be farther away from the second gear GI2 than the second magnet part MGU2 is.

The first and third magnet parts MGU1 and MGU3 may be disposed so that portions having a same polarity face each other. Thus, the first wedge WG1 may be inserted into and disposed in the first groove GV1 by a repulsive force between the first and third magnet parts MGU1 and MGU3.

The second and fourth magnet parts MGU2 and MGU4 may be disposed so that portions having a same polarity face each other. Thus, the second wedge WG2 may be inserted into and disposed in the second groove GV2 by a repulsive force between the second and fourth magnet parts MGU2 and MGU4.

During the folding and unfolding operations of the display device DD, the first and second body covers BDC1 and BDC2 may slide in the first direction DR1 with respect to the first and second gears GI1 and GI2, respectively. Thus, the first and second wedges WG1 and WG2 connected or coupled to the first and second body covers BDC1 and BDC2 may move in the first direction DR1 and move outside the first and second groove GV1 and GV2, respectively. Such a configuration will be described in detail below.

Figure 26:
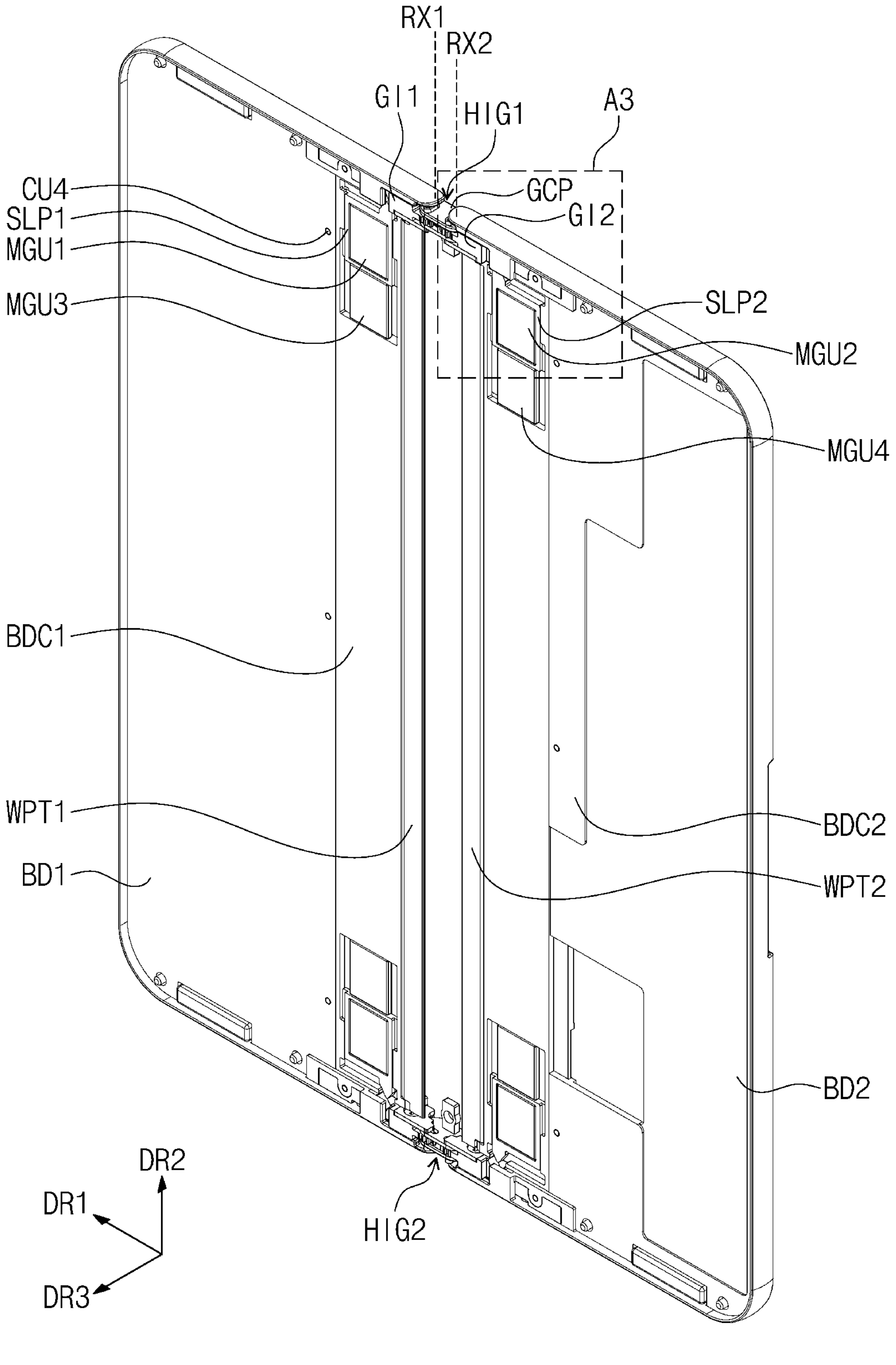
FIG. 26 is a schematic view illustrating first and second body covers and a hinge that are coupled to first and second bodies.
Figure 27:
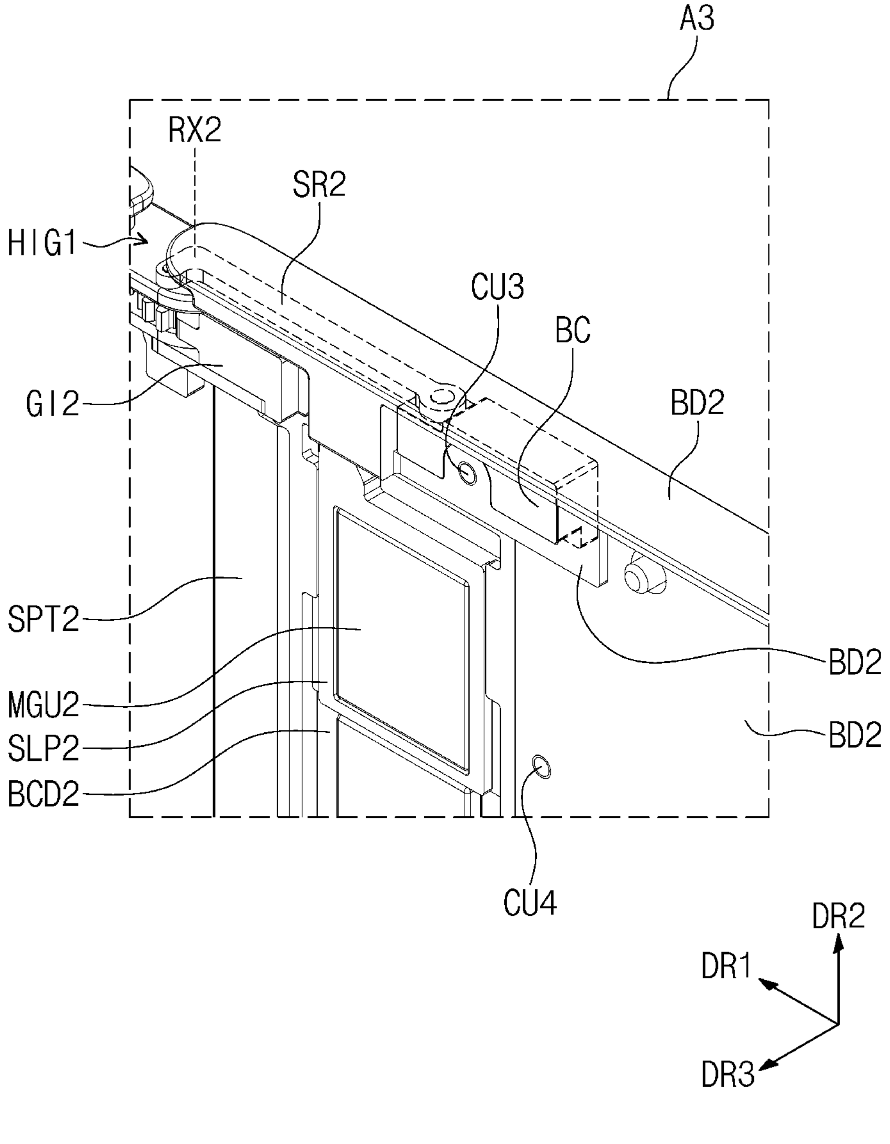
FIG. 27 is a schematic enlarged view of third region A3 illustrated in FIG. 26.

FIG. 26 is a schematic view illustrating first and second body covers and a hinge that are coupled to first and second bodies. FIG. 27 is a schematic enlarged view of third region A3 illustrated in FIG. 26.

FIG. 27 illustrates the second sub-rotating part SR2 and the body connecting part BC, which are not exposed to the outside, in dotted lines.

Referring to FIGS. 16, 24, 25, 26, and 27, the first and second body covers BDC1 and BDC2 and the first and second wing plates WPT1 and WPT2 may be disposed between the first body BD1 and the second body BD2. The first body cover BDC1 may be disposed between the first body BD1 and the first wing plate WPT1. The second body cover BDC2 may be disposed between the second body BD2 and the second wing plate WPT2.

The fourth coupling parts CU4 may couple the first body cover BDC1 to the first body BD1 and couple the second body cover BDC2 to the second body BD2. For example, the fourth coupling parts CU4 may couple the other side of the first body cover BDC1 to one side of the first body BD1, which faces the second body BD2. The fourth coupling parts CU4 may couple the other side of the second body cover BDC2 to a side of the second body BD2, which faces the first body BD1.

The fourth coupling parts CU4 may be inserted into holes (a reference symbol not shown) defined in the other side of the first body cover BDC1 and the one side of the first body BD1, respectively. The fourth coupling parts CU4 may be inserted into holes (a reference symbol not shown) defined in the other side of the second body cover BDC2 and the one side of the second body BD2, respectively.

The first hinge HIG1 and the second hinge HIG2 may be disposed between the first body BD1 and the second body BD2 and coupled to the first body BD1 and the second body BD2, respectively. For example, based on the first hinge HIG1, as illustrated in FIG. 27, the second body BD2 may be coupled to an upper portion of the third coupling part CU3, which is connected or coupled to the body connecting part BC and exposed to the outside of the body connecting part BC. As the third coupling part CU3 is inserted into a hole (a reference symbol not shown) defined in the second body BD2, the second body BD2 may be coupled to the body connecting part BC.

The body connecting part BC may couple the second sub-rotating part SR2 to the second body BD2. Although not illustrated, the body connecting part BC having a same configuration may couple the first sub-rotating part SR1 to the first body BD1.

The third coupling part CU3 may be inserted into the third seating groove SGV3 of the second body cover BDC2 and coupled to the body connecting part BC, and the second body BD2 may be coupled to the third coupling part CU3 and coupled to the body connecting part BC. According to such a configuration, the first hinge HIG1 may be coupled to the second body BD2. Similarly, the first hinge HIG1 may be coupled to the first body BD1, and the second hinge HIG2 may be coupled to the first and second bodies BD1 and BD2.

In case that the first and second gear GI1 and GI2 rotate around the first and second rotary axes RX1 and RX2, respectively, the first and second bodies BD1 and BD2 coupled to the first and second HIG1 and HIG2 may also rotate around the first and second rotary axes RX1 and RX2, respectively.

Figure 28:
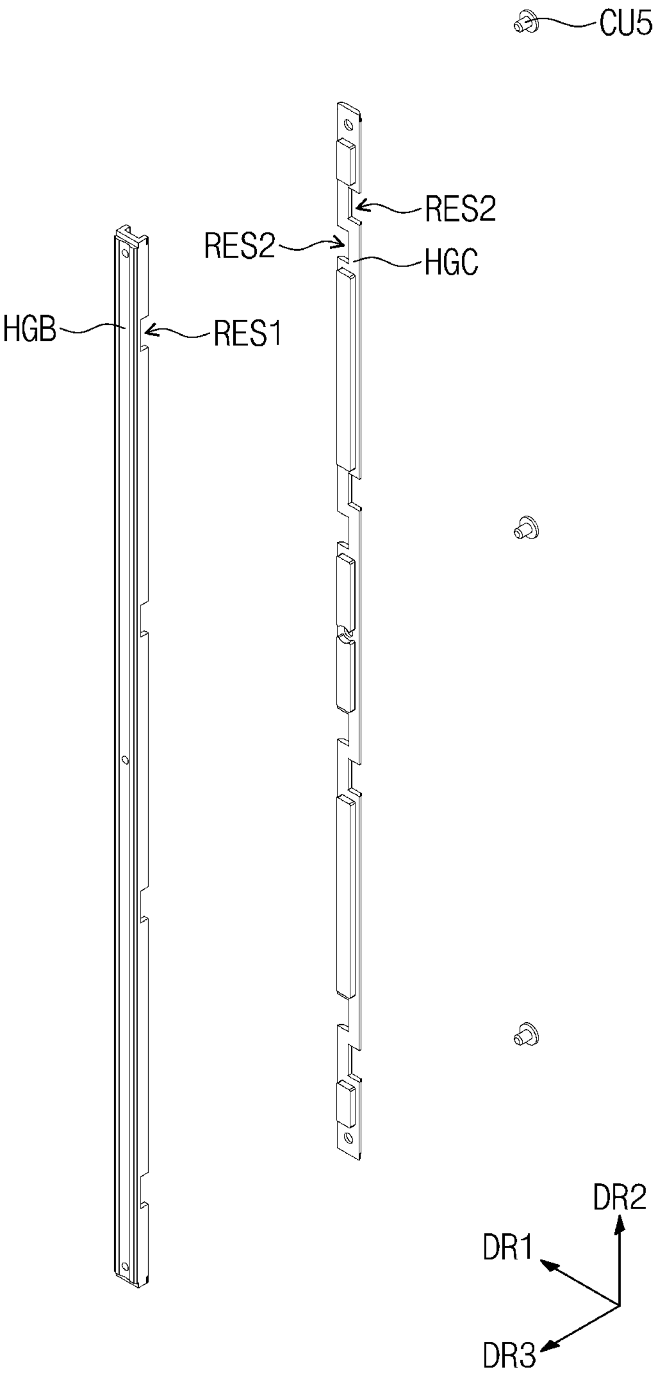
FIG. 28 is a schematic enlarged view of the hinge bar and the hinge cover illustrated in FIG. 16 when viewed from a front side.
Figure 29:
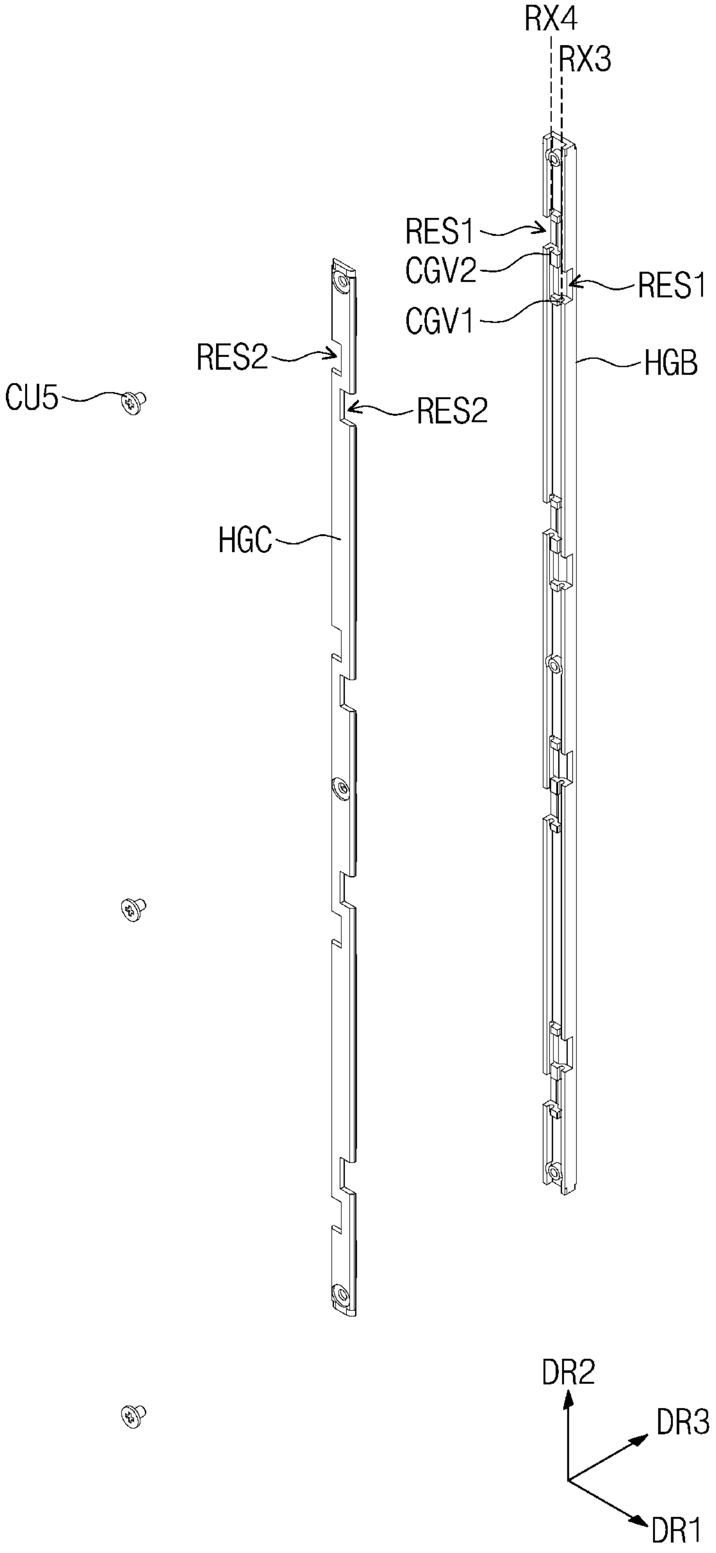
FIG. 29 is a schematic enlarged view of the hinge bar and the hinge cover illustrated in FIG. 16 when viewed from a rear side.
Figure 30:
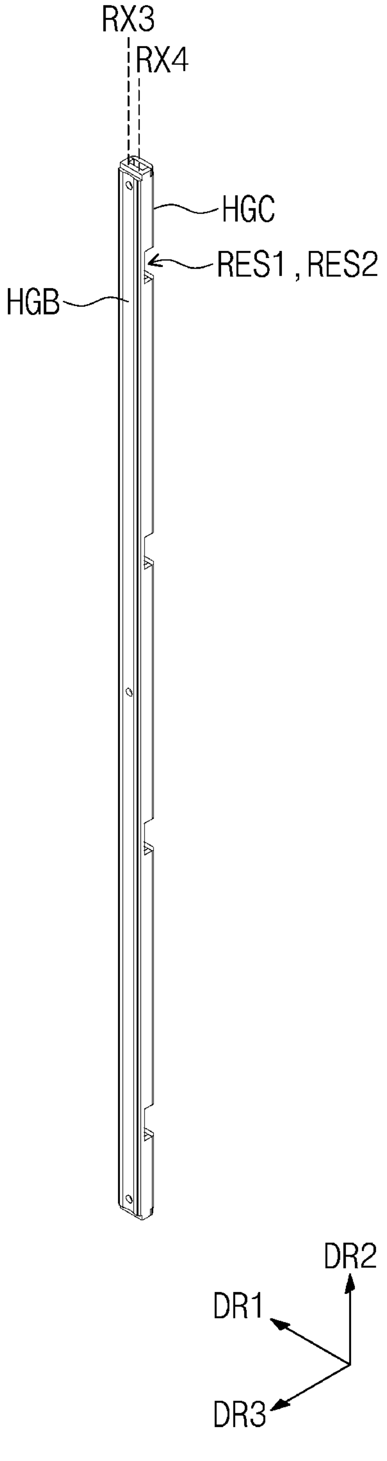
FIG. 30 is a schematic view illustrating a coupled state of the hinge bar and the hinge cover illustrated in FIG. 28 when viewed from a front side.
Figure 31:
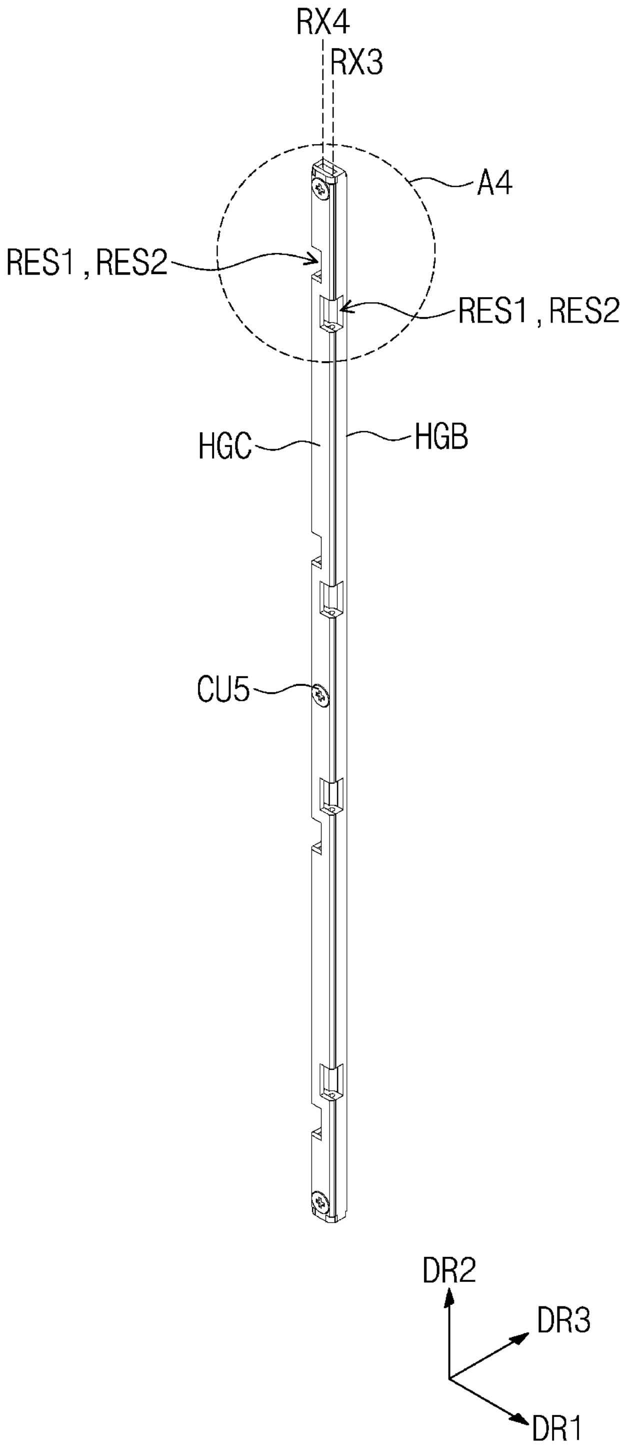
FIG. 31 is a schematic view illustrating a coupled state of the hinge bar and the hinge cover illustrated in FIG. 29 when viewed from a rear side.
Figure 32:
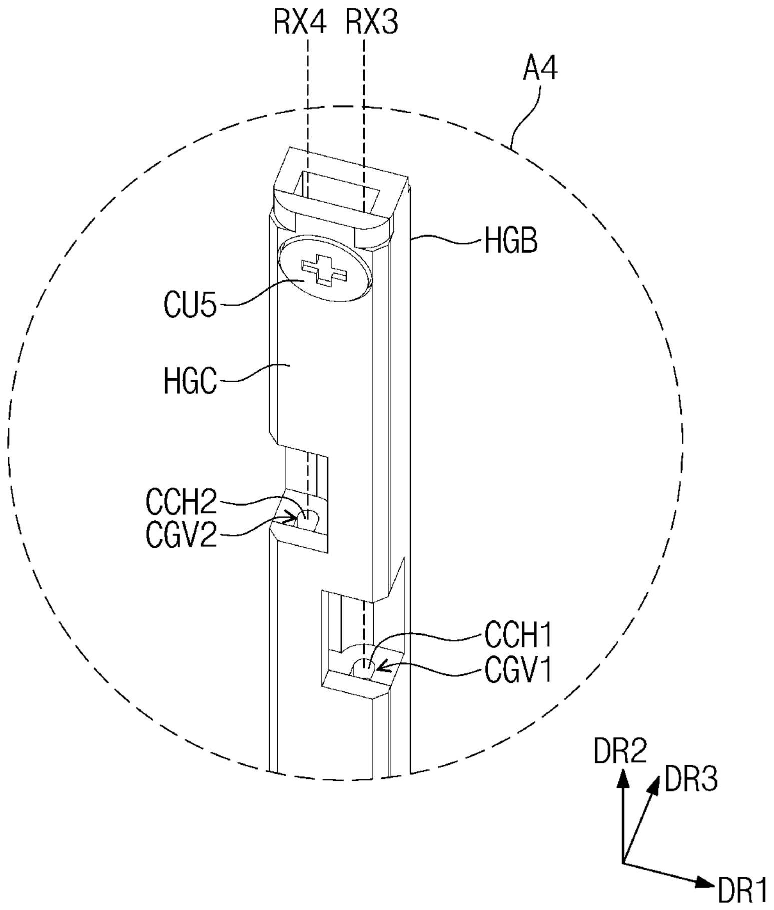
FIG. 32 is a schematic enlarged view of fourth region A4 illustrated in FIG. 31.

FIG. 28 is a schematic enlarged view of the hinge bar and the hinge cover illustrated in FIG. 16 when viewed from a front side. FIG. 29 is a schematic enlarged view of the hinge bar and the hinge cover illustrated in FIG. 16 when viewed from a rear side. FIG. 30 is a schematic view illustrating a coupled state of the hinge bar and the hinge cover illustrated in FIG. 28 when viewed from a front side. FIG. 31 is a schematic view illustrating a coupled state of the hinge bar and the hinge cover illustrated in FIG. 29 when viewed from a rear side. FIG. 32 is a schematic enlarged view of fourth region A4 illustrated in FIG. 31.

Referring to FIGS. 16 and 28 to 31, the hinge bar HGB and the hinge cover HGC may extend in the second direction DR2. The hinge cover HGC may be disposed below the hinge bar HGB in the third direction DR3. The hinge cover HGC may cover a rear surface of the hinge bar HGB.

The coupling parts CU may include fifth coupling parts CU5. The fifth coupling parts CU5 may be disposed below the hinge cover HGC. The fifth coupling parts CU5 may couple the hinge cover HGC to the hinge bar HGB. For example, the fifth coupling parts CU5 may be inserted into holes (a reference symbol not shown) defined in the hinge cover HGC and holes (a reference symbol not shown) defined in the hinge bar HGB, respectively.

The hinge bar HGB may have a lower portion in which first coupling grooves CGV1 arranged in the second direction DR2, and second coupling grooves CGV2, which are spaced apart from the first coupling grooves CGV1 in the first direction DR1 and arranged in the second direction DR, are defined. A third rotary axis RX3 extending in the second direction DR2 may be defined in the first coupling grooves CGV1, and a fourth rotary axis RX4 extending in the second direction DR2 may be defined in the second coupling grooves CGV2. Thus, the third and fourth rotary axes RX3 and RX4, which extend to be parallel to each other in the second direction DR2, may be defined in the hinge bar HGB.

First recessed portions RES1 may be defined in both sides, respectively, of the hinge bar HGB, which are opposite to each other in the first direction DR1. The first recessed portions RES1 may be misaligned at the both sides of the hinge bar HGB. The first and second coupling grooves CGV1 and CGV2 may be defined to be adjacent to the first recessed portions RES1, respectively.

Second recessed portions RES2 may be defined in both sides, respectively, of the hinge cover HGC, which are opposite to each other in the first direction DR1. The second recessed portions RES2 may be misaligned at the both sides of the hinge cover HGC. In case that the hinge cover HGC is coupled to the hinge bar HGB, the first coupling grooves CGV1 and the second coupling grooves CGV2 may overlap each other.

Referring to FIGS. 31 and 32, as the hinge cover HGC covers the rear surface of the hinge bar HGB, the first coupling grooves CGV1 and the second coupling grooves CGV2 may be closed by the hinge cover HGC in the third direction DR3. Thus, the first coupling grooves CGV1 and the second coupling grooves CGV2 may be defined as first coupling holes CCH1 and second coupling holes CCH2, respectively, by the hinge bar HGB and the hinge cover HGC coupled to each other. Thus, the third rotary axis RX3 may be defined by the first coupling holes CCH1, and the fourth rotary axis RX4 may be defined by the second coupling holes CCH2.

Figure 33:
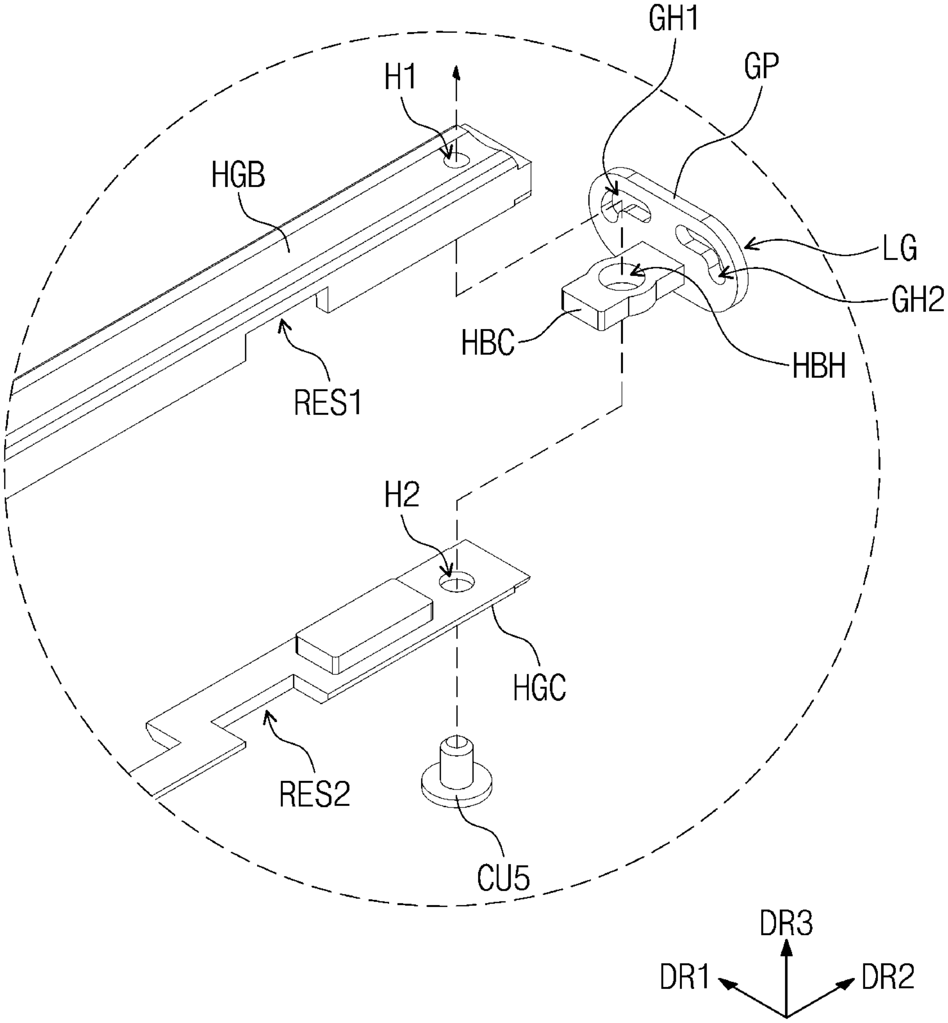
FIG. 33 is a schematic view for explaining coupling of the hinge bar and the hinge cover illustrated in FIG. 32 to the link guide illustrated in FIG. 19.

FIG. 33 is a schematic view for explaining coupling of the hinge bar and the hinge cover illustrated in FIG. 32 to the link guide illustrated in FIG. 19.

Referring to FIGS. 16, 19, 32, and 33, the hinge bar HGB and the hinge cover HGC may be coupled to the first hinge HIG1. For example, the hinge bar coupling part HBC may be disposed between the hinge bar HGB and the hinge cover HGC. First and second holes H1 and H2 that overlap the hinge bar coupling hole HBH may be defined in the hinge bar HGB and the hinge cover HGC, respectively. The first and second holes H1 and H2 may overlap one side of the hinge bar HGB and one side of the hinge cover HGC, respectively.

As the fifth coupling part CU5 is inserted into the first and second holes H1 and H2 and the hinge bar coupling hole HBH, the hinge bar HGB and the hinge cover HGC may be coupled to the hinge bar coupling part HBC. Thus, the hinge bar HGB and the hinge cover HGC may be coupled to the first hinge HIG1 through the fifth coupling part CU5. According to such a configuration, the hinge bar HGB and the hinge cover HGC may be disposed between the first hinge HIG1 and the second hinge HIG2 and be coupled to first hinge HIG1 and the second hinge HIG.

Figure 34:
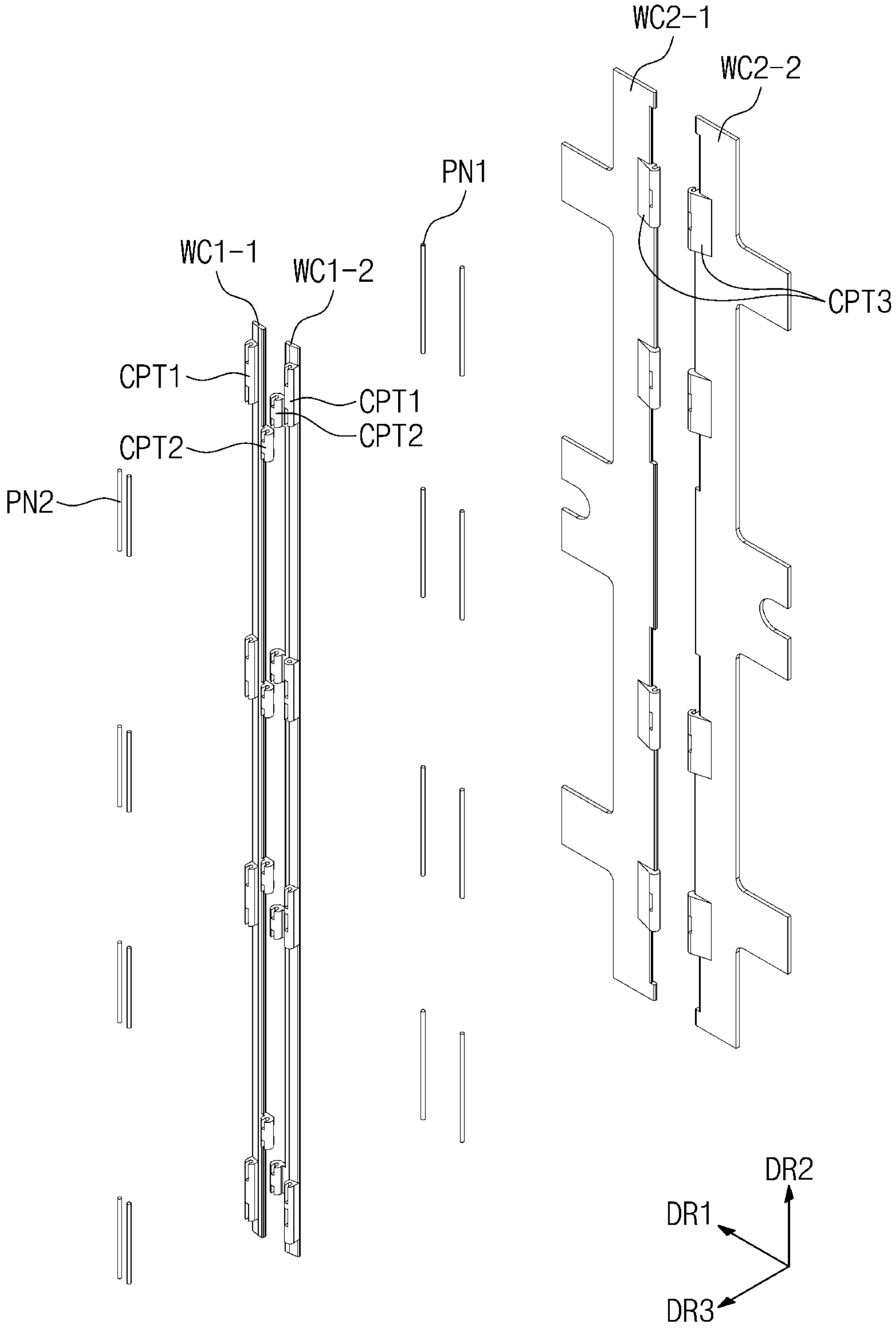
FIG. 34 is a schematic enlarged view of the first-1 and first-2 wing covers, the second-1 and second-2 wing covers, and the first and second connecting pins illustrated in FIG. 16.
Figure 35:
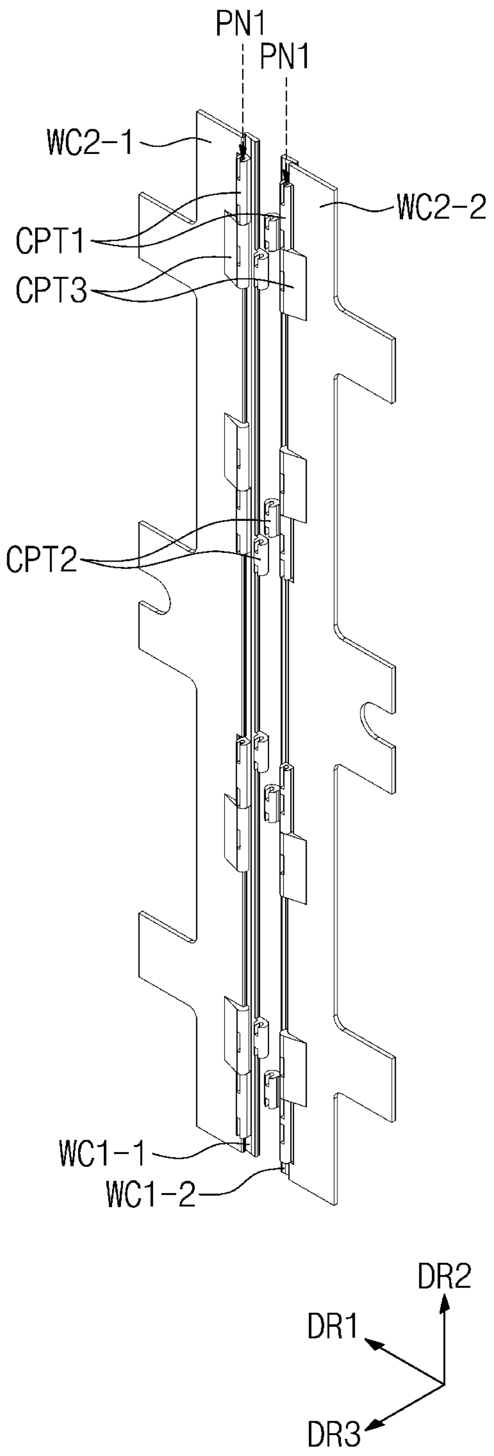
FIG. 35 is a schematic view illustrating a coupled state of the first-1 and first-2 wing covers and the second-1 and second-2 wing covers illustrated in FIG. 34.

FIG. 34 is a schematic enlarged view of the first-1 and first-2 wing covers, the second-1 and second-2 wing covers, and the first and second connecting pins illustrated in FIG. 16. FIG. 35 is a schematic view illustrating a coupled state of the first-1 and first-2 wing covers and the second-1 and second-2 wing covers illustrated in FIG. 34.

Referring to FIGS. 16, 34, and 35, the first-1 wing cover WC1-1 and the first-2 wing cover WC1-2 may be arranged in the first direction DR1 and extend in the second direction DR2. The second-1 wing cover WC2-1 and the second-2 wing cover WC2-2 may be arranged in the first direction DR1 and extend in the second direction DR2. The first and second connecting pins PN1 and PN2 may extend in the second direction DR2.

The first-1 and first-2 wing covers WC1-1 and WC1-2 may be disposed between the second-1 wing cover WC2-1 and the second-2 wing cover WC2-2. The first-1 and first-2 wing covers WC1-1 and WC1-2 may be coupled to the second-1 and second-2 wing covers WC2-1 and WC2-2, respectively.

The folding set FST may include first, second and third connecting protrusions CPT1, CPT2 and CPT3. The first connecting protrusions CPT1 may protrude from a front surface of the first-1 wing cover WC1-1 and a front surface of the first-2 wing cover WC1-2, respectively, in the third direction DR3 and extend in the second direction DR2. First holes (a reference symbol not shown, and a reference symbol shown in FIG. 37) extending in the second direction DR2 may be defined in the first connecting protrusions CPT1, respectively.

The second connecting protrusions CPT2 may protrude from one side of the first-1 wing cover WC1-1 and one side of the first-2 wing cover WC1-2, respectively, which face each other, and may extend in the second direction DR2. Second holes (a reference symbol not shown, and a reference symbol shown in FIG. 37) extending in the second direction DR2 may be defined in the second connecting protrusions CPT2, respectively.

The third connecting protrusions CPT3 may protrude from one side of the second-1 wing cover WC2-1 and one side of the second-2 wing cover WC2-2, respectively, which face each other, and may extend in the second direction DR2. Third holes (a reference symbol not shown, and a reference symbol shown in FIG. 37) extending in the second direction DR2 may be defined in the third connecting protrusions CPT3, respectively.

The third connecting protrusions CPT3 may be disposed on the front surfaces of the first-1 and first-2 wing covers WC1-1 and WC1-2 and may overlap the first connecting protrusions CPT1 in the second direction CPT1, respectively. The first connecting pins PN1 may be inserted into and coupled to the first connecting protrusions CPT1 and the third connecting protrusions CPT3, respectively, in the second direction DR2 so that the first connecting protrusions CPT1 and the third connecting protrusions CPT3 rotate with respect to each other.

The first connecting pins PN1 may be inserted into the first and second holes defined in the first and third connecting protrusions CPT1 and CPT3, respectively. The second-1 and second-2 wing covers WC2-1 and WC2-2 may be rotatably coupled to the first-1 and first-2 wing covers WC1-1 and WC1-2 through the first connecting pins PN1.

Figure 36:
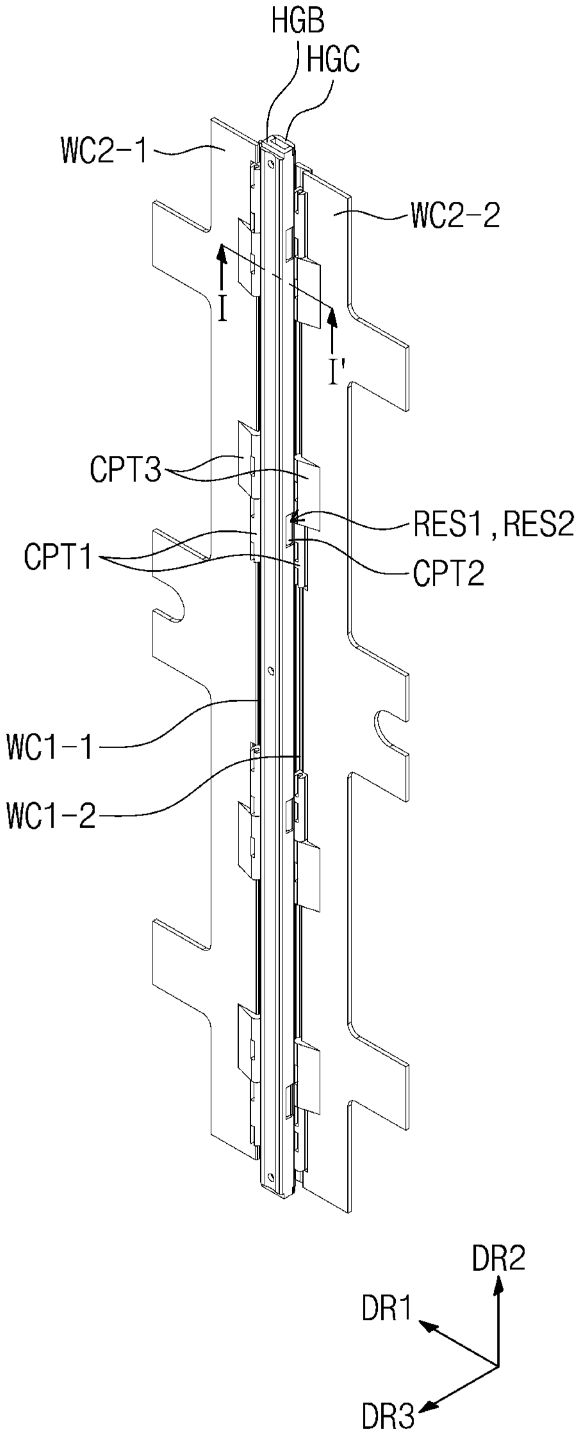
FIG. 36 is a schematic view illustrating a hinge bar and a hinge cover coupled to the first-1 and first-2 wing covers illustrated in FIG. 35.
Figure 37:
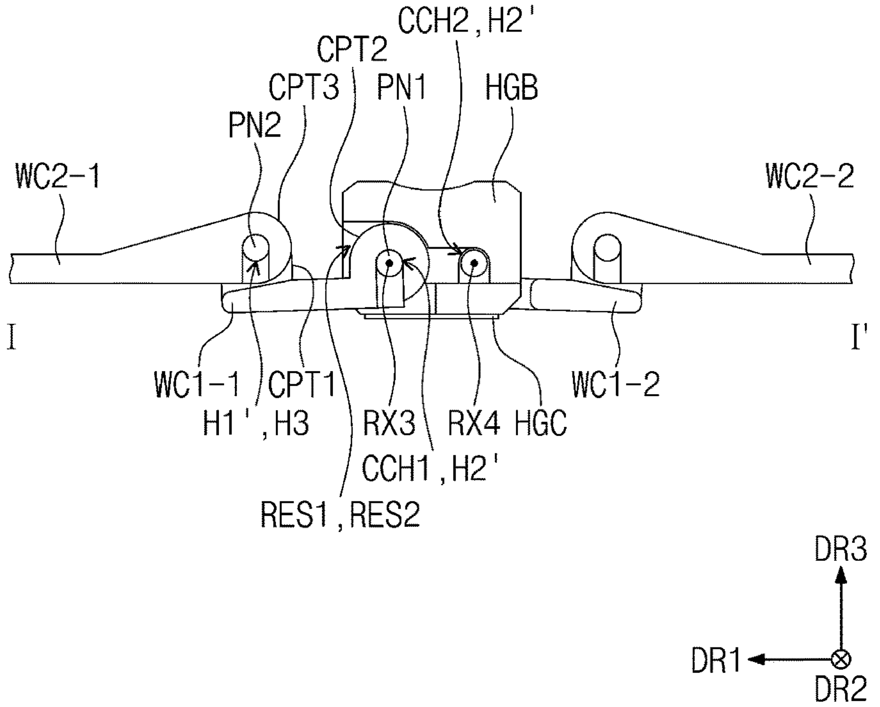
FIG. 37 is a schematic cross-sectional view taken along line I-I' illustrated in FIG. 36.

FIG. 36 is a schematic view illustrating a hinge bar and a hinge cover coupled to the first-1 and first-2 wing covers illustrated in FIG. 35. FIG. 37 is a schematic cross-sectional view taken along line I-I' illustrated in FIG. 36.

Referring to FIGS. 30, 35, 36, and 37, second connecting protrusions CPT2 may be inserted into first and second recessed portions RES1 and RES2, which are defined in the hinge bar HGB and the hinge cover HGC, respectively. The second connecting protrusions CPT2 may be coupled to the hinge bar HGB and the hinge cover HGC, and the first-1 and first-2 wing covers WC1-1 and WC1-2 may be coupled to the hinge bar HGB and the hinge cover HGC.

The first coupling holes CCH1 and the second coupling holes CCH2, which are defined by the hinge bar HGB and the hinge cover HGC, may be disposed to overlap the second holes H2' defined in the second connecting protrusions CPT2 in the second direction DR2. The second connecting pins PN1 may be inserted into the first and second coupling holes CCH1 and CCH2 and the second holes H2', respectively, and the second connecting protrusions CPT2 may be rotatably coupled to the hinge bar HGB and the hinge cover HGC.

Thus, the first-1 and first-2 wing covers WC1-1 and WC1-2 may be rotatably coupled to the hinge bar HGB and the hinge cover HGC. The third and fourth rotary axes RX3 and RX4 may be defined by the second connecting pins PN2.

As described above, the first connecting pins PN1 may be inserted into the first and third holes H1' and H3 defined in the first connecting protrusions CPT1 and the third connecting protrusions CPT3, respectively. The second-1 and second-2 wing covers WC2-1 and WC2-2 may rotate around the first connecting pins PN1.

Figure 38:
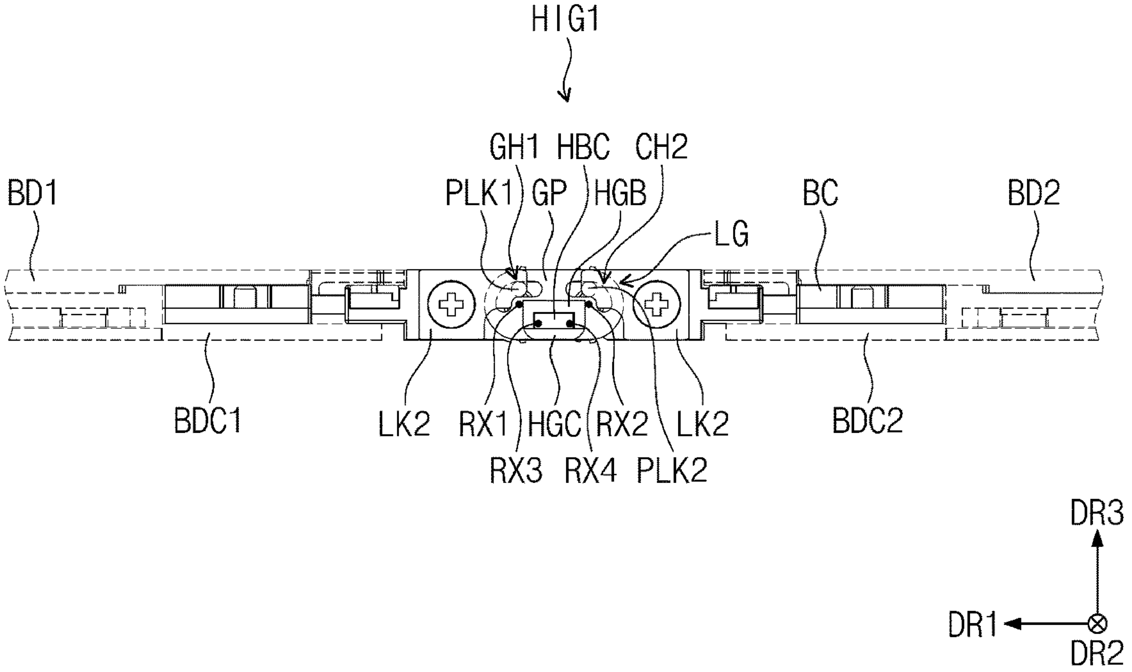
FIG. 38 is a schematic side view of a first hinge with respect to a front side of the first hinge illustrated in FIG. 21.
Figure 39:
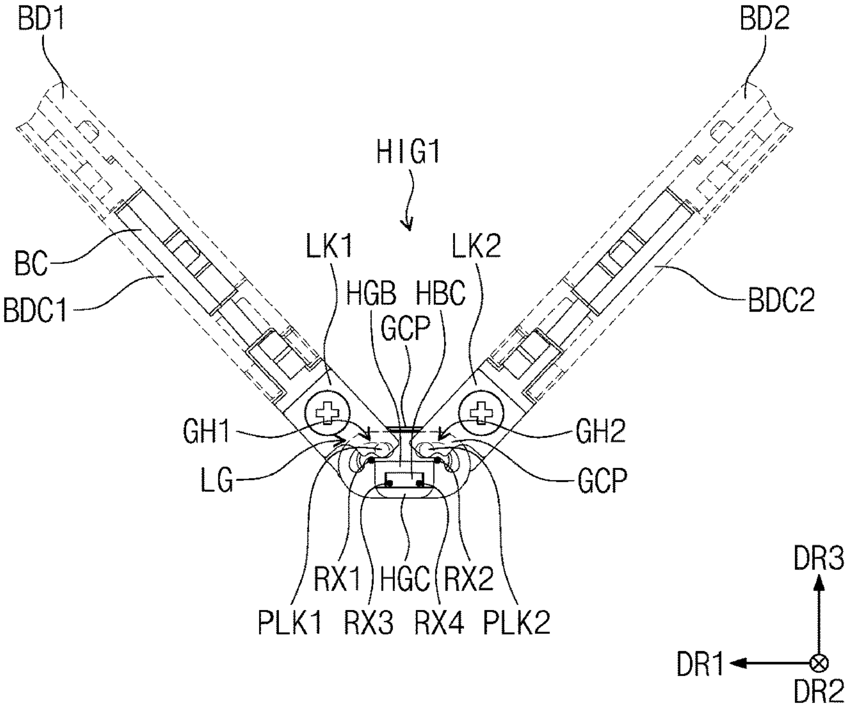
FIG. 39 is a schematic view illustrating an in-folded state in which the first and second bodies illustrated in FIG. 38 rotate about 45 degrees around first and second rotary axes, respectively.
Figure 40:
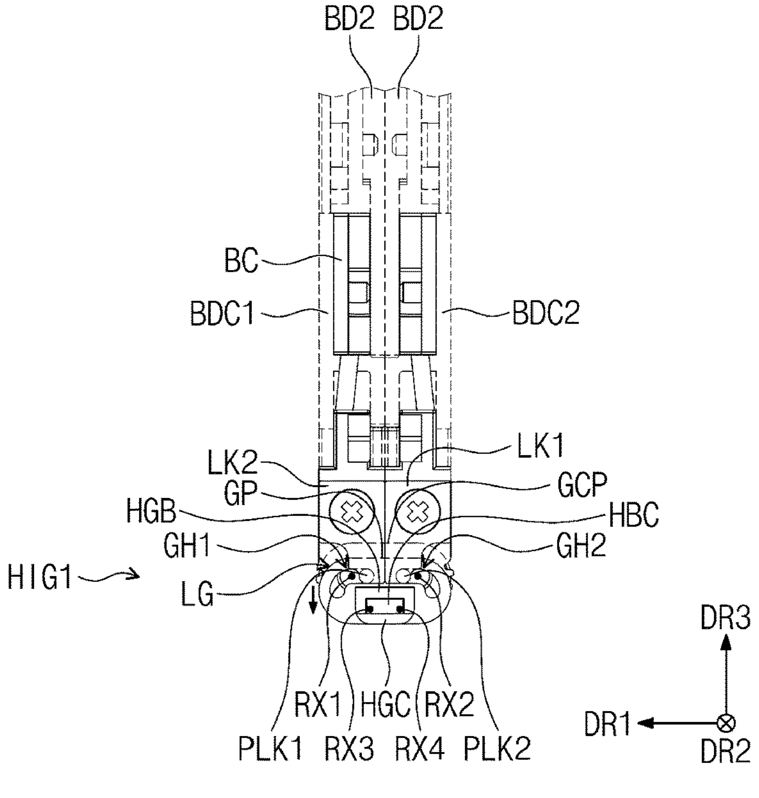
FIG. 40 is a schematic view illustrating an in-folded state in which the first and second bodies illustrated in FIG. 38 rotate about 90 degrees around first and second rotary axes, respectively.
Figure 41:
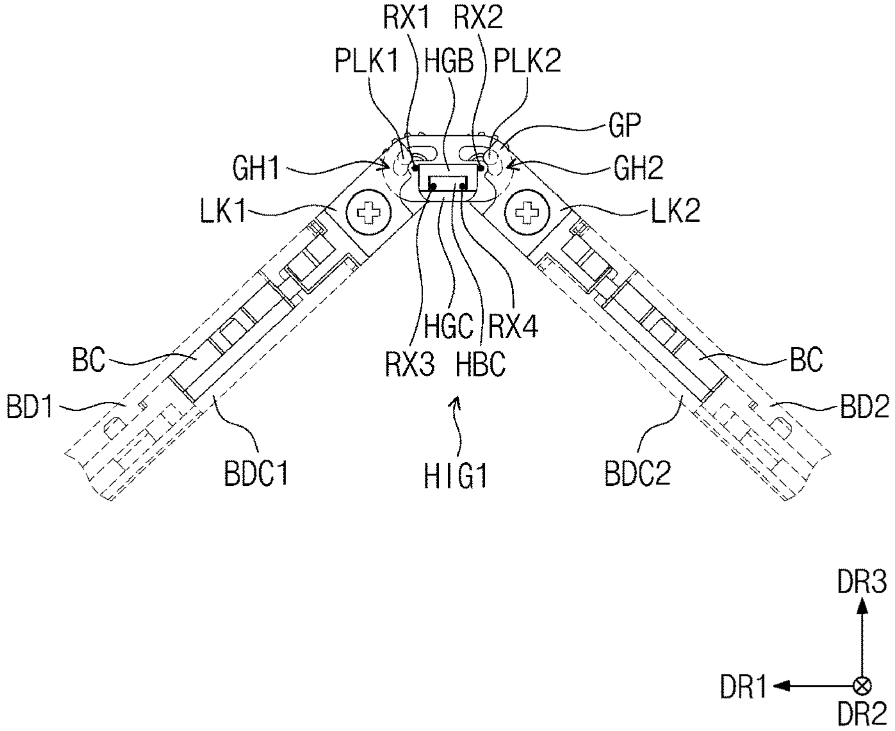
FIG. 41 is a view illustrating an out-folded state in which the first and second bodies illustrated in FIG. 38 rotate about 45 degrees around first and second rotary axes, respectively.
Figure 42:
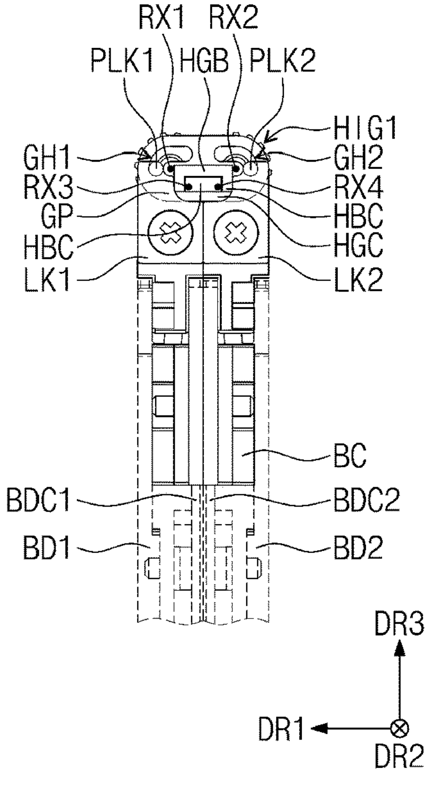
FIG. 42 is a schematic view illustrating an out-folded state in which the first and second bodies illustrated in FIG. 38 rotate about 90 degrees around first and second rotary axes, respectively.

FIG. 38 is a schematic side view of a first hinge with respect to a front side of the first hinge illustrated in FIG. 21. FIG. 39 is a schematic view illustrating an in-folded state in which the first and second bodies illustrated in FIG. 38 rotate 45 degrees around first and second rotary axes, respectively. FIG. 40 is a schematic view illustrating an in-folded state in which the first and second bodies illustrated in FIG. 38 rotate 90 degrees around first and second rotary axes, respectively. FIG. 41 is a schematic view illustrating an out-folded state in which the first and second bodies illustrated in FIG. 38 rotate 45 degrees around first and second rotary axes, respectively. FIG. 42 is a schematic view illustrating an out-folded state in which the first and second bodies illustrated in FIG. 38 rotate 90 degrees around first and second rotary axes, respectively.

FIGS. 38 to 42 illustrate portions of the first and second bodies BD1 and BD2 coupled to the first hinge HIG1, and portions of the first and second body covers BDC1 and BDC2 together with the first hinge HIG1, and illustrate the hinge bar HGB and the hinge cover HGC coupled to the first hinge HIG1 together with the hinge bar coupling part HBC.

FIGS. 38 to 42 illustrate the first and second bodies BD1 and BD2 and the first and second body covers BDC1 and BDC2, which are coupled to the first hinge HIG1, in dotted lines. FIGS. 38 to 42 also illustrate the guide part GP covered by the first and second links LK1 and LK2, the first and second guide holes GH1 and GH2, and the first and second protruding links PLK1 and PLK2 in dotted lines.

Referring to FIG. 38, the first and second bodies BD1 and BD2 coupled to the first hinge HIG1 may be arranged with the first hinge HIG1 in the first direction DR1. A state in which the first body BD1 and the second body BD2 are arranged in the first direction DR1 may be defined as an unfolded state.

Referring to FIGS. 39 and 40, the first body BD1 and the second body BD2 may rotate around the first and second rotary axes RX1 and RX2, respectively, so that a front surface of the first body BD1 and a front surface of the second body BD2 face each other. Such a state of the first body BD1 and the second body BD2 may be defined as an in-folded state.

The first link LK1 and the second link LK2 may rotate around the first and second rotary axes RX1 and RX2, respectively. The first protruding link PLK1 and the second protruding link PLK2 may move along the first guide hole GH1 and the second guide hole GH2, respectively.

The position of the link guide LG may be changed between the unfolded state and in-folded state by the first link LK1 and the second link LK2. For example, during the in-folding operation, the first protruding link PLK1 and the second protruding link PLK2 may push the guide part GP downward. Thus, the link guide LG may move further downward in the in-folded state than in the unfolded state. In the in-folded state, a top surface of the guide part GP may be disposed below a top surface of the gear connecting part GCP.

The first protruding link PLK1 and the second protruding link PLK2 may move the guide part GP so that the guide part GP is farther away from the first and second rotary axes RX1 and RX2 in the third direction DR3 in the in-folded state than in the unfolded state. Thus, the first link LK1 and the second link LK2 may move the position of the link guide LG so that the link guide LG is farther away from the first and second rotary axes RX1 and RX2 in the third direction DR3 in the in-folded state than in the unfolded state.

In the unfolded state and the in-folded state, the hinge bar HGB and the hinge cover HGC, which are coupled to the hinge bar coupling part HBC, may also move together with the link guide LG. Thus, the position of each of the hinge bar HGB and the hinge cover HGC may be changed between the unfolded state and the in-folded state.

Thus, a distance between each of the first and second rotary axes RX1 and RX2 and the hinge bar HGB may change between the unfolded and in-folded states. For example, the distance between each of the first and second rotary axes RX1 and RX2 and the hinge bar HGB may be greater in the in-folded state than in the unfolded state. The hinge bar HGB and the hinge cover HGC may be farther away from the first and second rotary axes RX1 and RX2 in the third direction DR in the in-folded state than in the unfolded state.

The third and fourth rotary axes RX3 and RX4 defined in the hinge bar HGB may be spaced apart from the first and second rotary axes RX1 and RX2. The third and fourth rotary axes RX3 and RX4 may be disposed downward from the first and second rotary axes RX1 and RX2.

Distances between the first and second rotary axes RX1 and RX2 and the third and fourth rotary axes RX3 and RX4, respectively, may change between the unfolded state and the in-folded state. For example, the distances between the first and second rotary axes RX1 and RX2 and the third and fourth rotary axes RX3 and RX4, respectively, may be greater in the in-folded state than in the unfolded state.

As the hinge bar HGB moves downward in the in-folded state, a distance between the hinge bar HGB and each of the first and second bodies BD1 and BD2 may also change between the unfolded state and the in-folded state. For example, the distance between the hinge bar HGB and each of the first and second bodies BD1 and BD2 may be greater in the in-folded state than in the unfolded state.

Referring to FIGS. 41 and 42, the first body BD1 and the second body BD2 may rotate around the first and second rotary axes RX1 and RX2, respectively, so that a rear surface of the first body BD1 and a rear surface of the second body BD2 face each other. Such a state of the first body BD1 and the second body BD2 may be defined as an out-folded state. A user may operate the first body BD1 and the second body BD2 to be in the in-folded state or the out-folded state.

As the first and second links LK1 and LK2 rotate around the first and second rotary axes RX1 and RX2, respectively, the first and second protruding links PLK1 and PLK2 may move along first and second guide holes GH1 and GH2, respectively. The first and second protruding links PLK1 and PLK2 may move toward lower ends of the first and second guide hole GH1 and GH2, respectively.

The position of the link guide LG may be invariable and remain the same between the unfolded state and the out-folded state. For example, the position of the guide part GP may be invariable between the unfolded state and the out-folded state. The distance between each of the first and second rotary axes RX1 and RX2 and the hinge bar HGB, and the distances between the first and second rotary axes RX1 and RX2 and the third and fourth rotary axes RX3 and RX4, respectively, may be invariable and remain the same between the unfolded state and the out-folded state.

Figure 43:
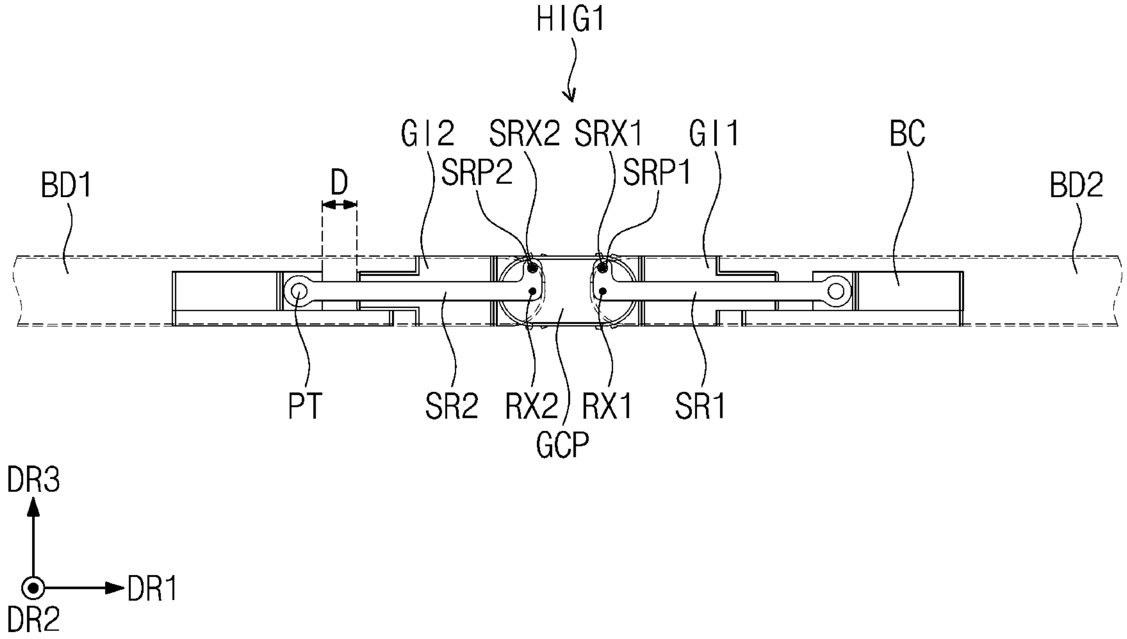
FIG. 43 is a schematic side view of a first hinge with respect to a rear side of the first hinge illustrated in FIG. 22.
Figure 44:
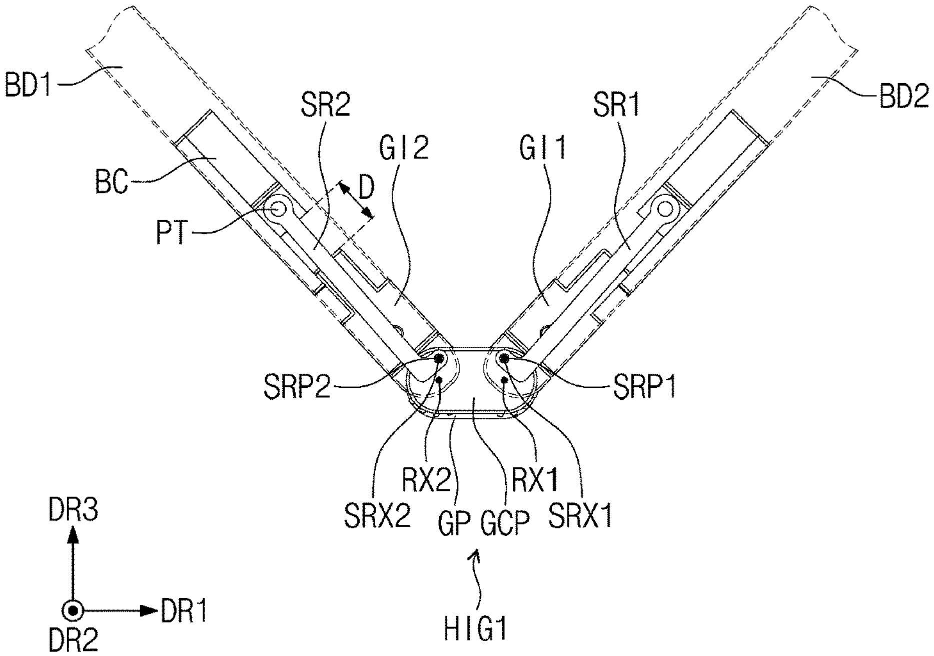
FIGS. 44 and 45 are schematic views illustrating an in-folded state in which the first and second bodies illustrated in FIG. 43 rotate around first and second rotary axes, respectively.
Figure 45:
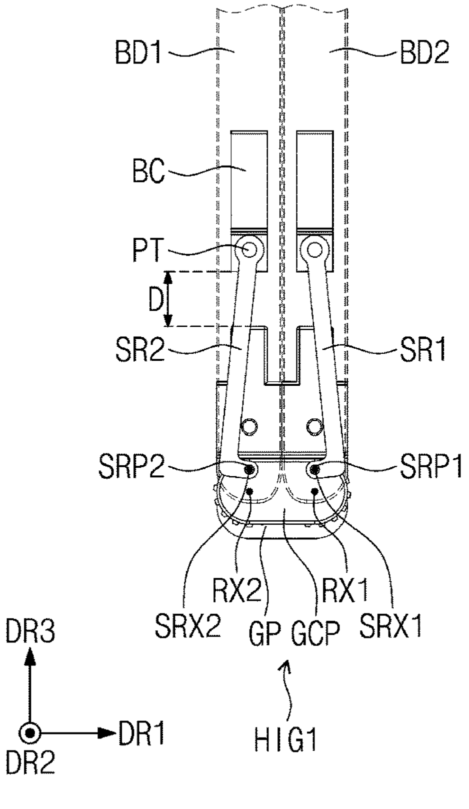
Figure 46:
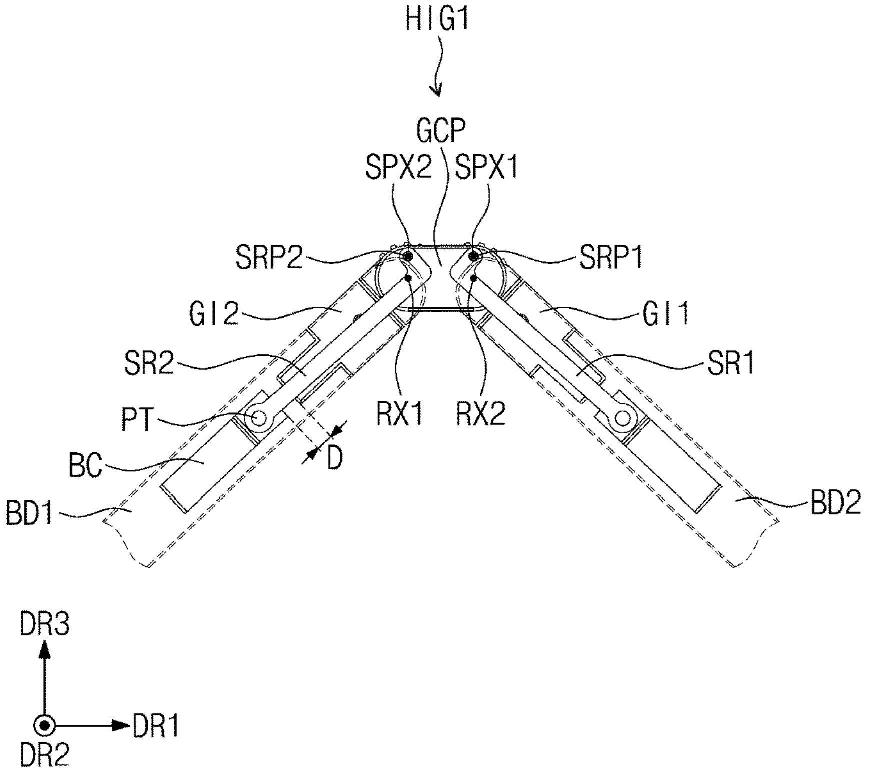
FIGS. 46 and 47 are schematic views illustrating an out-folded state in which the first and second bodies illustrated in FIG. 43 rotate around first and second rotary axes, respectively.
Figure 47:
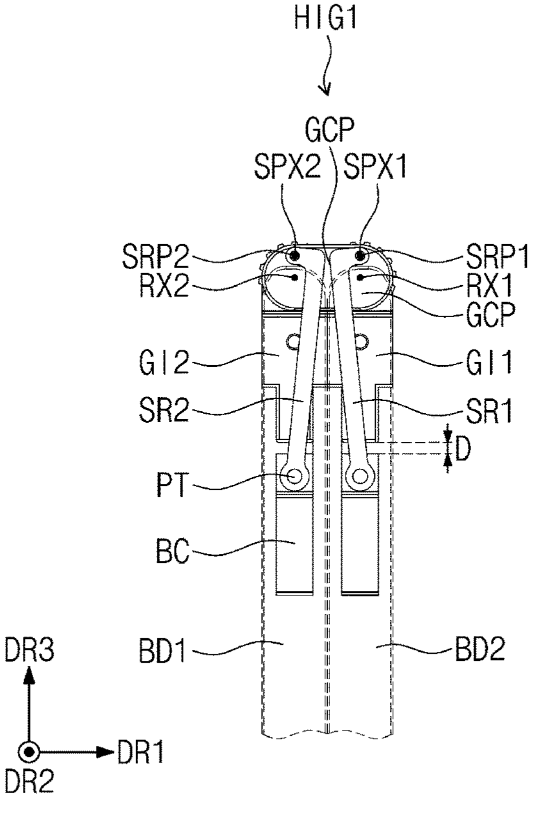

FIG. 43 is a schematic side view of a first hinge with respect to a rear side of the first hinge illustrated in FIG. 22. FIGS. 44 and 45 are schematic views illustrating an in-folded state in which the first and second bodies illustrated in FIG. 43 rotate around first and second rotary axes, respectively. FIGS. 46 and 47 are schematic views illustrating an out-folded state in which the first and second bodies illustrated in FIG. 43 rotate around first and second rotary axes, respectively.

The views in FIGS. 44 and 45 may correspond to the views in FIGS. 39 and 40, respectively, and the views in FIGS. 46 and 47 may correspond to the views in FIGS. 41 and 42, respectively.

Referring to FIG. 43, the first and second sub-rotating parts SR1 and SR2 may rotate around the first and second sub-rotary axes SRX1 and SRX2 defined upward from the first and second rotary axes RX1 and RX2. The first and second gears GI1 and GI2 may rotate around the first and second rotary axes RX1 and RX2 defined downward from the first and second sub-rotary axes SRX1 and SRX2.

Referring to FIGS. 43 to 45, as the first and second sub-rotating parts SR1 and SR2 rotate around the first and second sub-rotary axes SRX1 and SRX2 defined relatively upward and the first and second gears GI1 and GI2 rotate around the first and second rotary axes RX1 and RX2 defined relatively downward, a distance D between each of the first and second gears GI1 and GI2 and the body connecting part BC may change between the unfolded state and the in-folded state. The distance D between each of the first and second gears GI1 and GI2 the body connecting part BC may be greater in the in-folded state than in the unfolded state.

Referring to FIGS. 46 and 47, the distance D between each of the first and second gears GI1 and GI2 the body connecting part BC may be smaller in the out-folded state than in the unfolded state.

Referring to FIGS. 44 to 47, the distance D between each of the first and second gears GI1 and GI2 the body connecting part BC may be greater in the in-folded state than in the out-folded state.

Figure 48:
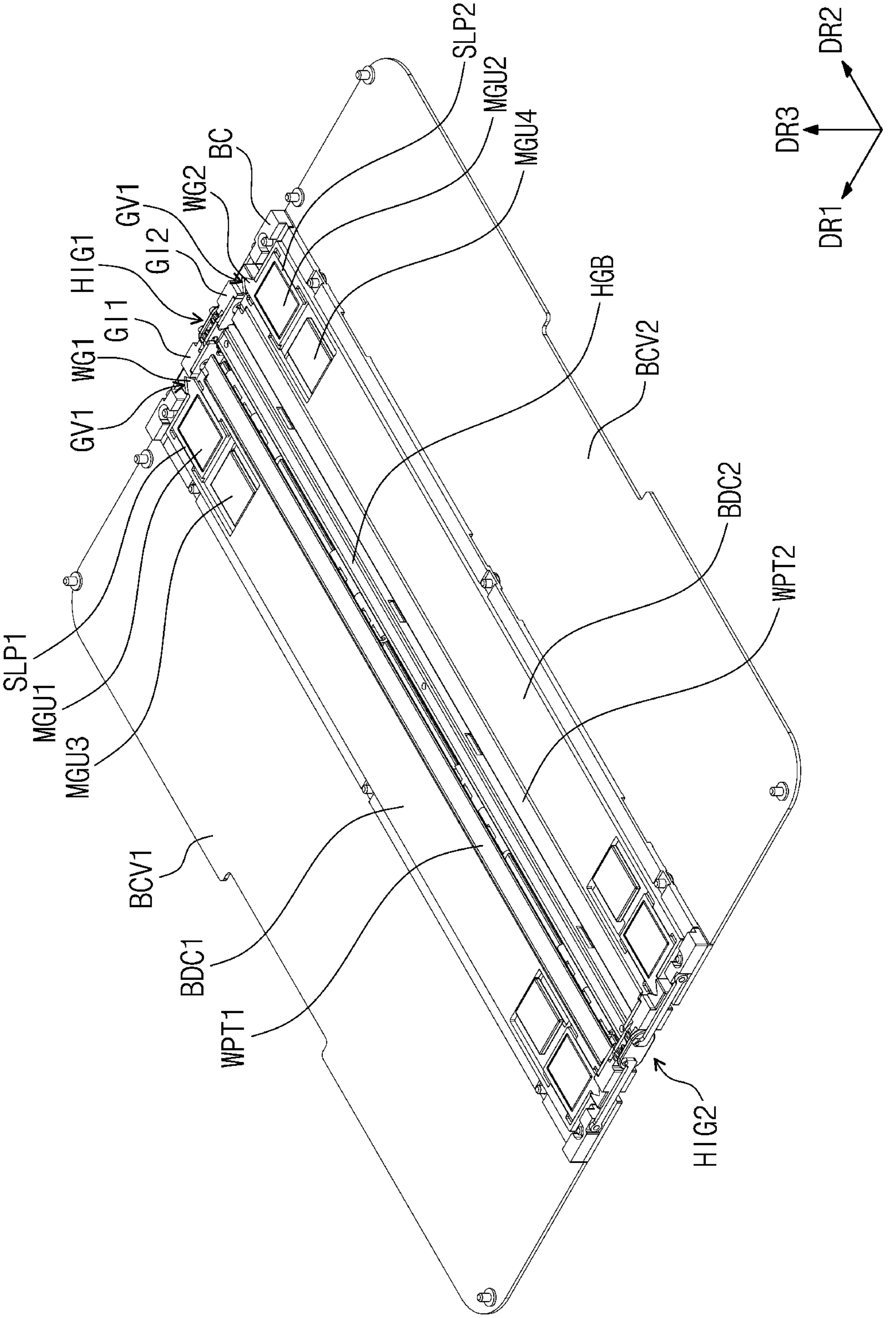
FIG. 48 is a schematic view illustrating a hinge, a hinge bar, first and second body covers, and first and second wing plates that are disposed on the first and second rear surface covers illustrated in FIG. 16 and coupled to each other.
Figure 49:
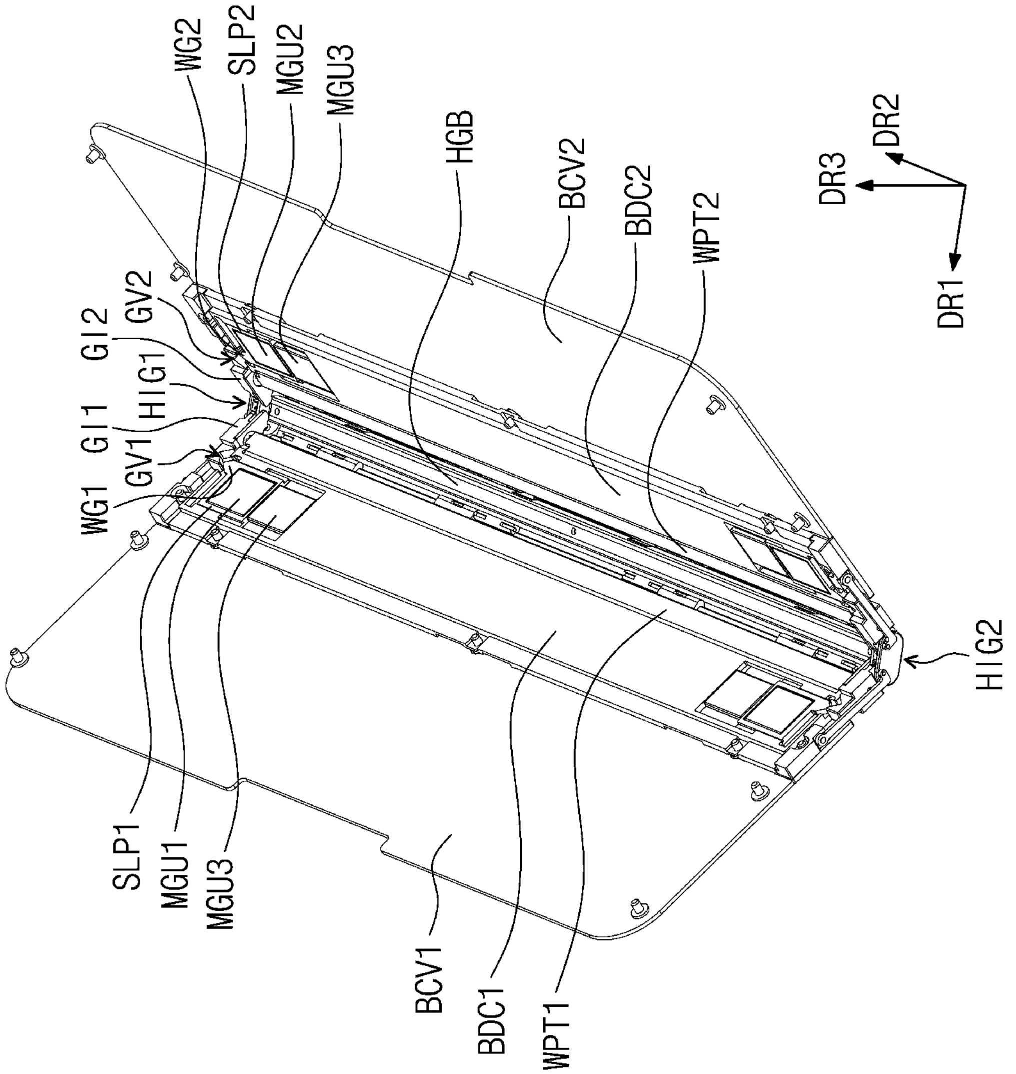
FIGS. 49 and 50 are schematic views illustrating an in-folded state of the folding set illustrated in FIG. 48.
Figure 50:
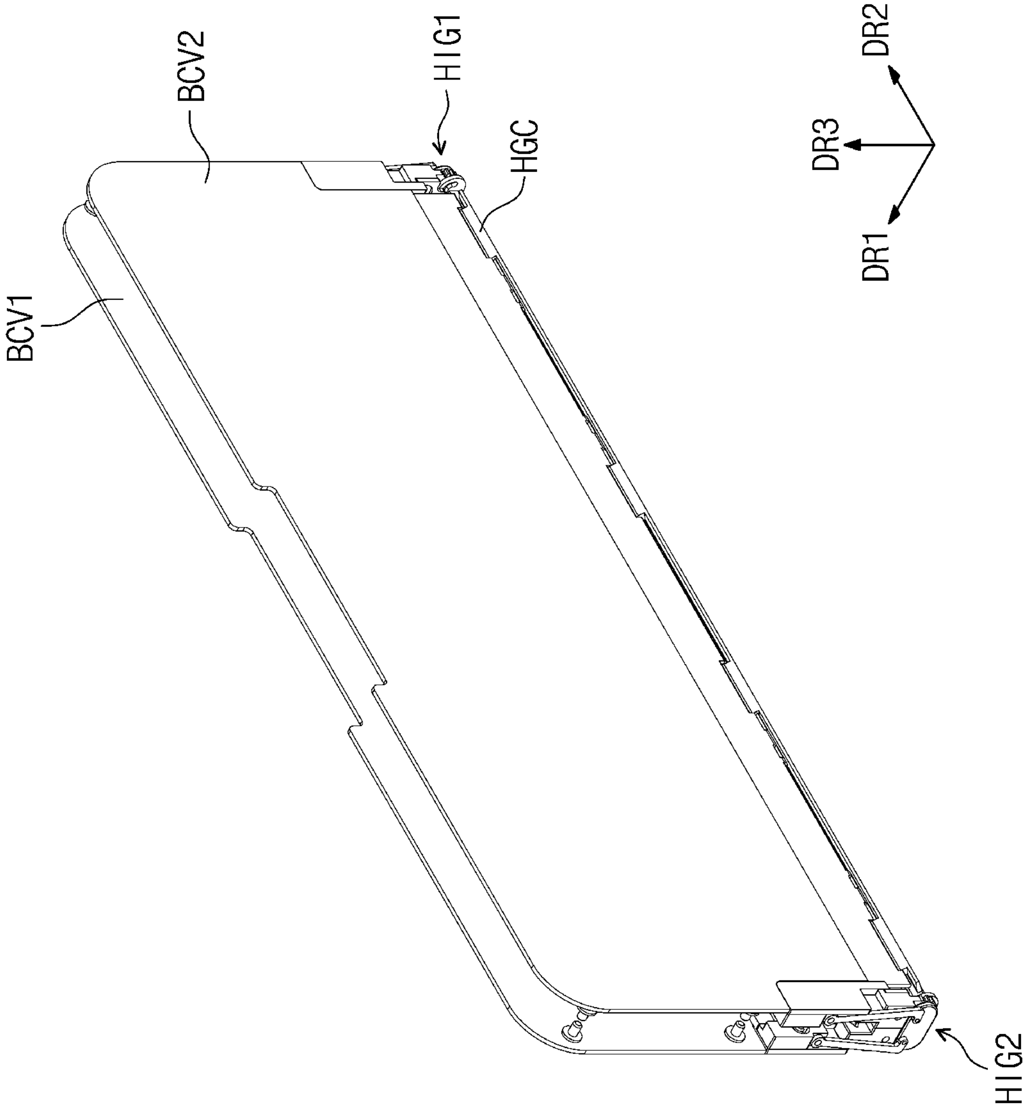
Figure 51:
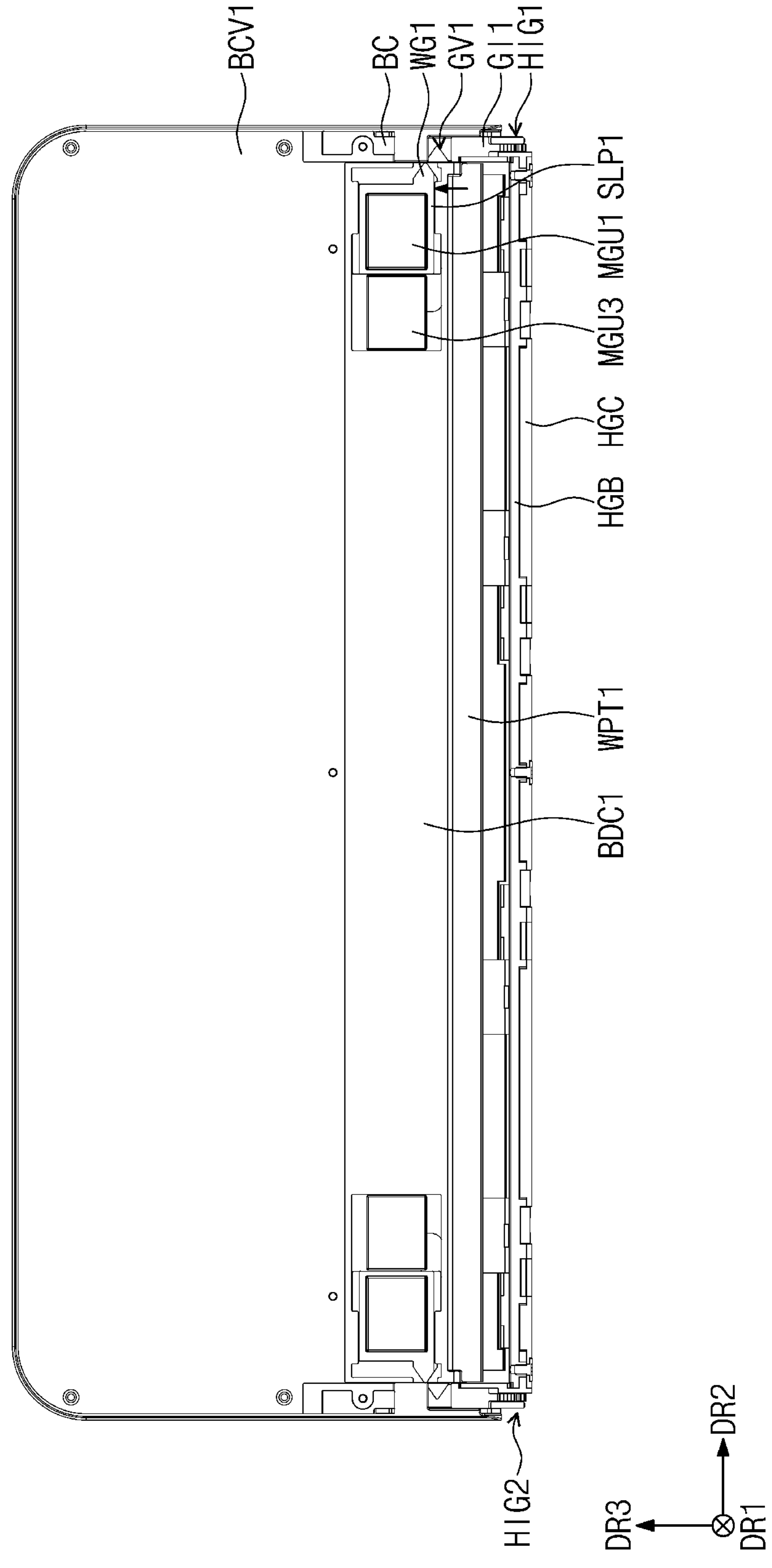
FIG. 51 is a schematic view illustrating components on the first rear surface cover in an in-folded state in FIG. 50 when viewed in a first direction.
Figure 52:
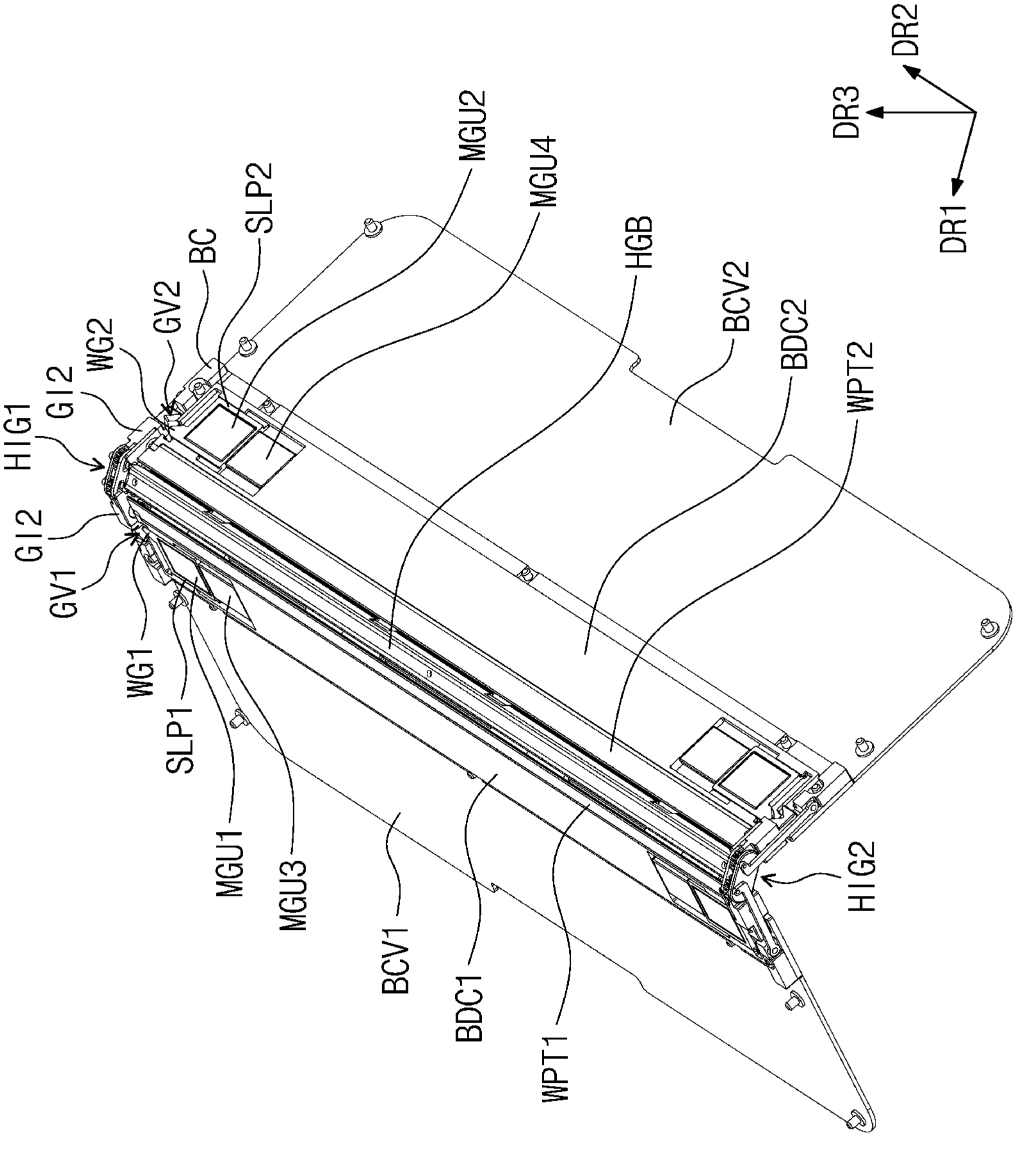
FIGS. 52 and 53 are schematic views illustrating an out-folded state of the folding set illustrated in FIG. 48.
Figure 53:
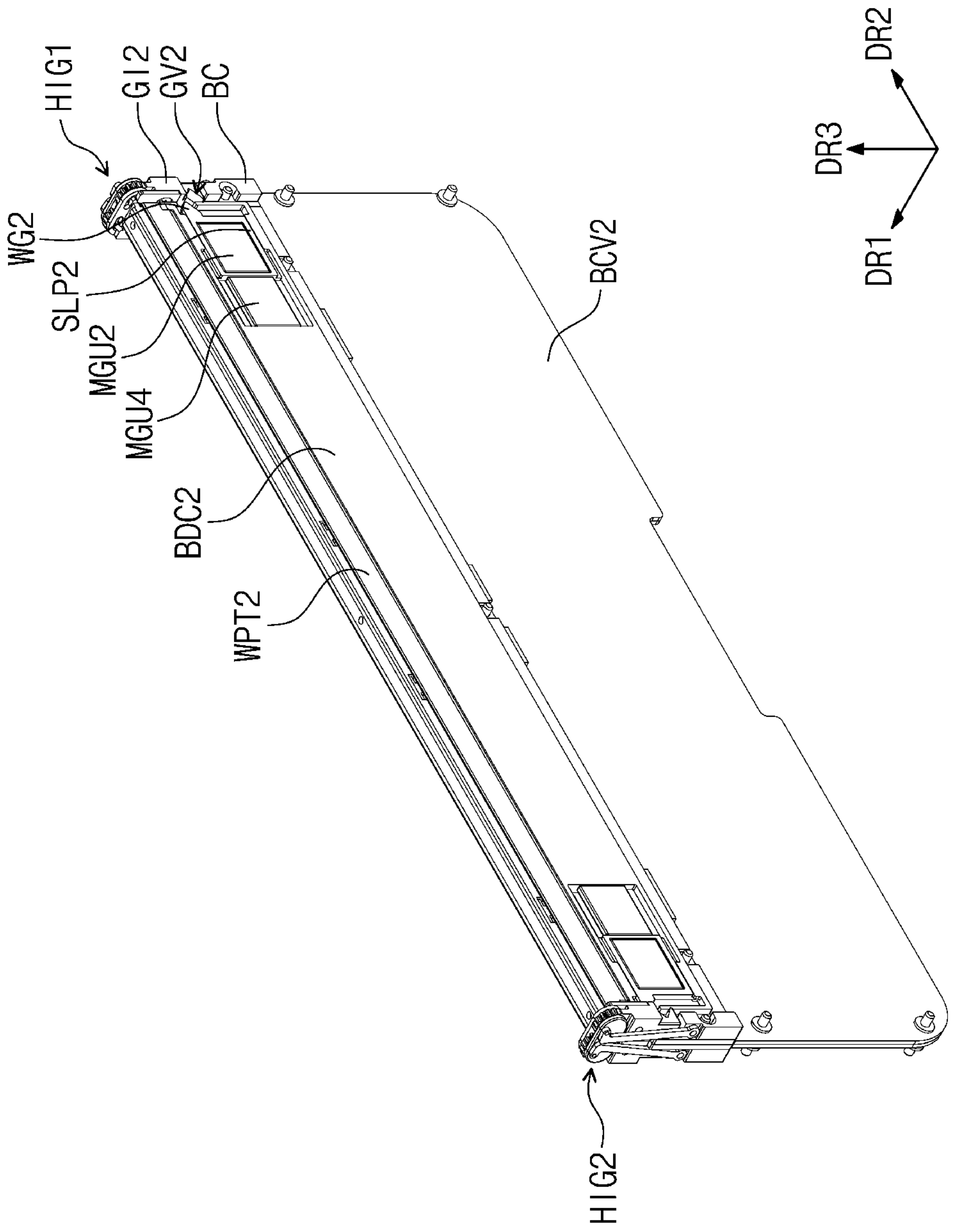
Figure 54:
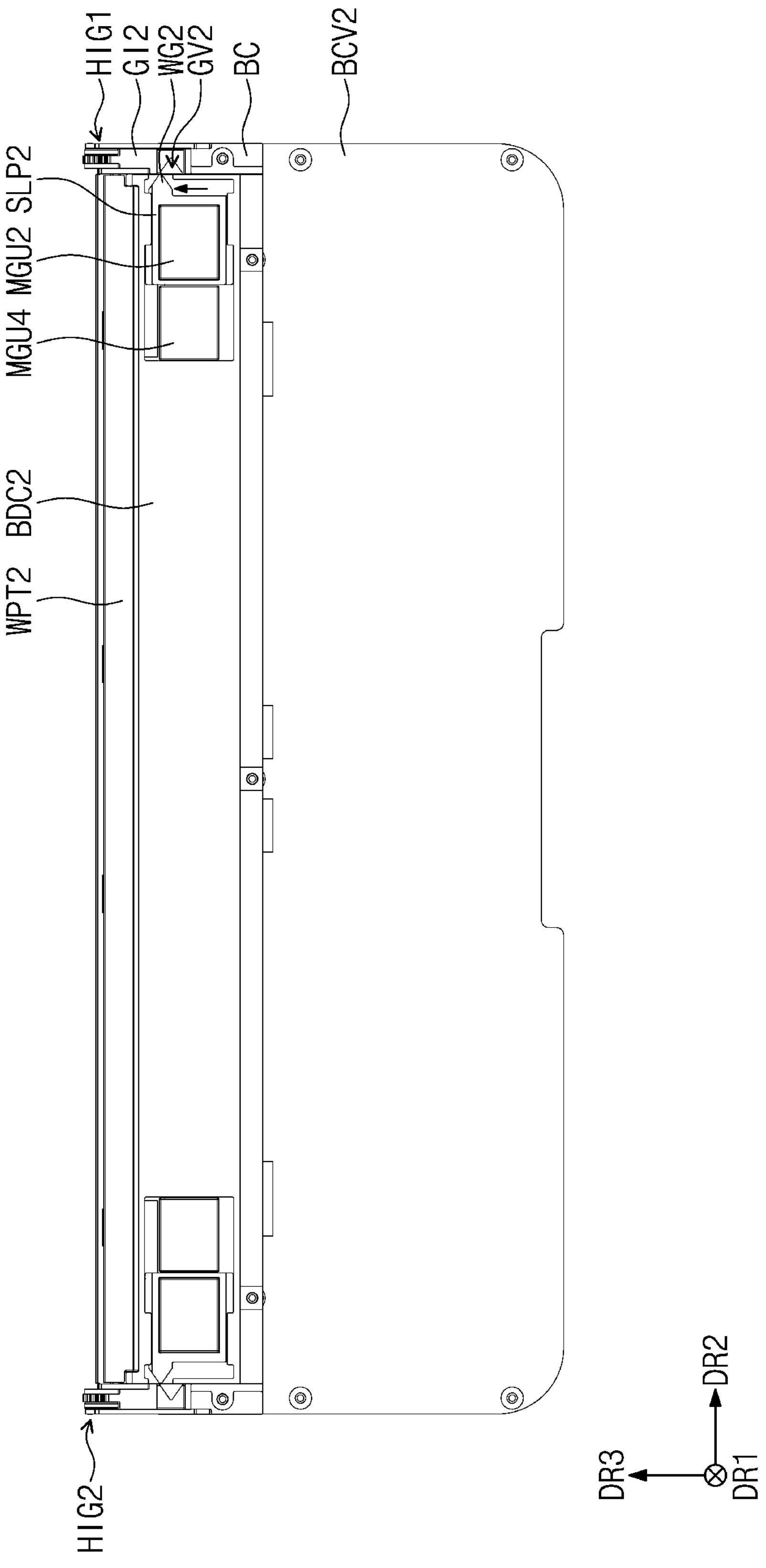
FIG. 54 is a schematic view illustrating components on the second rear surface cover in an out-folded state in FIG. 53 when viewed in the first direction.

FIG. 48 is a schematic view illustrating a hinge, a hinge bar, first and second body covers, and first and second wing plates that are disposed on the first and second rear surface covers illustrated in FIG. 16 and coupled to each other. FIGS. 49 and 50 are schematic views illustrating an in-folded state of the folding set illustrated in FIG. 48. FIG. 51 is a schematic view illustrating components on the first rear surface cover in an in-folded state in FIG. 50 when viewed in the first direction. FIGS. 52 and 53 are schematic views illustrating an out-folded state of the folding set illustrated in FIG. 48. FIG. 54 is a schematic view illustrating components on the second rear surface cover in an out-folded state in FIG. 53 when viewed in the first direction.

In FIG. 48, the first and second bodies BD1 and BD2 and the bezel covers BZC are not illustrated in order to clearly illustrate the first and second wedges WG1 and WG2 and the first and second groove GV1 and GV2.

Referring to FIG. 48, the first and second HIG1 and HIG2, the hinge bar HGB, the first and second body covers BDC1 and BDC2, and the first and second wing plates WPT1 and WPT2 may be disposed on the first and second rear surface covers BCV1 and BCV2. Although not illustrated, the first and second rear surface covers BCV1 and BCV2 may be bonded to the first and second body covers BDC1 and BDC2 through adhesive layers, respectively.

In case that the first and second HIG1 and HIG2 are coupled to (or connected to) the first and second body covers BDC1 and BDC2, the first wedges WG1 may be inserted into the first grooves GV1, respectively, and the second wedges WG2 may be inserted into the second grooves GV2, respectively. In the unfolded state, the first wedges WG1 may be inserted into the first grooves GV1, respectively, by a repulsive force between the first and third magnet parts MGU1 and MGU3, and the second wedges WG2 may be inserted into the second grooves GV2, respectively, by a repulsive force between the second and fourth magnet parts MGU2 and MGU4.

Referring to FIGS. 44, 45, and 48 to 51, the distance D between each of the first and second gears GI1 and GI2 the body connecting part BC may be greater in the in-folded state than in the unfolded state. Thus, the body connecting part BC may move farther away from the hinge bar HGB in the in-folded state than in the unfolded state.

The first and second body covers BDC1 and BDC2, which are coupled to the body connecting parts BC, may move together with the body connecting parts BC. The first and second body covers BDC1 and BDC2 may move farther away from the hinge bar HGB in the in-folded state than in the unfolded state. Thus, the first and second sliding parts SLP1 and SLP2 may also move farther away from the hinge bar HGB in the in-folded state than in the unfolded state.

In the in-folded state, the first and second wedges WG1 and WG2 protruding from the first and second sliding parts SLP1 and SLP2 may move from the first and second groove GV1 and GV2 in the first direction DR1 and move outside the first and second groove GV1 and GV2, respectively. The first and second wedges WG1 and WG2 may move farther away from the hinge bar HGB in the in-folded state than in the unfolded state.

Referring to FIGS. 46, 47, 48, and 52 to 54, the distance D between each of the first and second gears GI1 and GI2 the body connecting part BC may be smaller in the out-folded state than in the unfolded state. Thus, the body connecting part BC may move to be closer to the hinge bar HGB in the out-folded state than in the unfolded state.

The first and second body covers BDC1 and BDC2, which are coupled to the body connecting parts BC, respectively, may move to be closer to the hinge bar HGB in the out-folded state than in the unfolded state. Thus, the first and second sliding parts SLP1 and SLP2 may also move to be closer to the hinge bar HGB in the out-folded state than in the unfolded state.

In the out-folded state, the first and second wedges WG1 and WG2 may move from the first and second groove GV1 and GV2 in the first direction DR1 and move outside the first and second groove GV1 and GV2, respectively. The first and second wedges WG1 and WG2 may move to be closer to the hinge bar HGB in the out-folded state than in the unfolded state.

Taken together, the first and second body covers BDC1 and BDC2 may be coupled to the first and second gears GI1 and GI2 through the first and second wedges WG1 and WG2, respectively, so as to slide in the first direction DR1. The first and second body covers BDC1 and BDC2 may move farther away from the hinge bar HGB in the in-folded state than in the out-folded state.

In case that the first and second bodies BD1 and BD2 rotate about 90 degrees to be in-folded and out-folded compared to those in the unfolded state, the in-folded state and the out-folded state of the display device may be maintained according to a magnetic force of the fixing magnets FMG described with reference to FIGS. 17 and 18. In case that the user unfolds the first and second bodies BD1 and BD2 by applying a force greater than the magnetic force of the fixing magnets FMG, the display device DD may be unfolded.

Figure 55:
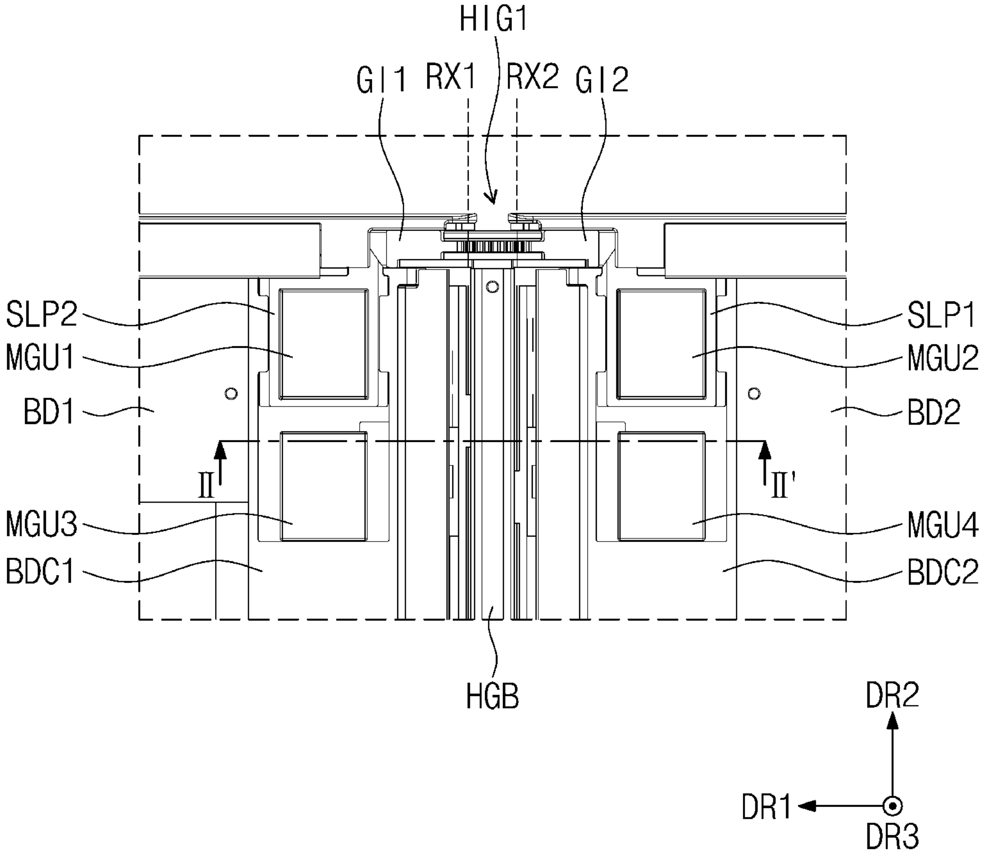
FIG. 55 is a schematic view illustrating a portion of a folding set, which overlaps a first hinge.
Figure 56:
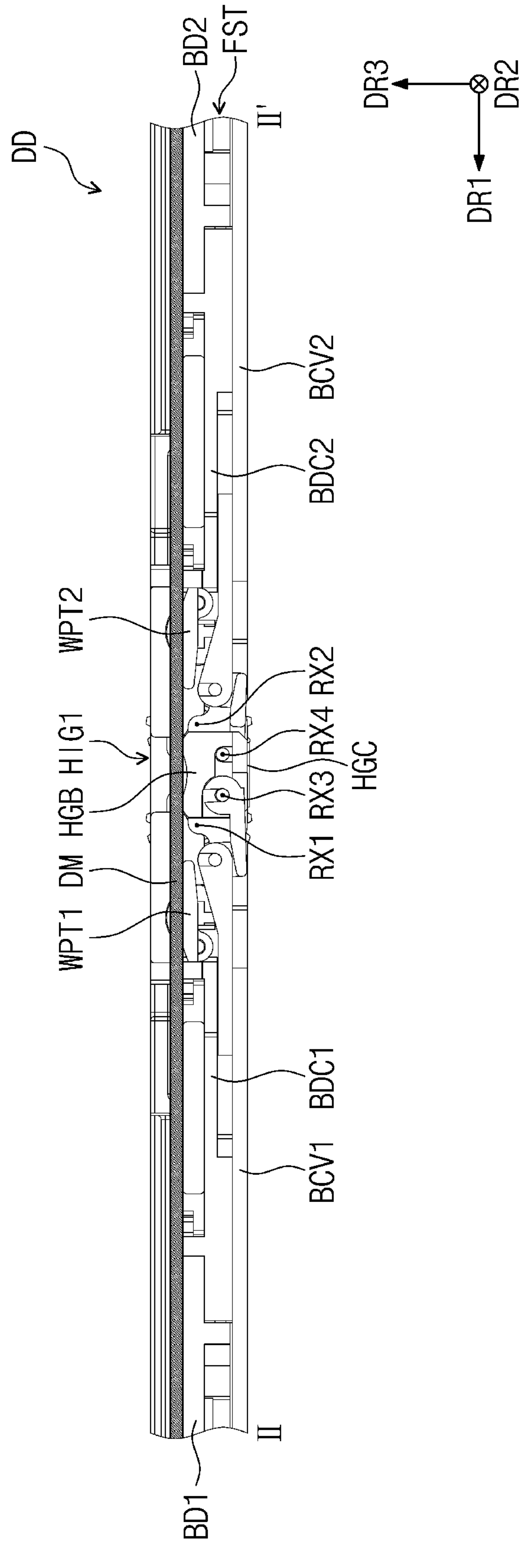
FIG. 56 is a schematic cross-sectional view taken along line II-II' illustrated in FIG. 55.
Figure 57:
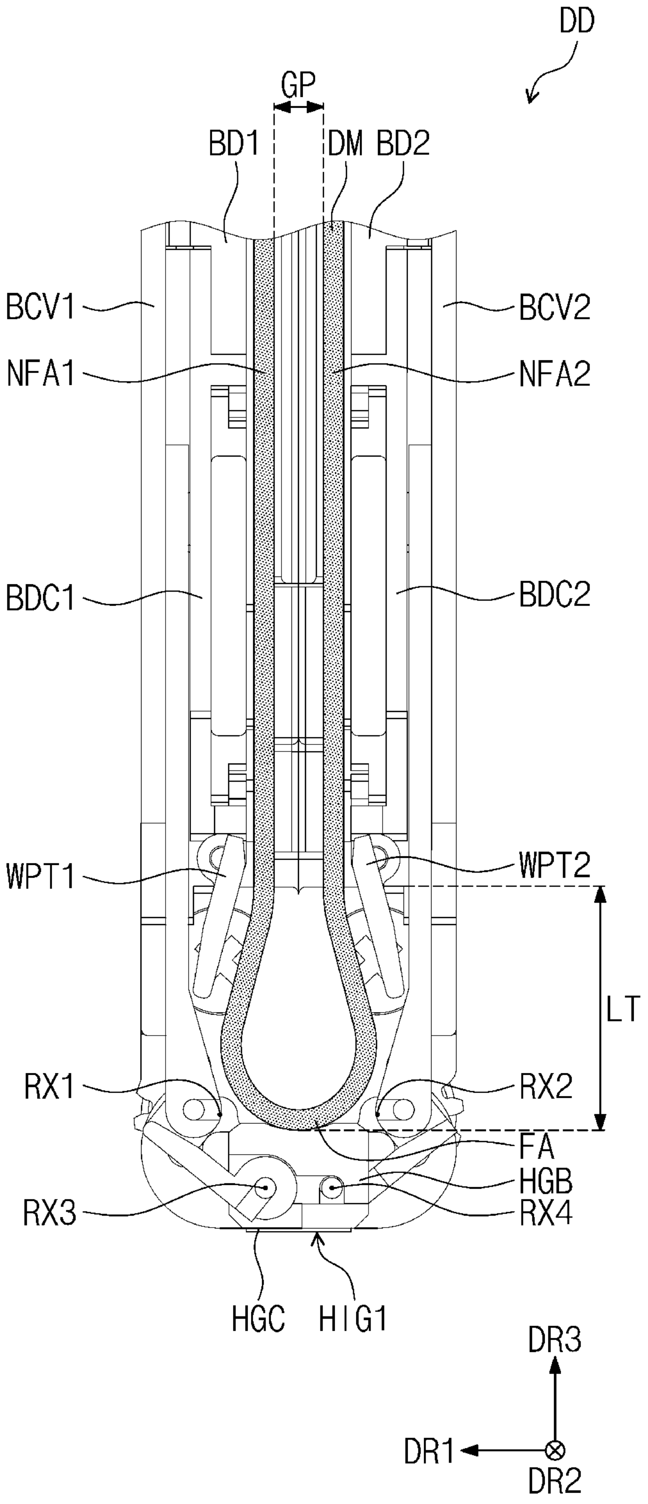
FIG. 57 is a schematic view illustrating an in-folded state of the folding set illustrated in FIG. 56.
Figure 58:
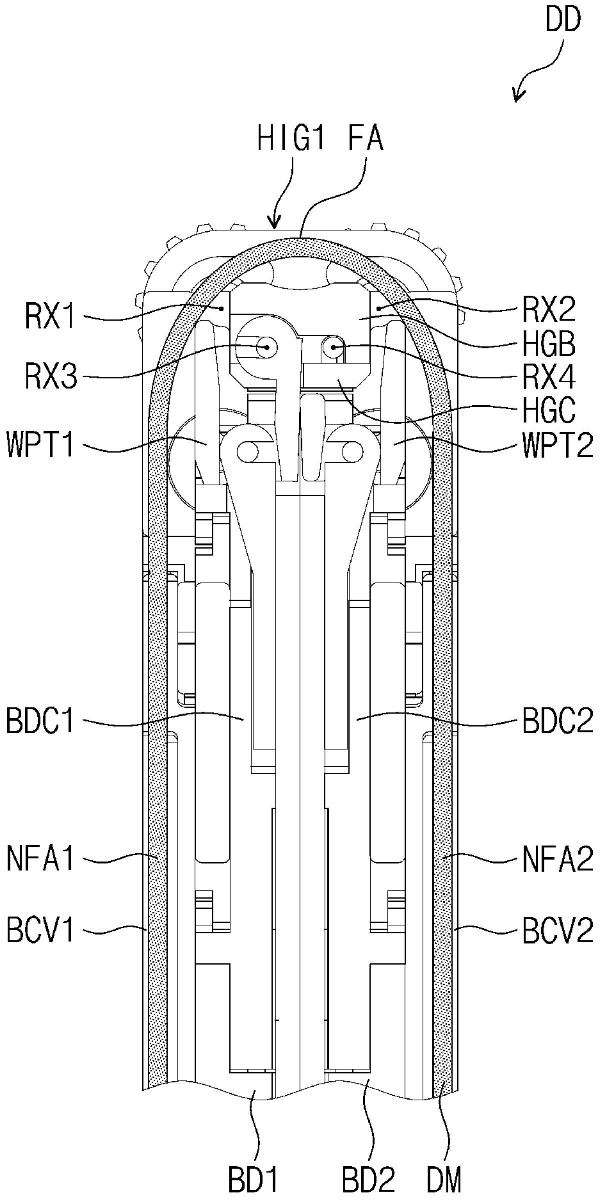
FIG. 58 is a schematic view illustrating an out-folded state of the folding set illustrated in FIG. 56.

FIG. 55 is a schematic view illustrating a portion of a folding set, which overlaps a first hinge. FIG. 56 is a schematic cross-sectional view taken along line II-II' illustrated in FIG. 55. FIG. 57 is a schematic view illustrating an in-folded state of the folding set illustrated in FIG. 56. FIG. 58 is a schematic view illustrating an out-folded state of the folding set illustrated in FIG. 56.

FIGS. 56 to 58 illustrate a display module DM. As the detailed configuration and operation of a folding set FST are described above, the description thereof will be omitted.

Referring to FIGS. 55 and 56, a first body BD1 may be disposed on a first rear surface cover BCV1, and a second body BD2 may be disposed on a second rear surface cover BCV2. The display module DM may be disposed on the first and second bodies BD1 and BD2, the first and second body covers BDC1 and BDC2, first and second wing plates WPT1 and WPT2, and a hinge bar HGB.

Referring to FIG. 57, the first and second bodies BD1 and BD2 may rotate around first and second rotary axes RX1 and RX2, respectively, which are defined in a first hinge HIG1, and accordingly, the display device DD may be in-folded. A first non-folding region NFA1 and a second non-folding region NFA2 may be disposed to face each other, and may not be exposed to the outside. A folding region FA may be folded in a dumbbell shape.

The first and second wing plates WPT1 and WPT2 may rotate and be disposed to be inclined. As described above, the hinge bar HGB may move further downward compared to the in-folding operation of the display device DD. The folding region FA may be disposed in a region defined among the first wing plate WPT1, the second wing plate WPT2, and the hinge bar HGB.

The in-folding operation of the display device DD may require a space for disposing the folding region FA of which the shape has changed to the dumbbell shape. As the hinge bar HGB move further downward during the in-folding operation of the display device DD, the space for disposing the folding region FA of which the shape has changed to the dumbbell shape may be easily secured.

In an embodiment of the disclosure, a length LT of the folding region FA in the third direction DR3 may be set to about 6.9 mm in the in-folded state. A gap GP between the first and second non-folding regions NFA1 and NFA2 in the first direction DR1 may be set to about 1 mm.

Referring to FIG. 58, the first and second bodies BD1 and BD2 may rotate around first and second rotary axes RX1 and RX2, respectively, and accordingly, the display device DD may be out-folded. The first non-folding region NFA1 and the second non-folding region NFA2 may be disposed opposite to each other and may be exposed to the outside. The folding region FA may be folded in a "U" shape. In an embodiment of the disclosure, in case that the folding region FA is completely unfolded, the length of the folding region FA may be set to about 16 mm.

In an embodiment of the disclosure, a separate hinge for the in-folding operation and a separate hinge for the out-folding operation may not be required. In an embodiment of the disclosure, the in-folding operation and the out-folding operation of the display device DD may be performed together by the hinge HIG.

Figure 59:
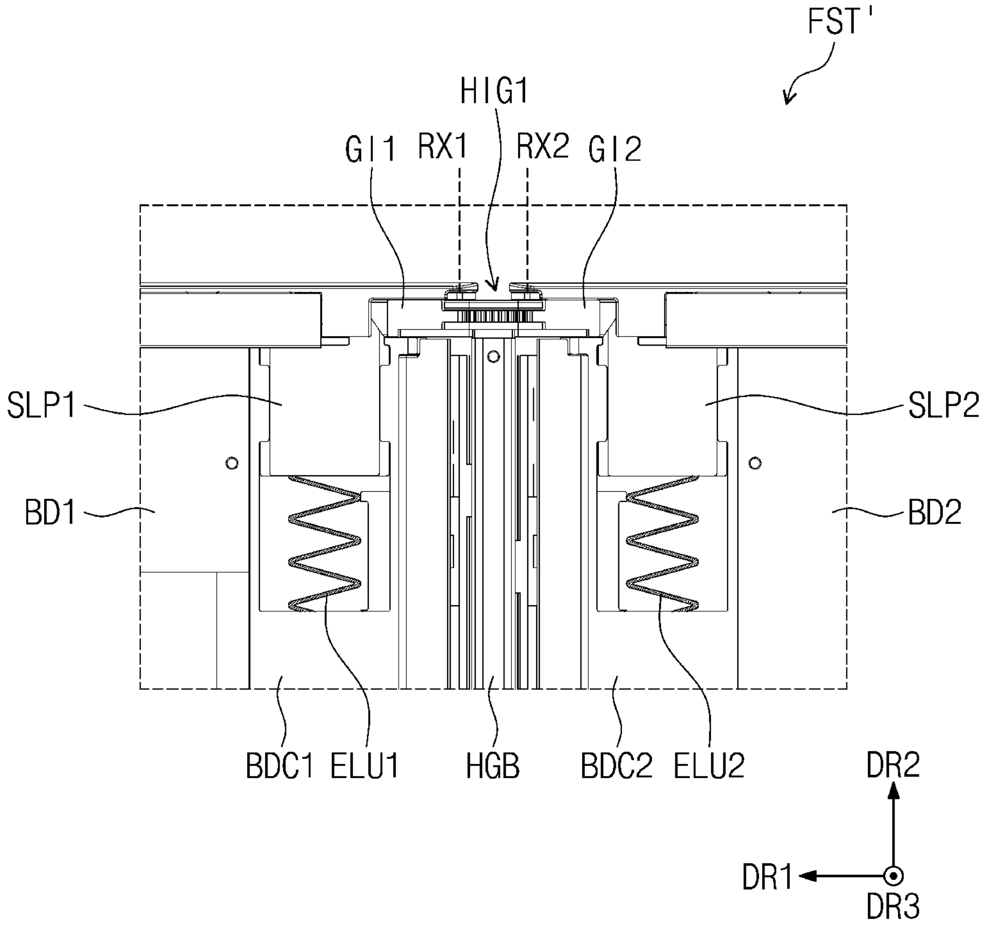
FIG. 59 is a schematic view illustrating components of a folding set according to another embodiment of the disclosure.

FIG. 59 is a schematic view illustrating components of a folding set according to another embodiment of the disclosure.

Referring to FIG. 59, a folding set FST' may include first and second elastic parts ELU1 and ELU2. The folding set FST' may not include the magnet parts MGU described above. The configuration of the folding set FST' may be similar to that of the folding set FST described above except the configuration of the first and second elastic parts ELU1 and ELU2.

The first elastic part ELU1 may be disposed on the first body cover BDC1. The first elastic part ELU1 may be arranged with a first sliding part SLP1 in the second direction DR2 and may be farther away from a first gear GI1 than the first sliding part SLP1 is.

The second elastic part ELU2 may be disposed on the second body cover BDC2. The second elastic part ELU1 may be arranged with a second sliding part SLP2 in the second direction DR2 and may be farther away from a second gear GI2 than the second sliding part SLP2 is.

According to an elastic force of the first elastic part ELU1 and the second elastic part ELU2, first and second wedges WG1 and WG2 of the first and second sliding parts SLP1 and SLP2 may be inserted into first and second groove GV1 and GV2, respectively, in the unfolded state.

According to an embodiment of the disclosure, the hinge in which the first and second rotary axes are defined may rotate the first and second bodies around the first and second rotary axes, respectively, and may allow the display module to be in-folded and out-folded.

The hinge bar connected or coupled to the hinge may be disposed on the folding region and move further downward in the in-folded state than in the unfolded state. As the hinge bar moves further downward in the in-folded state, the space for disposing the folding region may be easily secured in case that the folding region of the display module is folded in the dumbbell shape.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a display module comprising a front surface and a rear surface opposite the front surface;

a first body and a second body disposed below the rear surface of the display module and arranged in a first direction in an unfolded state;

a hinge which is disposed between the first body and the second body and in which a first rotary axis and a second rotary axis extending parallel to each other in a second direction intersecting the first direction are defined; and a hinge bar coupled to the hinge and extending in the second direction, wherein the first and second bodies rotate around the first and second rotary axes, respectively, to be in an in-folded state, in which portions of the front surface of the display module face each other, in the unfolded state in which the front surface of the display module is substantially flat, and in an out-folded state in which portions of the rear surface of the display module face each other, and a distance between the first and second rotary axes and the hinge bar in the out-folded state in which the portions of the rear surface of the display module face each other is different than in the in- folded state in which the portions of the front surface of the display module face each other.

2. The display device of claim 1, wherein the distance between the first and second rotary axes and the hinge bar in the in-folded state is greater than in the unfolded state.

3. The display device of claim 1, wherein the distance between the first and second rotary axes and the hinge bar in the unfolded state is substantially equal to the distance between the first and second rotary axes and the hinge bar in the out-folded state.

4. The display device of claim 1, wherein a third rotary axis and a fourth rotary axis which extend parallel to each other in the second direction and are spaced apart from the first and second rotary axes, respectively, are defined in the hinge bar, a distance between the first rotary axis and the third rotary axis in the unfolded state is different than in the in-folded state, and a distance between the second rotary axis and the fourth rotary axis in the unfolded state is different than in the in-folded state.

5. The display device of claim 4, wherein the distance between the first rotary axis and the third rotary axis in the in-folded state is greater than in the unfolded state, the distance between the first rotary axis and the third rotary axis in the unfolded state is substantially equal to the distance between the first rotary axis and the third rotary axis in the out-folded state, the distance between the second rotary axis and the fourth rotary axis in the in-folded state is greater than in the unfolded state, and the distance between the second rotary axis and the fourth rotary axis in the unfolded state is substantially equal to the distance between the second rotary axis and the fourth rotary axis in the out-folded state.

6. The display device of claim 1, wherein the hinge is coupled to the first and second bodies, and a distance between the first and second bodies and the hinge bar in the unfolded state is different than in the in-folded state.

7. The display device of claim 6, wherein the distance between the first and second bodies and the hinge bar in the in-folded state is greater than in the unfolded state.

8. The display device of claim 1, wherein the hinge comprises a first hinge and a second hinge that are spaced apart from each other in the second direction and are symmetrical to each other, and the hinge bar is disposed between the first hinge and the second hinge and coupled to the first and second hinges.

9. The display device of claim 8, wherein the first hinge comprises:

a first gear configured to rotate around the first rotary axis;

a second gear that is arranged with the first gear in the first direction and configured to rotate rotates around the second rotary axis;

a link guide coupled to the hinge bar and disposed on inner side surfaces of the first and second gears which face the second hinge;

a first link coupled to the first gear and the link guide; and a second link coupled to the second gear and the link guide, and a position of the link guide in the unfolded state is different than in the in-folded state by virtue of the first and second links.

10. The display device of claim 9, wherein the first and second links move the position of the link guide so that the link guide is farther away from the first and second rotary axes in a third direction in the in-folded state than in the unfolded state, and the third direction is defined as a direction perpendicular to a plane defined by the first and second directions.

11. The display device of claim 9, wherein the first rotary axis is defined in a portion of the first gear which is adjacent to one side of the first gear, and the second rotary axis is defined in a portion of the second gear which is adjacent to one side of the second gear, the one side of the first gear and the one side of the second gear face each other, and the one side of the first gear and the one side of the second gear have gear shapes, respectively, and are engaged with each other to rotate around the first and second rotary axes, respectively.

12. The display device of claim 9, wherein the link guide comprises:

a guide part overlapping the first and second rotary axes; and a hinge bar coupling part coupled to the hinge bar, connected to a lower portion of the guide part, and protruding toward the second hinge, one side of the first link and one side of the second link which face each other, are coupled to the guide part, a portion of the first link which does not overlap the guide part when viewed in the second direction and is adjacent to another side of the first link, is coupled to the first gear, and a portion of the second link which does not overlap the guide part when viewed in the second direction and is adjacent to another side of the second link, is coupled to the second gear.

13. The display device of claim 12, further comprising:

a first protruding link protruding from the one side of the first link toward the guide part; and a second protruding link protruding from the one side of the second link toward the guide part, wherein the guide part includes:
a first guide hole which overlaps the first link and has a curved trajectory corresponding to an arc of a circle defined to have a central point in the first rotary axis, and in which the first protruding link is disposed; and
a second guide hole which overlaps the second link, has a curved trajectory corresponding to an arc of a circle defined to have a central point in the second rotary axis, and is symmetrical to the first guide hole, and in which the second protruding link is disposed, and
the first and second protruding links move along the first and second guide holes, respectively.

14. The display device of claim 9, further comprising:
a gear connecting part disposed on outer side surfaces of the first and second gears which are opposite to the inner side surfaces of the first and second gears;
a first rotary axis protrusion and a second rotary axis protrusion that protrude from the gear connecting part toward the first and second gears to define the first and second rotary axes, respectively, and are inserted into first and second rotation holes defined in the first and second gears to overlap the first and second rotary axes, respectively;
a first sub-rotary axis protrusion and a second sub-rotary axis protrusion that protrude from an outer side surface of the gear connecting part which is opposite to an inner side surface of the gear connecting part that faces the first and second gears, and are disposed upward from the first and second rotary axis protrusions;
a first sub-rotating part extending in the first direction, coupled to the first sub-rotary axis protrusion and the first body, and configured to rotate around the first sub-rotary axis protrusion; and
a second sub-rotating part extending in the first direction, coupled to the second sub-rotary axis protrusion and the second body, and configured to rotate around the second sub-rotary axis protrusion.

15. The display device of claim 14, further comprising:
body connecting parts through which the first sub-rotating part is coupled to the first body and the second sub-rotating part is coupled to the second body, wherein
a distance between the first gear and the body connecting parts in the in-folded state is greater than in the out-folded state, and
a distance between the second gear and the body connecting parts in the in-folded state is greater than in the out-folded state.

16. The display device of claim 9, further comprising:
a first body cover disposed between the first body and the second body and coupled to one side of the first body which faces the second body;
a second body cover disposed between the first body and the second body and coupled to one side of the second body which faces the first body;
a first wing plate disposed between the first body cover and the second body cover and coupled to one side of the first body cover which faces the second body cover, so as to rotate around a first wing rotary axis extending in the second direction; and
a second wing plate disposed between the first body cover and the second body cover and coupled to one side of the second body cover which faces the first body cover, so as to rotate around a second wing rotary axis extending in the second direction,
wherein the first and second body covers are coupled so as to slide with respect to the first and second gears in the first direction, and the first and second body covers move so as to be farther away from the hinge bar in the in-folded state than in the out-folded state.

17. The display device of claim 16, further comprising:
a first sliding part disposed on the first body cover and including a first wedge that is inserted into a first groove defined in the inner side surface of the first gear;
a second sliding part disposed on the second body cover and including a second wedge that is inserted into a second groove defined in the inner side surface of the second gear;
a first magnet part coupled to the first sliding part;
a second magnet part coupled to the second sliding part;
a third magnet part disposed on the first body cover, arranged with the first magnet part in the second direction, and farther away from the first gear than the first magnet part is; and
a fourth magnet part disposed on the second body cover, arranged with the second magnet part in the second direction, and farther away from the second gear than the second magnet part, wherein
the first and third magnet parts are disposed to face a same polarity, and
the second and fourth magnet parts are disposed to face a same polarity.

18. The display device of claim 17, wherein
the first and second wedges move outside the first and second groove, respectively, in the in-folded state and the out-folded state,
the first and second wedges move so as to be farther away from the hinge bar in the in-folded state than in the unfolded state, and
the first and second wedges move so as to be closer to the hinge bar in the out-folded state than in the unfolded state.

19. The display device of claim 16, further comprising:
a first sliding part disposed on the first body cover and including a first wedge that is inserted into a first groove defined in the inner side surface of the first gear;
a second sliding part disposed on the second body cover and including a second wedge that is inserted into a second groove defined in the inner side surface of the second gear;
a first elastic part disposed on the first body cover, arranged with the first sliding part in the second direction, and farther away from the first gear than the first sliding part; and
a second elastic part disposed on the second body cover, arranged with the second sliding part in the second direction, and farther away from the second gear than the second sliding part.

20. A display device comprising:
a display module comprising a front surface and a rear surface opposite the front surface;
a first body and a second body disposed below the rear surface of the display module and arranged in a first direction in an unfolded state;
a hinge which is disposed between the first body and the second body and in which a first rotary axis and a second rotary axis extending parallel to each other in a second direction intersecting the first direction are defined; and
a hinge bar which is coupled to the hinge and extend in the second direction and in which a third rotary axis and a fourth rotary axis extending parallel to each other in the second direction are defined, wherein
the first and second bodies rotate around the first and second rotary axes, respectively, to be in an in-folded state, in which portions of the front surface of the display module face each other, in the unfolded state in which the front surface of the display module is substantially flat, and in an out-folded state in which portions of the rear surface of the display module face each other, a distance between the first rotary axis and the third rotary axis in the in-folded state in which the portions of the front surface of the display module face each other is different than in the out-folded state in which the portions of the rear surface of the display module face each other, and a distance between the second rotary axis and the fourth rotary axis in the in-folded state in which the portions of the front surface of the display module face each other is different than in the out-folded state in which the portions of the rear surface of the display module face each other.

21. The display device of claim 20, wherein a position of the hinge bar with respect to the first and second rotary axes is invariable in the unfolded state and the out-folded state.

22. An electronic device comprising a display device providing an image, wherein the display device comprises:

a display module comprising a front surface and a rear surface opposite the front surface;

a first body and a second body disposed below the rear surface of the display module and arranged in a first direction in an unfolded state;

a hinge which is disposed between the first body and the second body and in which a first rotary axis and a second rotary axis extending parallel to each other in a second direction crossing the first direction are defined; and a hinge bar coupled to the hinge and extending in the second direction, wherein the first and second bodies rotate around the first and second rotary axes, respectively, to be in an in-folded state, in which portions of the front surface of the display module face each other, in the unfolded state in which the front surface of the display module is substantially flat, and in an out-folded state in which portions of the rear surface of the display module face each other, and wherein a position of the hinge bar in the in-folded state in which the portions of the front surface of the display module face each other is different than in an out-folded state in which portions of the rear surface of the display module face each other.

* * * * *